(12) United States Patent
Sakaino et al.

(10) Patent No.: US 10,800,970 B2
(45) Date of Patent: Oct. 13, 2020

(54) COLOR CONVERSION COMPOSITION, COLOR CONVERSION FILM AND BACKLIGHT UNIT, DISPLAY AND LIGHTING DEVICE EACH COMPRISING SAME

(71) Applicant: TORAY INDUSTRIES, INC., Tokyo (JP)

(72) Inventors: Hirotoshi Sakaino, Shiga (JP); Daisaku Tanaka, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 453 days.

(21) Appl. No.: 15/745,323

(22) PCT Filed: Jul. 8, 2016

(86) PCT No.: PCT/JP2016/070255
§ 371 (c)(1),
(2) Date: Jan. 16, 2018

(87) PCT Pub. No.: WO2017/014068
PCT Pub. Date: Jan. 26, 2017

(65) Prior Publication Data
US 2018/0208838 A1 Jul. 26, 2018

(30) Foreign Application Priority Data

Jul. 17, 2015 (JP) ................................. 2015-142696
Jul. 17, 2015 (JP) ................................. 2015-142697

(51) Int. Cl.
| | | |
|---|---|---|
| C09K 11/06 | (2006.01) | |
| H01L 33/50 | (2010.01) | |
| F21V 9/30 | (2018.01) | |
| C09K 11/02 | (2006.01) | |
| F21Y 115/10 | (2016.01) | |

(52) U.S. Cl.
CPC .............. *C09K 11/06* (2013.01); *C09K 11/02* (2013.01); *F21V 9/30* (2018.02); *H01L 33/501* (2013.01); *H01L 33/502* (2013.01); *C09K 2211/1018* (2013.01); *C09K 2211/1022* (2013.01); *F21Y 2115/10* (2016.08)

(58) Field of Classification Search
CPC .. C09K 11/06; C09K 11/02; C09K 221/1018; C09K 221/1022
See application file for complete search history.

(56) References Cited

U.S. PATENT DOCUMENTS

| | | | |
|---|---|---|---|
| 5,189,029 A | 2/1993 | Boyer et al. | |
| 5,446,157 A | 8/1995 | Morgan et al. | |
| 6,110,566 A | 8/2000 | White et al. | |
| 7,625,501 B2* | 12/2009 | Yang | ................. C09B 67/0092 |
| | | | 252/301.16 |
| 8,710,158 B2* | 4/2014 | Ueno | ..................... H01L 33/56 |
| | | | 525/476 |
| 2001/0046607 A1 | 11/2001 | White et al. | |
| 2002/0090530 A1 | 7/2002 | White et al. | |
| 2003/0015689 A1 | 1/2003 | Tomoike et al. | |
| 2003/0104235 A1 | 6/2003 | White et al. | |
| 2003/0220419 A1 | 11/2003 | Sekioka et al. | |
| 2004/0238790 A1 | 12/2004 | Baldacchini et al. | |
| 2005/0213213 A1 | 9/2005 | White et al. | |
| 2005/0261400 A1 | 11/2005 | Yang et al. | |
| 2006/0292347 A1 | 12/2006 | White et al. | |
| 2012/0037890 A1 | 2/2012 | Okuda et al. | |
| 2013/0074929 A1* | 3/2013 | Shimoi | .................. B32B 27/18 |
| | | | 136/257 |
| 2016/0271273 A1 | 9/2016 | Sakurai et al. | |
| 2018/0134952 A1 | 5/2018 | Ichihashi et al. | |
| 2018/0208838 A1 | 7/2018 | Sakaino et al. | |

FOREIGN PATENT DOCUMENTS

| | | |
|---|---|---|
| CN | 1278841 A | 1/2001 |
| CN | 1957058 A | 5/2007 |
| CN | 101952389 A | 1/2011 |
| JP | 8-509471 A | 10/1996 |
| JP | 2000-256565 A | 9/2000 |
| JP | 2001-164245 A | 6/2001 |
| JP | 2002-184576 A | 8/2002 |
| JP | 2002-317175 A | 10/2002 |

(Continued)

OTHER PUBLICATIONS

International Search Report, issued in PCT/JP2016/070255, PCT/ISA/210, dated Sep. 13, 2016.
Office Action issued in Japanese Patent Application No. 2016-534754 dated Nov. 28, 2017.
Written Opinion of the International Searching Authority, issued in PCT/JP2016/070255, PCT/ISA/237, dated Sep. 13, 2016.
Taiwanese Office Action and Search Report for Taiwanese Application No. 105122308, dated Oct. 7, 2019, with English translation.
Chinese Office Action and Search Report dated Jul. 26, 2019 for Application No. 201680041709.3, along with English translations.
Singaporean Office Action for Singaporean Application No. 11201800454T, dated Jan. 30, 2020.
Singapore Search Report and Written Opinion, dated Sep. 11, 2018, for Singapore Application No. 11201800454.

(Continued)

*Primary Examiner* — C Melissa Koslow
(74) *Attorney, Agent, or Firm* — Birch, Stewart, Kolasch & Birch, LLP

(57) ABSTRACT

A color conversion composition converting incident light to light having a longer wavelength than the incident light, and containing the following components (A)-(C): (A) at least one luminescent material; (B) a binder resin; and (C) at least one of tertiary amines, catechol derivatives and nickel compounds, in which the tertiary amines, the catechol derivatives and the nickel compounds have a molar extinction coefficient ε of 100 or less over the whole wavelength range from 400 nm to 800 nm is provided. This color conversion composition achieves a good balance between improvement of color reproducibility and durability if used for a liquid crystal display or an LED lighting device.

20 Claims, 3 Drawing Sheets

(56) References Cited

FOREIGN PATENT DOCUMENTS

| | | | |
|---|---|---|---|
| JP | 2002-348568 A | | 12/2002 |
| JP | 2007-273440 A | | 10/2007 |
| JP | 2008-501066 A | | 1/2008 |
| JP | 2010-61824 A | | 3/2010 |
| JP | 2011-149028 A | | 8/2011 |
| JP | 2011-241160 | * | 12/2011 |
| JP | 2011-241160 A | | 12/2011 |
| JP | 2012-22028 A | | 2/2012 |
| JP | 2014-136771 | * | 7/2014 |
| JP | 2014-136771 A | | 7/2014 |
| JP | 2017-11153 A | | 1/2017 |
| WO | WO 2002/040607 A1 | | 5/2002 |
| WO | WO 03/012005 A1 | | 2/2003 |
| WO | WO 2009/116456 A1 | | 9/2009 |
| WO | WO 2015/056779 A1 | | 4/2015 |
| WO | WO 2016/190283 A1 | | 12/2016 |

OTHER PUBLICATIONS

Taiwanese Office Action for Taiwanese Application No. 105122308, dated Feb. 21, 2020, with English translation.

Chinese Office Action for Chinese Application No. 201680041709.3, dated Aug. 5, 2020, with an English translation.

* cited by examiner

COLOR CONVERSION COMPOSITION, COLOR CONVERSION FILM AND BACKLIGHT UNIT, DISPLAY AND LIGHTING DEVICE EACH COMPRISING SAME

TECHNICAL FIELD

The present invention relates to a color conversion composition, a color conversion film, and a backlight unit, a display and lighting each containing the same.

BACKGROUND ART

The multi-coloring technology by a color conversion system is being vigorously studied on its application to a liquid crystal display, an organic EL display, lighting, etc. Color conversion is to convert light emitted from a light emitter into light having a longer wavelength and indicates converting, for example, blue emission into green or red emission.

A composition having this color conversion function is formed into a film and combined, for example, with a blue light source, and three primary colors of blue, green and red can thereby be extracted from the blue light source, i.e., white light can be extracted. A white light source obtained by combining a blue light source with a film having a color conversion function is used as a backlight unit and combined with a liquid crystal driving portion and a color filter, whereby a full-color display can be manufactured. In the case of not using a liquid crystal driving portion, the white light source can be used directly as a white light source and can be applied, for example, as a white light source for LED lighting.

The problem to be solved in a liquid crystal display utilizing a color conversion system includes improvement of color reproducibility. For improving the color reproducibility, it is effective to make narrow the half-value width of each emission spectrum of blue, green and red of a backlight unit to thereby increase the color purity of each of blue, green and red colors. As a means to solve this task, a technique using, as a component of a color conversion composition, a quantum dot by an inorganic semiconductor fine particle has been proposed (see, for example, Patent Document 1). The technique using a quantum dot had certainly succeeded in making the half-value width of green and red emission spectra narrow and enhancing color reproducibility, but on the other hand, the quantum dot was weak to heat and water or oxygen in air, and the durability was insufficient. In addition, the technique has a problem of, for example, containing cadmium.

A technique using, as a component of a color conversion composition, an organic luminescent material in place of a quantum dot has also been proposed. As for examples of the technique using an organic luminescent material as a component of a color conversion composition, those using a pyridine-phthalimide condensation product (see, for example, Patent Document 2) or using a coumarin derivative (see, for example, Patent Document 3), and with regard to a red luminescent material, those using a perylene derivative (see, for example, Patent Document 4), using a rhodamine derivative (see, for example, Patent Document 5), or using a pyrromethene derivative (see, for example, Patent Documents 6 and 7), have been disclosed.

Furthermore, a technique of adding a light stabilizer so as to prevent deterioration of an organic luminescent material and enhance the durability has also been disclosed (see, for example, Patent Document 8).

BACKGROUND ART DOCUMENTS

Patent Documents

Patent Document 1: JP-A-2012-22028
Patent Document 2: JP-A-2002-348568
Patent Document 3: JP-A-2007-273440
Patent Document 4: JP-A-2002-317175
Patent Document 5: JP-A-2001-164245
Patent Document 6: JP-A-2011-241160
Patent Document 7: JP-A-2014-136771
Patent Document 8: JP-A-2011-149028

SUMMARY OF THE INVENTION

Problem that the Invention is to Solve

The stabilizer described in Patent Document 8 is effective in enhancing the durability but is not satisfied. Furthermore, such a stabilizer has relatively strong absorption in the visible region and absorbs light emitted by the luminescent material, and thus a problem of reduced efficiency arises. In this way, the technique using an organic luminescent material capable of satisfying both high color purity and high durability, as a component of a color conversion composition, is still insufficient.

The problem to be solved by the present invention is to achieve both enhanced color reproducibility and durability, particularly, both high-color-purity emission and durability, in a color conversion composition used for a liquid crystal display or LED lighting.

Means for Solving the Problems

The present invention relates to a color conversion composition for converting incident light into light having longer wavelength than the incident light, in which the color conversion composition includes the following components (A) to (C):

(A) at least one luminescent material,
(B) a binder resin, and
(C) at least one of a tertiary amine, a catechol derivative and a nickel compound, and in which the tertiary amine, catechol derivative and nickel compound have a molar extinction coefficient $\varepsilon$ of 100 or less in the whole wavelength region from 400 nm to 800 nm.

Advantage of the Invention

The color conversion composition of the present invention and the color conversion film using the same can achieve both high color purity and durability, so that both color reproducibility and durability can be satisfied.

MODE FOR CARRYING OUT THE INVENTION

Figure 1:
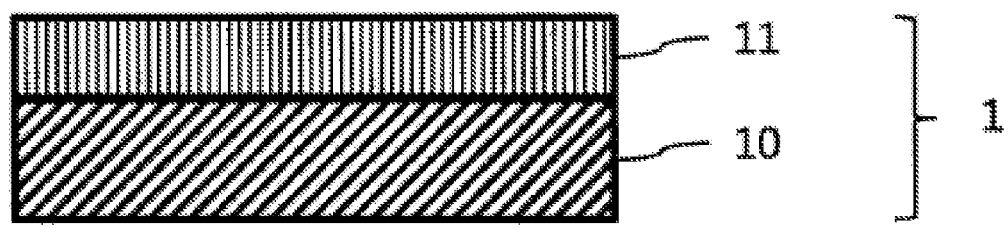
FIG. 1 is a schematic cross-sectional view illustrating one example of the color conversion film of the present invention.

The embodiments of the present invention are specifically described below, but the present invention is not limited to the following embodiments and can be implemented by making various modifications according to the purpose or usage.

<(A) Luminescent Material>

The color conversion composition of the present invention contains at least one luminescent material. The luminescent material as used in the present invention refers to a material capable of, when irradiated with some kind of light, emitting light having a wavelength different from that of the irradiation light.

In order to achieve high-efficiency color conversion, a material exhibiting light emission characteristics with high quantum yield is preferred. Such a material includes a known luminescent material such as inorganic fluorescent substance, fluorescent pigment, fluorescent dye and quantum dot, with an organic luminescent material being preferred.

Suitable examples of the organic luminescent material include, but are not limited to:

a fused aryl ring-containing compound and a derivative thereof, such as naphthalene, anthracene, phenanthrene, pyrene, chrysene, naphthacene, triphenylene, perylene, fluoranthene, fluorene and indene;

a heteroaryl ring-containing compound and a derivative thereof, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline and pyrrolopyridine;

a borane derivative;

a stilbene derivative such as 1,4-distyrylbenzene, 4,4'-bis(2-(4-diphenylaminophenyl)ethenyl)biphenyl and 4,4'-bis(N-(stilben-4-yl)-N-phenylamino)stilbene;

an aromatic acetylene derivative, a tetraphenylbutadiene derivative, an aldazine derivative, a pyrromethene derivative, a diketopyrrolo[3,4-c]pyrrole derivative;

a coumarin derivative such as coumarin 6, coumarin 7 and coumarin 153;

an azole derivative and a metal complex thereof, such as imidazole, thiazole, thiadiazole, carbazole, oxazole, oxadiazole and triazole;

a cyanine-based compound such as indocyanine green;

a xanthene-based compound and a thioxanthene-based compound, such as fluorescein, eosine and rhodamine;

a polyphenylene-based compound, a naphthalimide derivative, a phthalocyanine derivative and a metal complex thereof, and a porphyrin derivative and a metal complex thereof;

an oxazine-based compound such as Nile red and Nile blue;

a helicene-based compound;

an aromatic amine derivative such as N,N'-diphenyl-N,N'-di(3-methylphenyl)-4,4'-diphenyl-1,1'-diamine; and an organic metal complex compound such as iridium (Ir), ruthenium (Ru), rhodium (Rh), palladium (Pd), platinum (Pt), osmium (Os) and rhenium (Re).

The organic luminescent material may be a fluorescent material or a phosphorescent material, but in order to achieve high color purity, a fluorescent material is preferred.

Among these, a fused aryl ring-containing compound or a derivative thereof has high thermal stability and light stability and therefore, may be suitably used.

In view of the solubility and the diversity of the molecular structure, a compound having a coordination bond is preferred. From the viewpoint that the half-value width is small and high-efficiency luminescence is available, a boron-containing compound such as boron fluoride complex is also preferred.

Above all, a pyrromethene derivative may be suitably used, because this gives a high fluorescence quantum yield and exhibits good durability. A compound represented by formula (1) is more preferred.

[Chem. 1]

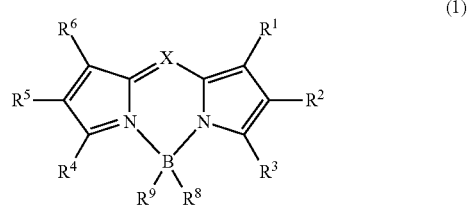

(1)

X is C—$R^7$ or N. Each of $R^1$ to $R^9$, which may be the same as or different from one another, is selected from hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a fused ring and an aliphatic ring each formed between adjacent substituents.

In all of the groups above, hydrogen may be deuterium. The same applies to the compounds described below or a partial structure thereof.

In the following description, for example, a substituted or unsubstituted aryl group having a carbon number of 6 to 40 means that the number of carbons is from 6 to 40 including the number of carbons contained in a substituent substituted on the aryl group, and the same applies to other substituents of which carbon number is specified.

In all of the groups above, when the group is substituted, the substituent is preferably an alkyl group, a cycloalkyl group, a heterocyclic group, an alkenyl group a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group or a phosphine oxide group, more preferably a substituent that is specifically recited as a preferable substituent in the description of each substituent. These substituents may be further substituted with the above-described substituent.

The term "unsubstituted" in the "substituted or unsubstituted" means that a hydrogen atom or a deuterium atom is substituted.

The same applies to the "substituted or unsubstituted" in the compounds described below or a partial structure thereof.

The alkyl group indicates, for example, a saturated aliphatic hydrocarbon group such as methyl group, ethyl group, n-propyl group, isopropyl group, n-butyl group, sec-butyl group and tert-butyl group, which may or may not have a substituent. The additional substituent in the case of being substituted is not particularly limited and includes, for example, an alkyl group, a halogen, an aryl group, and a heteroaryl group, and this is a common feature in the following description. The carbon number of the alkyl group is not particularly limited but in view of easy availability and cost, is preferably from 1 to 20, more preferably from 1 to 8.

The cycloalkyl group indicates, for example, a saturated alicyclic hydrocarbon group such as cyclopropyl group, cyclohexyl group, norbornyl group and adamantyl group, which may or may not have a substituent. The carbon number of the alkyl group moiety is not particularly limited but is preferably from 3 to 20.

The heterocyclic group indicates, for example, an aliphatic ring having an atom other than carbon in the ring, such as pyrane ring, piperidine ring and cyclic amide, which may or may not have a substituent. The carbon number of the heterocyclic group is not particularly limited but is preferably from 2 to 20.

The alkenyl group indicates, for example, an unsaturated aliphatic hydrocarbon group containing a double bond, such as vinyl group, allyl group and butadienyl group, which may or may not have a substituent. The carbon number of the alkenyl group is not particularly limited but is preferably from 2 to 20.

The cycloalkenyl group indicates, for example, an unsaturated alicyclic hydrocarbon group containing a double bond, such as cyclopentenyl group, cyclopentadienyl group and cyclohexenyl group, which may or may not have a substituent.

The alkynyl group indicates, for example, an unsaturated aliphatic hydrocarbon group containing a triple bond, such as ethynyl group, which may or may not have a substituent. The carbon number of the alkynyl group is not particularly limited but is preferably from 2 to 20.

The alkoxy group indicates, for example, a functional group to which an aliphatic hydrocarbon group is bonded through an ether bond, such as methoxy group, ethoxy group and propoxy group, and the aliphatic hydrocarbon group may or may not have a substituent. The carbon number of the alkoxy group is not particularly limited but is preferably from 1 to 20.

The alkylthio group is a group formed by substituting an oxygen atom of an ether bond of an alkoxy group with a sulfur atom. The hydrocarbon group of the alkylthio group may or may not have a substituent. The carbon number of the alkylthio group is not particularly limited but is preferably from 1 to 20.

The aryl ether group indicates, for example, a functional group to which an aromatic hydrocarbon group is bonded through an ether bond, such as phenoxy group, and the aromatic hydrocarbon group may or may not have a substituent. The carbon number of the aryl ether group is not particularly limited but is preferably from 6 to 40.

The aryl thioether group is a group formed by substituting an oxygen atom of an ether bond of an aryl ether group with a sulfur atom. The aromatic hydrocarbon group in the aryl thioether group may or may not have a substituent. The carbon number of the aryl thioether group is not particularly limited but is preferably from 6 to 40.

The aryl group indicates, for example, an aromatic hydrocarbon group such as phenyl group, biphenyl group, terphenyl group, naphthyl group, fluorenyl group, benzofluorenyl group, dibenzofluorenyl group, phenanthryl group, anthracenyl group, benzophenanthryl group, benzoanthracenyl group, chrysenyl group, pyrenyl group, fluoranthenyl group, triphenylenyl group, benzofluoranthenyl group, dibenzoanthracenyl group, perylenyl group and helicenyl group.

Among these, a phenyl group, a biphenyl group, a terphenyl group, a naphthyl group, a fluorenyl group, a phenanthryl group, an anthracenyl group, a pyrenyl group, a fluoranthenyl group, and a triphenylenyl group are preferred. The aryl group may or may not have a substituent. The carbon number of the aryl group is not particularly limited but is preferably from 6 to 40, more preferably from 6 to 30.

In the case where $R^1$ to $R^9$ are a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group, a biphenyl group, or a terphenyl group, yet still more preferably a phenyl group.

In the case where each substituent is further substituted with an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group.

The heteroaryl group indicates, for example, a cyclic aromatic group having one or a plurality of atoms other than carbon in the ring, such as pyridyl group, furanyl group, thiophenyl group, quinolinyl group, isoquinolinyl group, pyrazinyl group, pyrimidyl group, pyridazinyl group, triazinyl group, naphthylidinyl group, cinnolinyl group, phthaladinyl group, quinoxalinyl group, quinazolinyl group, benzofuranyl group, benzothiophenyl group, indolyl group, dibenzofuranyl group, dibenzothiophenyl group, carbazolyl group, benzocarbazolyl group, carbolinyl group, indolocarbazolyl group, benzofurocarbazolyl group, benzothienocarbazolyl group, dihydroindenocarbazolyl group, benzoquinolinyl group, acridinyl group, dibenzoacridinyl group, benzimidazolyl group, imidazopyridyl group, benzoxazolyl group, benzothiazolyl group and phenanthrolinyl group. Here, the naphthylidinyl group indicates any of 1,5-naphthylidinyl group, 1,6-naphthylidinyl group, 1,7-naphthylidinyl group, 1,8-naphthylidinyl group, 2,6-naphthylidinyl group, and 2,7-naphthylidinyl group. The heteroaryl group may or may not have a substituent. The carbon number of the heteroaryl group is not particularly limited but is preferably from 2 to 40, more preferably from 2 to 30.

In the case where $R^1$ to $R^9$ are a substituted or unsubstituted heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, still more preferably a pyridyl group.

In the case where each substituent is further substituted with a heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, still more preferably a pyridyl group.

A halogen indicates an atom selected from fluorine, chlorine, bromine and iodine.

Each of the carbonyl group, carboxyl group, oxycarbonyl group and carbamoyl group may or may not have a substituent. The substituent includes, for example, an alkyl group, a cycloalkyl group, an aryl group, and a heteroaryl group, and these may be further substituted.

The amino group is a substituted or unsubstituted amino group. The substituent in the case of being substituted includes, for example, an aryl group, a heteroaryl group, a linear alkyl group, and a branched alkyl group. For the aryl group and heteroaryl group, a phenyl group, a naphthyl group, a pyridyl group, and a quinolinyl group are preferred. These substituents may be further substituted. The carbon number is not particularly limited but is preferably from 2 to 50, more preferably from 6 to 40, still more preferably from 6 to 30.

The silyl group indicates, for example, an alkylsilyl group such as trimethylsilyl group, triethylsilyl group, tert-butyldimethylsilyl group, propyldimethylsilyl group and vinyldimethylsilyl group, or an arylsilyl group such as phenyldimethylsilyl group, tert-butyldiphenylsilyl group, triphenylsilyl group and trinaphthylsilyl group. The substituent on silicon may be further substituted. The carbon number of the silyl group is not particularly limited but is preferably from 1 to 30.

The siloxanyl group indicates a silicon compound group via an ether bond, such as trimethylsiloxanyl group. The substituent on silicon may be further substituted.

The boryl group is a substituted or unsubstituted boryl group. The substituent in the case of being substituted includes, for example, an aryl group, a heteroaryl group, a linear alkyl group, a branched alkyl group, an aryl ether group, an alkoxy group, and a hydroxyl group, and among these, an aryl group and an aryl ether group are preferred.

The phosphine oxide group is a group represented by —P(=O)$R^{10}R^{11}$. $R^{10}$ and $R^{11}$ are selected from the same group as those for $R^1$ to $R^9$.

Arbitrary adjacent two substituents (for example, $R^1$ and $R^2$ in formula (1)) may be bonded each other to form a conjugated or non-conjugated fused ring. As the element constituting the fused ring, the ring may contain an atom selected from nitrogen, oxygen, sulfur, phosphorus and silicon, in addition to carbon. The fused ring may be further fused with another ring.

The compound represented by formula (1) exhibits a high fluorescence quantum yield and provides an emission spectrum with the peak half-value width being small, so that efficient color conversion and high color purity can be achieved.

Furthermore, various properties and physical properties such as luminous efficiency, color purity, thermal stability, light stability and dispersibility can be adjusted by introducing an appropriate substituent into an appropriate position of the compound represented by formula (1).

For example, compared with the case where all of $R^1$, $R^3$, $R^4$ and $R^6$ are hydrogen, when at least one of $R^1$, $R^3$, $R^4$ and $R^6$ is a substituted or unsubstituted alkyl group, a substituted or unsubstituted aryl group, or a substituted or unsubstituted heteroaryl group, better thermal stability and light stability are exhibited.

In the case where at least one of $R^1$, $R^3$, $R^4$ and $R^6$ is a substituted or unsubstituted alkyl group, the alkyl group is preferably an alkyl group having a carbon number of 1 to 6, such as methyl group, ethyl group, n-propyl group, isopropyl group, n-butyl group, sec-butyl group, tert-butyl group, pentyl group and hexyl group, and in addition, because of excellent thermal stability, more preferably a methyl group, an ethyl group, an n-propyl group, an isopropyl group, an n-butyl group, a sec-butyl group, or a tert-butyl group. From the viewpoint of further preventing concentration quenching and enhancing the emission quantum yield, a sterically bulky tert-butyl group is still more preferred. In view of ease of synthesis and easy availability of raw material, a methyl group is also preferably used.

In the case where at least one of $R^1$, $R^3$, $R^4$ and $R^6$ is a substituted or unsubstituted aryl group, the aryl group is preferably a phenyl group, a biphenyl group, a terphenyl group, or a naphthyl group, more preferably a phenyl group or a biphenyl group, particularly preferably a phenyl group.

In the case where at least one of $R^1$, $R^3$, $R^4$ and $R^6$ is a substituted or unsubstituted heteroaryl group, the heteroaryl group is preferably a pyridyl group, a quinolinyl group, or a thiophenyl group, more preferably a pyridyl group or a quinolinyl group, particularly more preferably a pyridyl group.

In the case where all of $R^1$, $R^3$, $R^4$ and $R^6$, which may be the same as or different from one another, are a substituted or unsubstituted alkyl group, good solubility in a binder resin or a solvent is obtained, and thus this is preferred. In view of ease of synthesis and easy availability of raw material, the alkyl group is preferably a methyl group.

In the case where all of $R^1$, $R^3$, $R^4$ and $R^6$, which may be the same as or different from one another, are a substituted or unsubstituted aryl group or a substituted or unsubstituted heteroaryl, better thermal stability and light stability are exhibited, and thus this is preferred. It is more preferred that all of $R^1$, $R^3$, $R^4$ and $R^6$, which may be the same as or different from one another, are a substituted or unsubstituted aryl group.

Some substituents enhance a plurality of properties, but the substituent exhibiting sufficient performance in all is limited. In particular, it is difficult to achieve both high luminous efficiency and high color purity. Accordingly, a plurality of kinds of substituents are introduced, and a compound that is balanced in terms of light emission characteristics, color purity, etc. can thereby be obtained.

Particularly, in the case where all of $R^1$, $R^3$, $R^4$ and $R^6$, which may be the same as or different from one another, are a substituted or unsubstituted aryl group, a plurality of kinds of substituents are preferably introduced, for example, such that $R^1 \neq R^4$, $R^3 \neq R^6$, $R^1 \neq R^3$ or $R^4 \neq R^6$. Here, $\neq$ indicates that the groups are groups having different structures. An aryl group affecting the color purity and an aryl group affecting the efficiency can be introduced at the same time, so that fine-tuning can be made.

Among others, $R^1 \neq R^3$ or $R^4 \neq R^6$ is preferred from the viewpoint of enhancing the luminous efficiency and the color purity in a balanced manner. While one or more aryl groups affecting the color purity are introduced into each of pyrrole rings on both sides, an aryl group affecting the efficiency can be introduced into other sites, so that both properties can be enhanced maximally. In the case where $R^1 \neq R^3$ or $R^4 \neq R^6$, in view of heat resistance and color purity, it is more preferred that $R^1 = R^4$ and $R^3 = R^6$.

The aryl group mainly affecting the color purity is preferably an aryl group substituted with an electron-donating group. The electron-donating group is, in the organic electron theory, an atomic group that donates electrons by an induction effect or a resonance effect to an atomic group on which the group is substituted. The electron-donating group includes a group in which the value of a substituent constant (σp (para)) of Hammett rule is negative. The substituent constant (σp (para)) of Hammett rule can be quoted from *KAGAKU BINRAN* (*Chemical Handbook*), Basic Edition, 5th rev. (page II-380).

Specific examples of the electron-donating group include an alkyl group (σp of methyl group: −0.17), an alkoxy group (σp of methoxy group: −0.27), and an amino group (σp of —NH2: −0.66). In particular, an alkyl group having a carbon number of 1 to 8 or an alkoxy group having a carbon number of 1 to 8 is preferred, and a methyl group, an ethyl group, a tert-butyl group or a methoxy group is more preferred. From the aspect of dispersibility, a tert-butyl group or a methoxy group is particularly preferred, and this prevents quenching due to aggregation of molecules to each other. The substitution position of the substituent is not particularly limited, but since twisting of the bond needs to be suppressed to enhance the light stability, the substituent is preferably bonded at a meta- or para-position relative to the bonding site to the pyrromethene skeleton.

The aryl group mainly affecting the efficiency is preferably an aryl group having a bulky substituent such as tert-butyl group, adamantyl group and methoxy group.

In the case where all of $R^1$, $R^3$, $R^4$ and $R^6$, which may be the same as or different from one another, are a substituted or unsubstituted aryl group, each of them is preferably selected from the following Ar-1 to Ar-6. In this case, the preferable combination of $R^1$, $R^3$, $R^4$ and $R^6$ includes, but is not limited to, the combinations shown in Tables 1-1 to 1-11.

[Chem. 2]

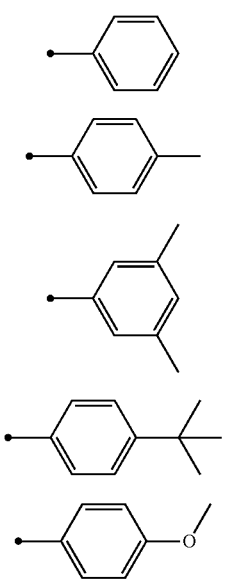

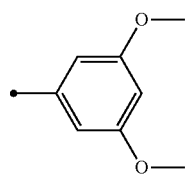

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |

-continued

| R1 | R3 | R4 | R6 |
|---|---|---|---|
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |

TABLE 1-5-continued

| R1 | R3 | R4 | R6 |
|---|---|---|---|
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |

TABLE 1-6-continued

| R1 | R3 | R4 | R6 |
|---|---|---|---|
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |

TABLE 1-7-continued

| R1 | R3 | R4 | R6 |
|---|---|---|---|
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |

TABLE 1-8-continued

| R1 | R3 | R4 | R6 |
| --- | --- | --- | --- |
| Ar-3 | Ar-6 | Ar-2 | Ar-5 |
| Ar-3 | Ar-6 | Ar-2 | Ar-6 |

TABLE 1-9

| R1 | R3 | R4 | R6 |
| --- | --- | --- | --- |
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
| --- | --- | --- | --- |
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
| --- | --- | --- | --- |
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |

TABLE 1-11-continued

| R1 | R3 | R4 | R6 |
|---|---|---|---|
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

Each of $R^2$ and $R^5$ is preferably hydrogen, an alkyl group, a carbonyl group, an oxycarbonyl group or an aryl but is preferably an alkyl group or hydrogen in view of thermal stability, and more preferably hydrogen in that a narrow half-value width is readily obtained in the emission spectrum.

Each of $R^8$ and $R^9$ is preferably an alkyl group, an aryl group, a heteroaryl group, fluorine, a fluorine-containing alkyl group, a fluorine-containing heteroaryl group, or a fluorine-containing aryl group, and for the reason that the compound is stable against excitation light and a higher fluorescence quantum yield is obtained, each substituent is more preferably fluorine or a fluorine-containing aryl group, still more preferably fluorine in view of ease of synthesis.

Here, the fluorine-containing aryl group is an aryl group containing fluorine and includes, for example, a fluorophenyl group, a trifluoromethylphenyl group, and a pentafluorophenyl group. The fluorine-containing heteroaryl group is a heteroaryl group containing fluorine and includes, for example, a fluoropyridyl group, a trifluoromethylpyridyl group, and a trifluoropyridyl group. The fluorine-containing alkyl group is an alkyl group containing fluorine and includes a trifluoromethyl group, a pentafluoroethyl group, etc.

X is preferably C—$R^7$ in view of light stability.

When X is C—$R^7$, the substituent $R^7$ greatly affects the durability of the compound represented by formula (1), i.e., the reduction in the light emission intensity over time. More specifically, when $R^7$ is hydrogen, the hydrogen has high reactivity and readily reacts with water or oxygen in the air to cause decomposition. Furthermore, when $R^7$ is, for example, a substituent having a large degree of freedom of movement of the molecular chain, such as alkyl group, the reactivity certainly decreases, but the compounds aggregate to each other over time in the composition, resulting in reduction of the light emission intensity due to concentration quenching. Accordingly, $R^7$ is preferably a rigid group having a small degree of freedom of movement and causing less aggregation and, specifically, is preferably either a substituted or unsubstituted aryl group or a substituted or unsubstituted heteroaryl group.

From the viewpoint of providing a higher fluorescence quantum yield and causing less thermal decomposition and in view of light stability, it is preferred that X is C—$R^7$ and $R^7$ is a substituted or unsubstituted aryl group. As the aryl group, for the reason that the emission wavelength is not impaired, a phenyl group, a biphenyl group, a terphenyl group, a naphthyl group, a fluorenyl group, a phenanthryl group, and an anthracenyl group are preferred.

In order to further enhance the light stability, twisting between $R^7$ and carbon-carbon bond of the pyrromethene skeleton needs to be appropriately suppressed. If excessive twisting occurs, the light stability decreases due to, e.g., an increase in the reactivity for excitation light. From such a viewpoint, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, still more preferably a substituted or unsubstituted phenyl group.

In addition, $R^7$ is preferably an appropriately bulky substituent. When $R^7$ has a certain degree of bulkiness, aggregation of molecules can be prevented, and the luminous efficiency or durability is more improved.

Further preferable examples of the bulky substituent include a structure represented by the following formula (2):

[Chem. 3]

(2)

In the formula, r is selected from the group consisting of hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, and a phosphine oxide group, k is an integer of 1 to 3, and when k is 2 or more, r may be the same as or different from one another.

From the viewpoint that a higher fluorescence quantum yield is provided, r is preferably a substituted or unsubstituted aryl group. Among aryl groups, preferable examples include a phenyl group and a naphthyl group. In the case where r is an aryl group, k in formula (2) is preferably 1 or 2, and in view of higher effect of preventing aggregation of molecules, k is more preferably 2. Furthermore, at least one r is preferably substituted with an alkyl group. In this case, in view of thermal stability, particularly preferable examples of the alkyl group include a methyl group, an ethyl group, and a tert-butyl group.

In addition, from the viewpoint of controlling the fluorescence wavelength or absorption wavelength or increasing the compatibility with a solvent, r is preferably a substituted or unsubstituted alkyl group, a substituted or unsubstituted alkoxy group, or halogen, more preferably a methyl group, an ethyl group, a tert-butyl group or a methoxy group. In view of dispersibility, a tert-butyl group or a methoxy group is particularly preferred, and this prevents quenching due to aggregation of molecules to each other.

In another embodiment of the compound represented by formula (1), at least one of $R^1$ to $R^7$ is preferably an electron-withdrawing group. In particular, it is preferred that (1) at least one of $R^1$ to $R^6$ is an electron-withdrawing group, (2) $R^7$ is an electron-withdrawing group, or (3) at least one of $R^1$ to $R^6$ is an electron-withdrawing group and $R^7$ is an electron-withdrawing group. Introduction of an electron-withdrawing group into the pyrromethene skeleton makes it possible to greatly decrease the electron density of the pyrromethene skeleton. Consequently, the stability against oxygen is more enhanced, and the durability can be more improved.

The electron-withdrawing group, otherwise called an electron-accepting group, is, in the organic electron theory, an atomic group that draws electrons by an induction effect or a resonance effect from an atomic group on which the group is substituted. The electron-withdrawing group includes a group in which the value of a substituent constant (σp (para)) of Hammett rule is positive. The substituent constant (σp (para)) of Hammett rule can be quoted from *KAGAKU BINRAN* (*Chemical Handbook*), Basic Edition, 5th rev. (page 11-380).

A phenyl group takes a positive value in some examples, but the phenyl group is not encompassed by the electron-withdrawing group of the present application.

Examples of the electron-withdrawing group include —F (σp: +0.20), —Cl (σp: +0.28), —Br (σp: +0.30), —I (σp: +0.30), —CO$_2$R$^{12}$ (σp: +0.45 when R$^{12}$ is an ethyl group), —CONH$_2$ (σp: +0.38), —COR$^{12}$ (σp: +0.49 when R$^{12}$ is a methyl group), —CF$_3$ (σp: +0.51), —SO$_2$R$^{12}$ (σp: +0.69 when R$^{12}$ is a methyl group), and —NO$_2$ (σp: +0.81). Each R$^{12}$ independently represents a hydrogen atom, a substituted or unsubstituted aromatic hydrocarbon group having a ring-forming carbon number of 6 to 30, a substituted or unsubstituted heterocyclic group having a ring-forming carbon number of 5 to 30, a substituted or unsubstituted alkyl group having a carbon number of 1 to 30, or a substituted or unsubstituted cycloalkyl group having a carbon number of 1 to 30. Specific examples of each of these groups include the same examples as above.

The electron-withdrawing group is preferably fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, or a cyano group, because such a group is less likely to be chemically decomposed.

The electron-withdrawing group is more preferably a fluorine-containing alkyl group, a substituted or unsubstituted acyl group, a substituted or unsubstituted ester group, or a cyano group, because concentration quenching is prevented and this leads to an effect of enhancing the emission quantum yield. Among others, a substituted or unsubstituted ester group is preferred.

In still another embodiment, the compound represented by formula (1) is preferably a compound represented by the following formula (3):

[Chem. 4]

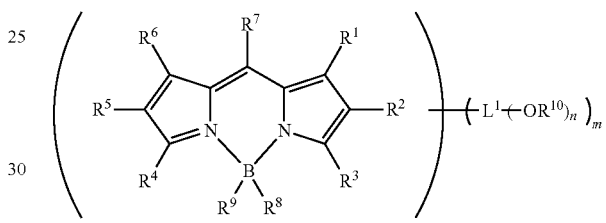

(3)

In the formula, $R^1$ to $R^9$ are the same as those in formula (1). However, $L^1$ is bonded at any m positions of $R^1$ to $R^7$. Here, "$L^1$ is bonded at any position of $R^1$ to $R^7$" means that $L^1$ is bonded directly to a carbon atom to which $R^1$ to $R^7$ are connected.

$L^1$ is a linking group and is selected from a single bond, an alkylene group, an arylene group, and a heteroarylene group.

$R^{10}$ may be the same as or different from one another and is a substituted or unsubstituted alkyl group.

m and n are a natural number and are m×n≥5.

—OR$^{10}$ is an alkoxy group and thanks to its bulkiness, can prevent quenching due to aggregation of molecules to each other. In particular, when m×n≥5, the number of bulky substituents increases to enhance the effect of preventing aggregation and therefore, high luminous efficiency can be realized. Furthermore, m≥2 is preferred because the effect of preventing aggregation is enhanced; m≥3 is more preferred, because the entire molecule can be covered with a bulky substituent; and m≥4 is still more preferred.

In the case where $L^1$ is a group except for a single bond, the group serves as a spacer between the pyrromethene skeleton and —OR$^{10}$. When a spacer is present between the pyrromethene skeleton and —OR$^{10}$, this is advantageous in that aggregation of pyrromethene skeletons to each other is further prevented. $L^1$ is preferably selected from an alkylene group, an arylene group, and a heteroarylene group. Among others, an arylene group and a heteroarylene group, each having high rigidity, are preferred, and a phenylene group is particularly preferred, because the carbon-carbon bond does not excessively twist.

R$^{10}$ includes a methyl group, an ethyl group, an n-propyl group, an isopropyl group, an n-butyl group, a sec-butyl group, a tert-butyl group, a pentyl group, a hexyl group, etc.

and is not particularly limited, but in view of ease of synthesis, a methyl group is preferred.

For the reason that the effect of preventing aggregation increases, at least two of $R^1$, $R^3$, $R^4$ and $R^6$ are preferably used for bonding to $L^1$, and it is more preferred that at least three of $R^1$, $R^3$, $R^4$ and $R^6$ are used for bonding to $L^1$. Furthermore, when all of $R^1$, $R^3$, $R^4$ and $R^6$ are used for bonding to $L^1$, the entire molecule can be covered with a bulky substituent, and this is particularly preferred.

For the reason that thermal decomposition is less likely to occur, and in view of light stability, it is preferred that $R^7$ is a group represented by formula (2) or $L^1$ is bonded at the position of $R^7$.

One preferable example of the compound represented by formula (1) includes a case where all of $R^1$, $R^3$, $R^4$ and $R^6$, which may be the same as or different from one another, are a substituted or unsubstituted alkyl group, X is C—$R^7$, and $R^7$ is a substituted aryl group, particularly preferably a group represented by formula (2).

Another preferable example of the compound represented by formula (1) includes a case where all of $R^1$, $R^3$, $R^4$ and $R^6$, which may be the same as or different from one another, are selected from Ar-1 to Ar-6, X is C—$R^7$, and $R^7$ is a substituted aryl group, particularly preferably an aryl group substituted with a methoxy group.

Examples of the compound represented by formula (1) are illustrated below, but the present invention is not limited thereto.

[Chem. 5]

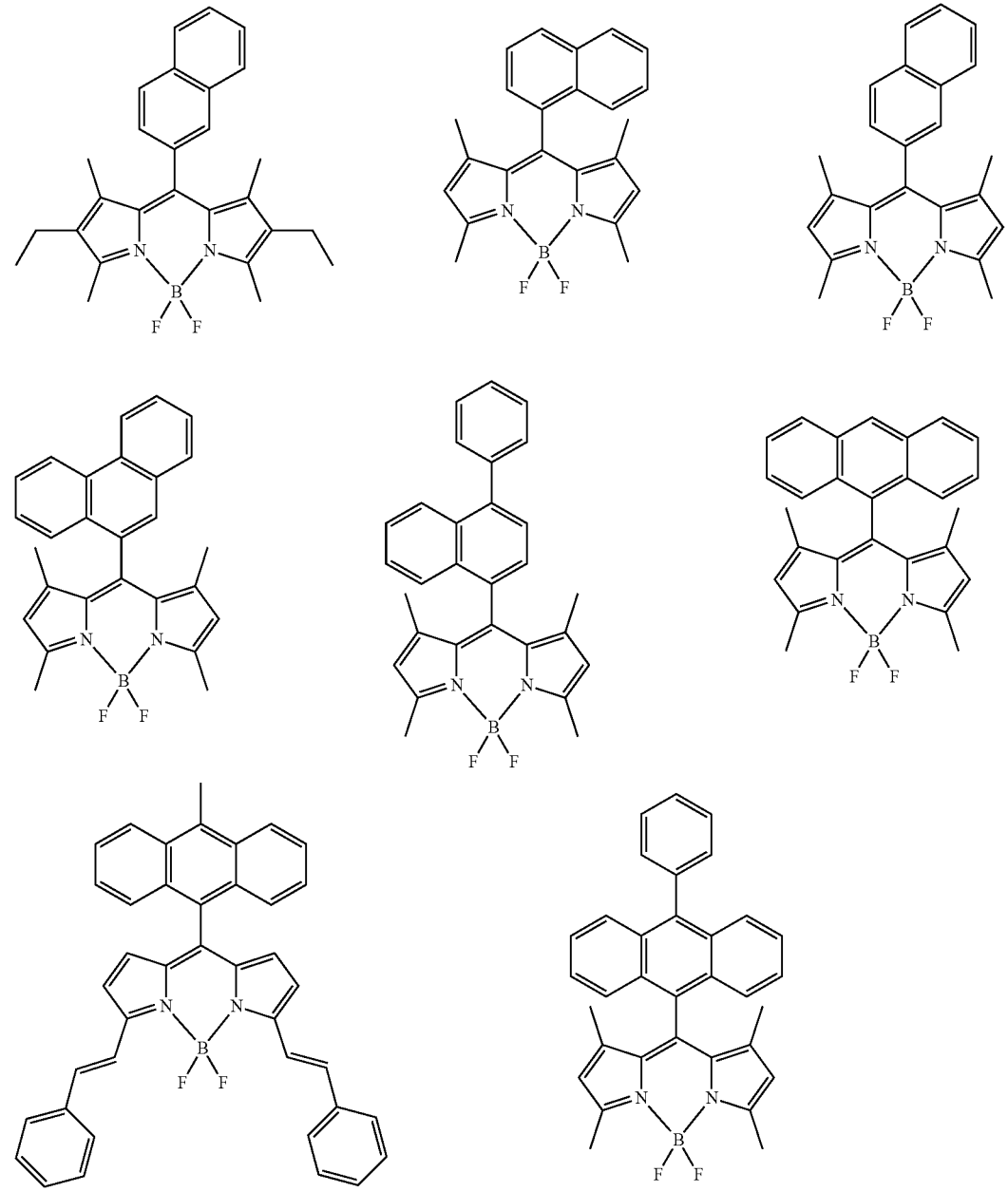

25
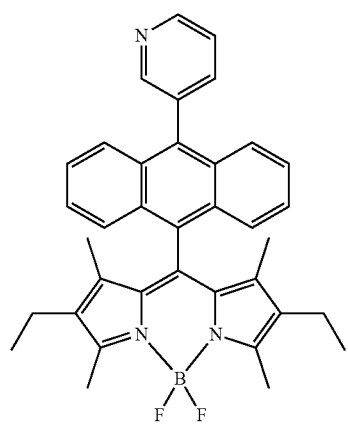
26
-continued
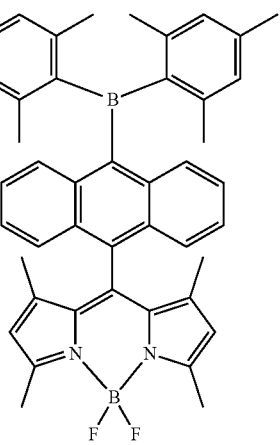
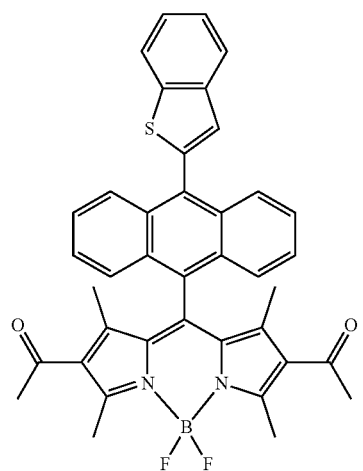
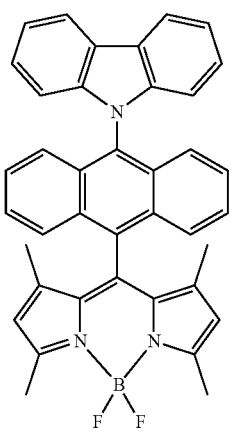
[Chem. 6]
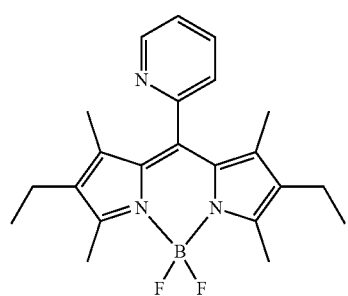
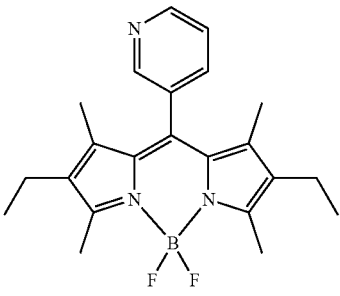
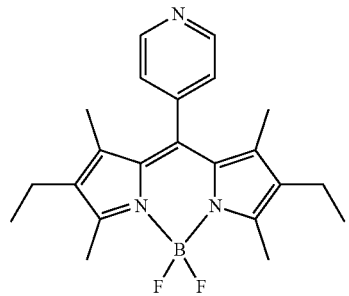
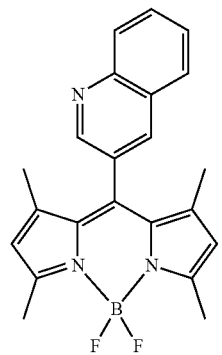
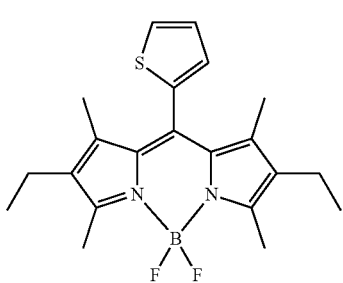
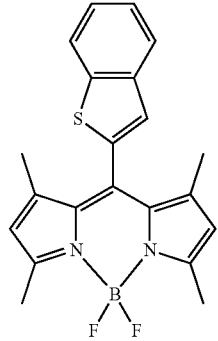

-continued
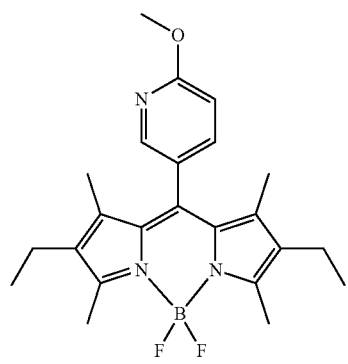
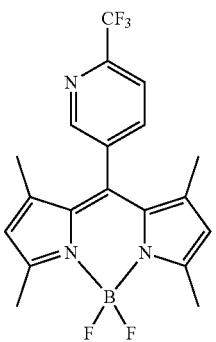
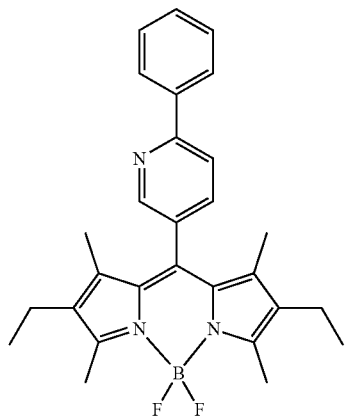
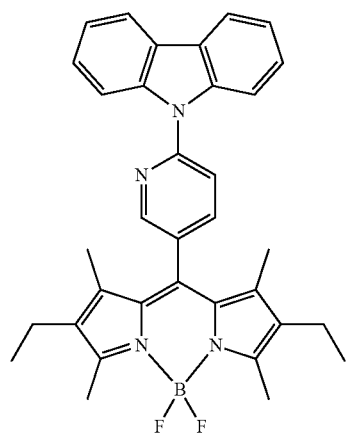
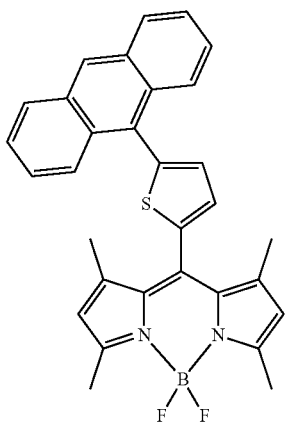
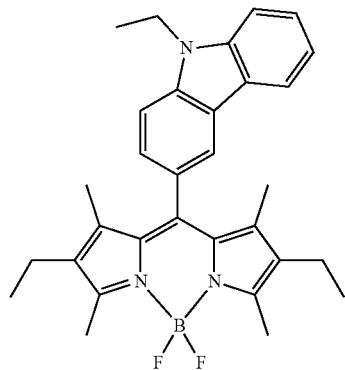
[Chem. 7]
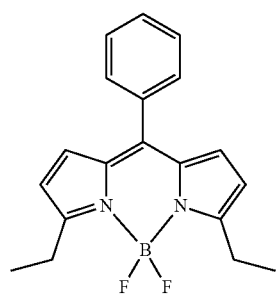
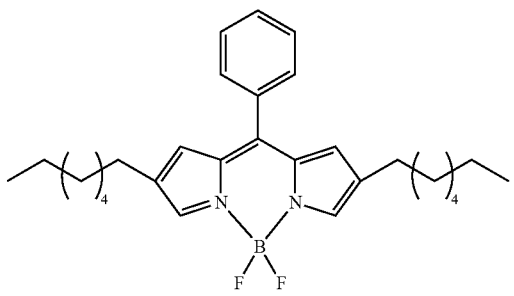
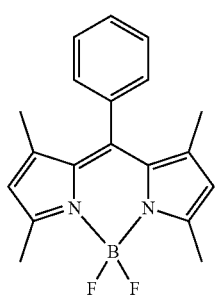
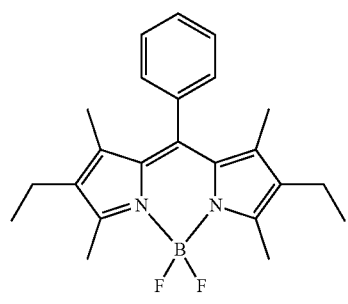
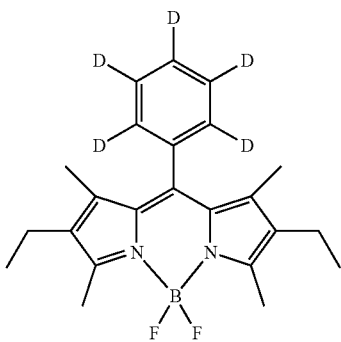
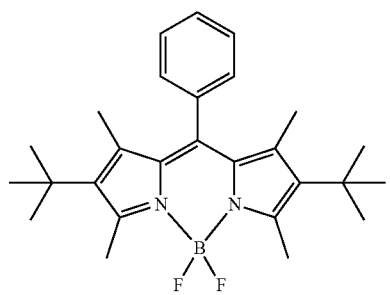

-continued
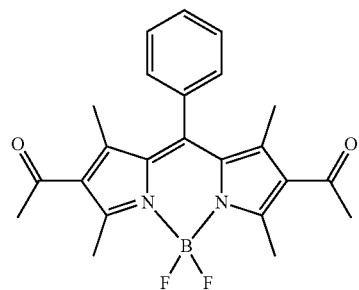
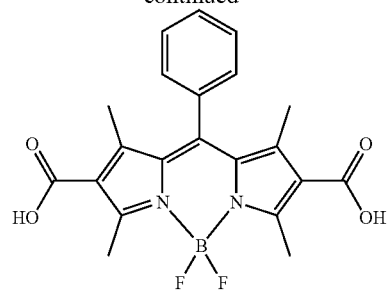
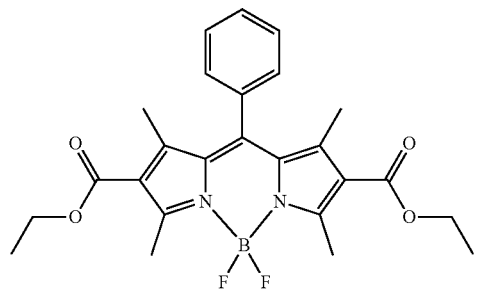
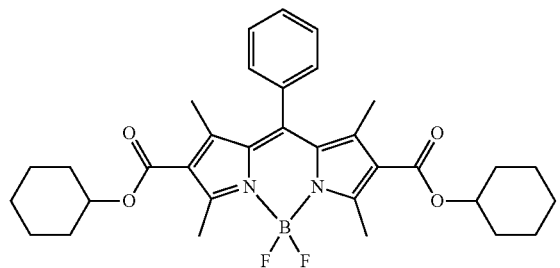
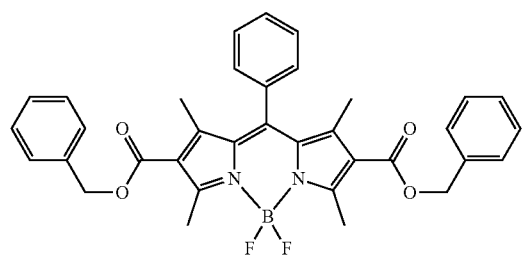
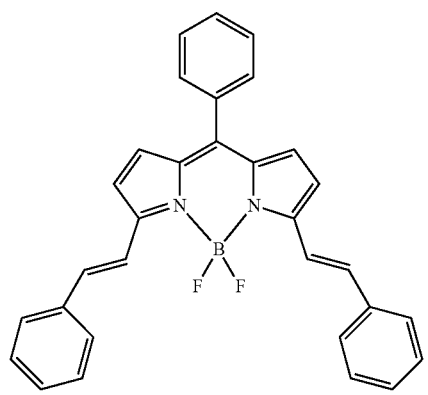
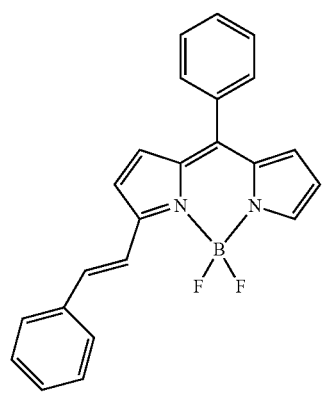
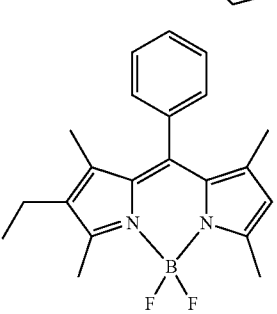
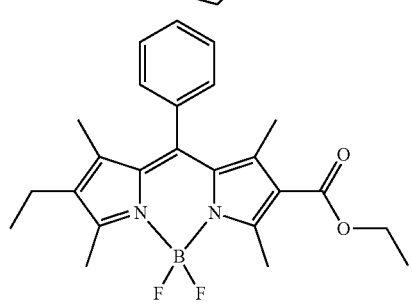
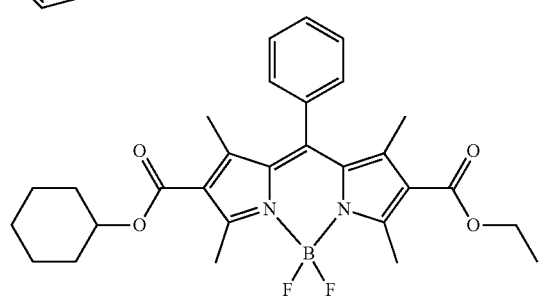

[Chem. 8]
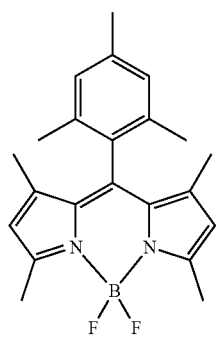
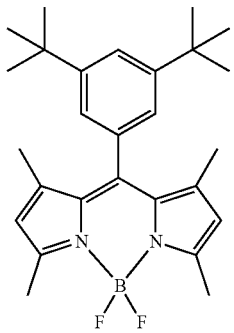
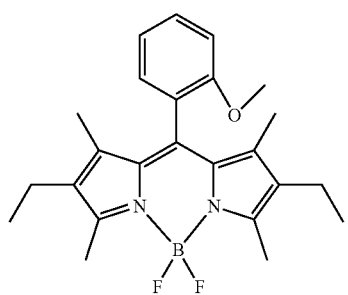
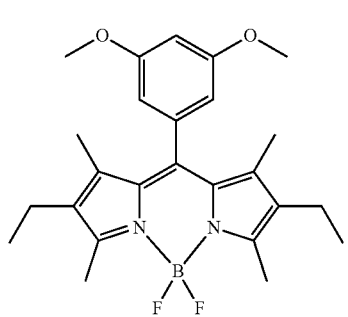
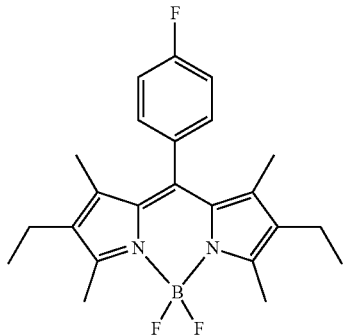
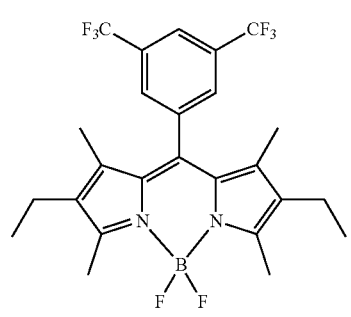
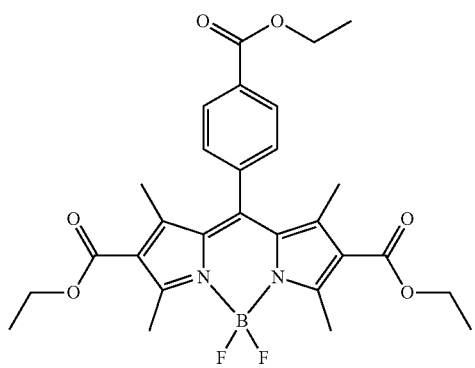
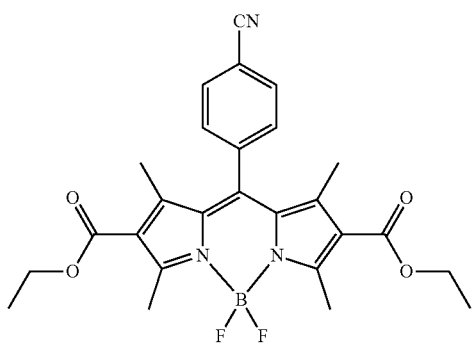
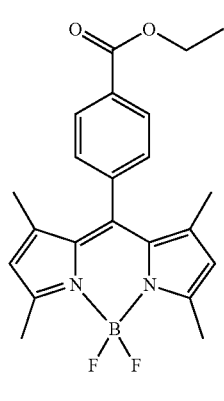
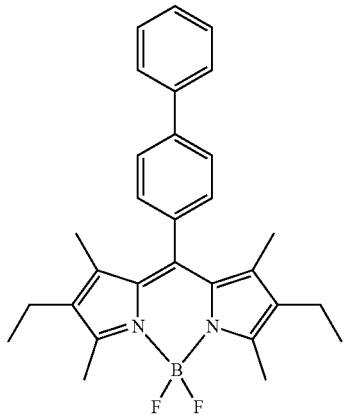
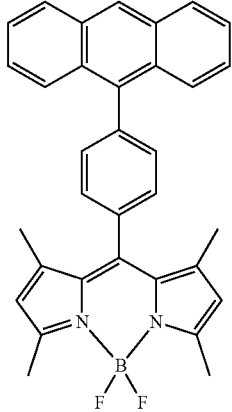
-continued -continued
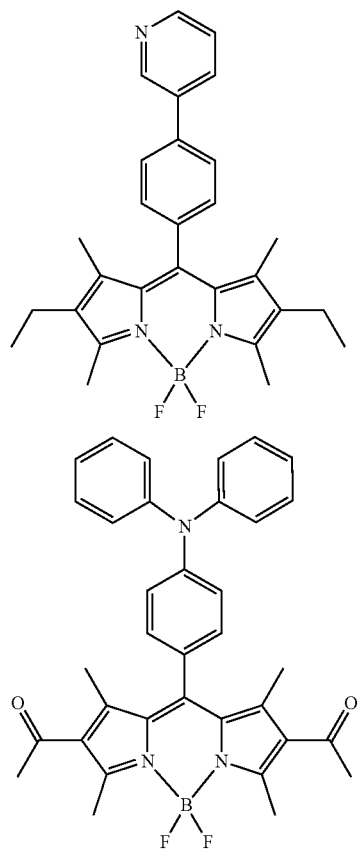
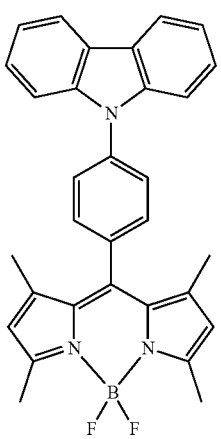
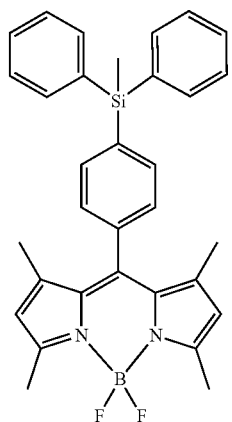
[Chem. 9]
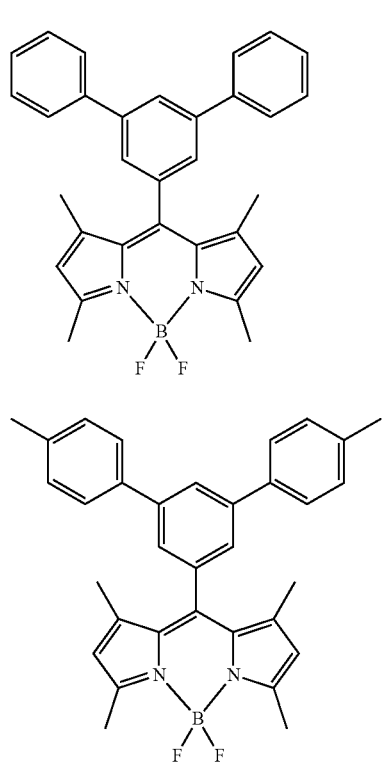
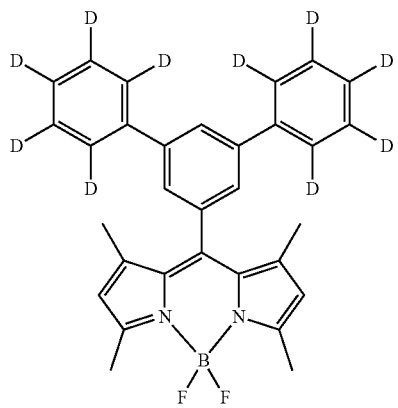
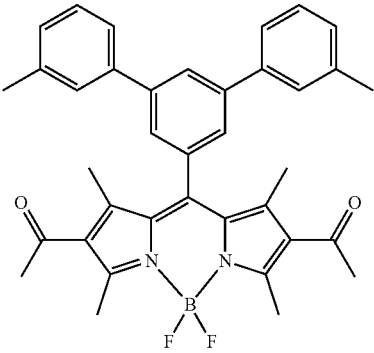
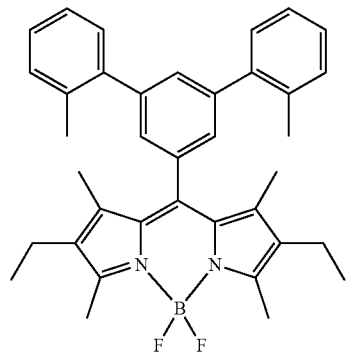

35
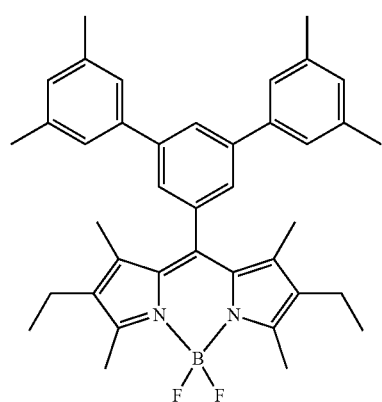
36
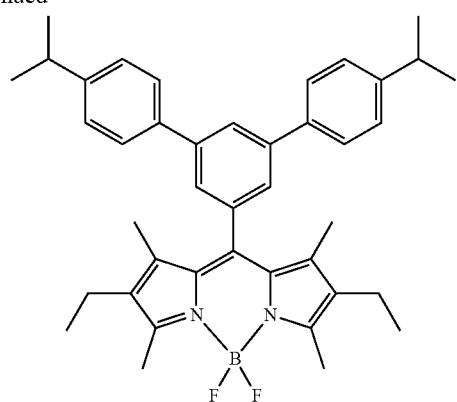
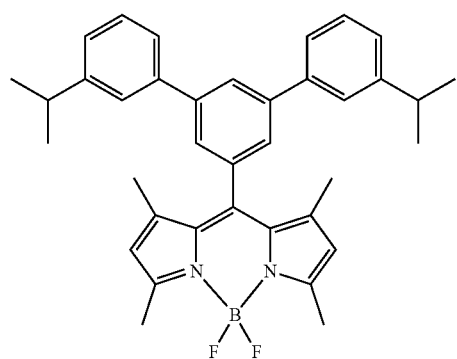
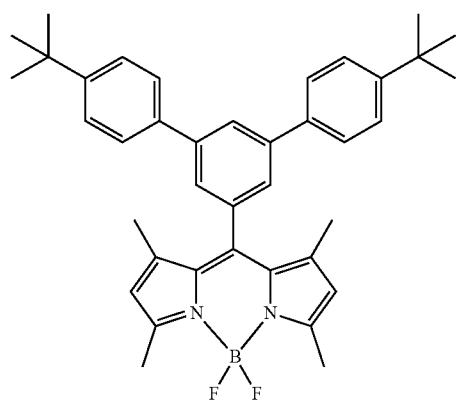
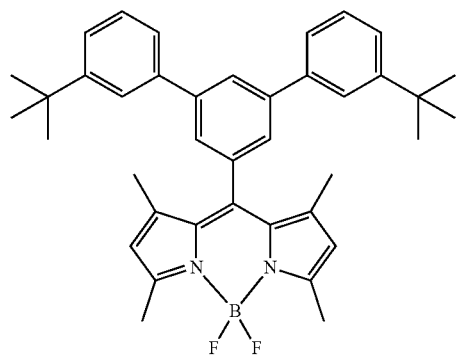
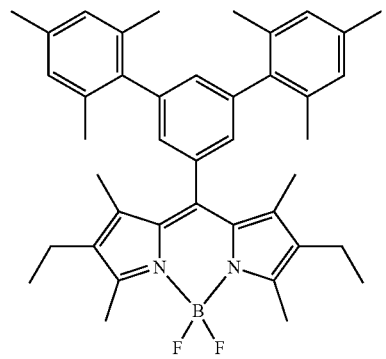
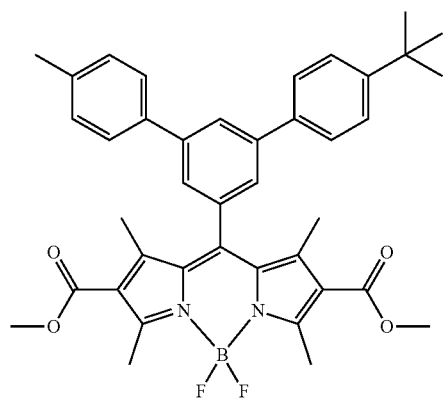
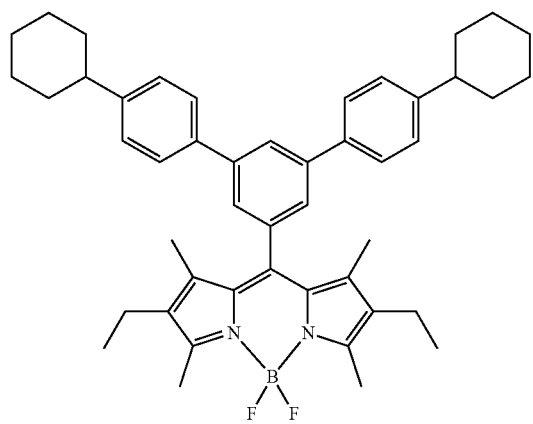

-continued
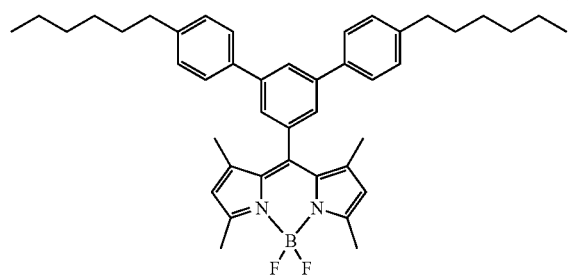
[Chem. 10]
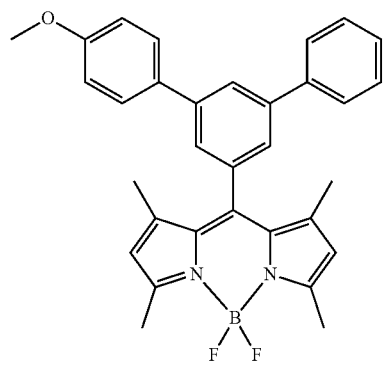 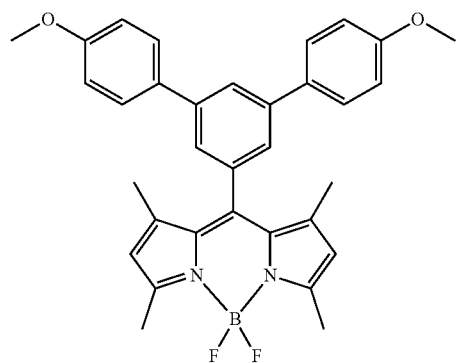
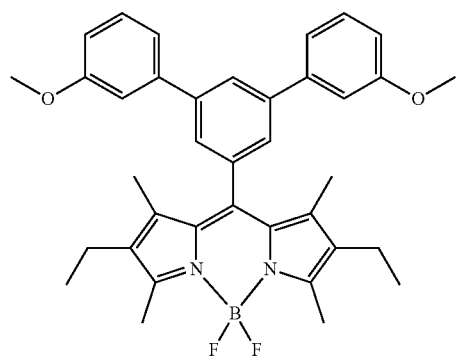 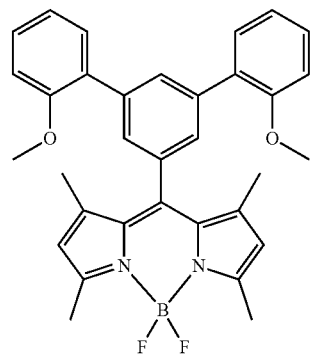
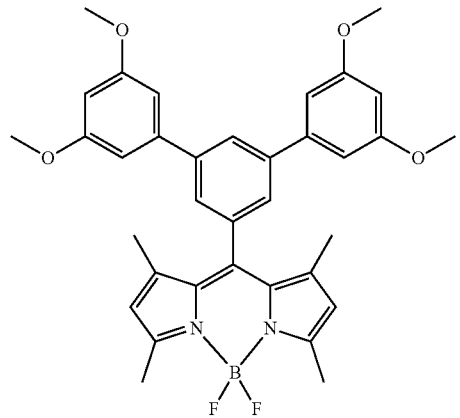 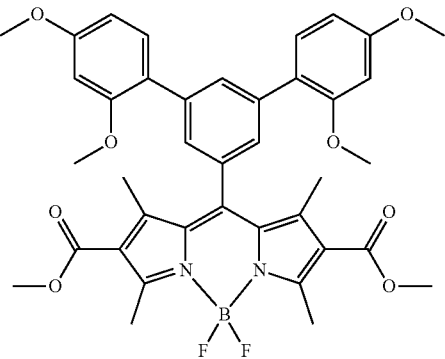

-continued
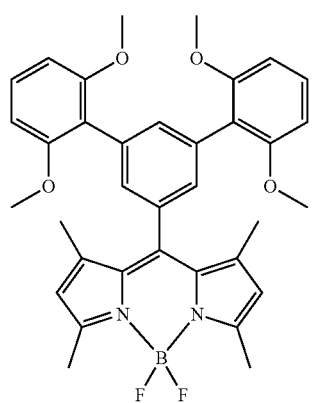
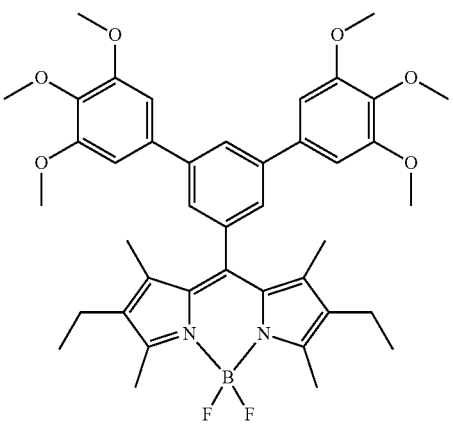
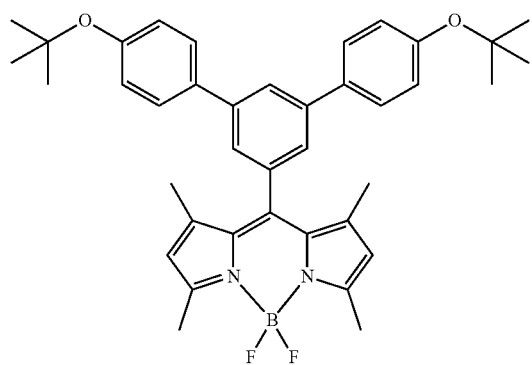
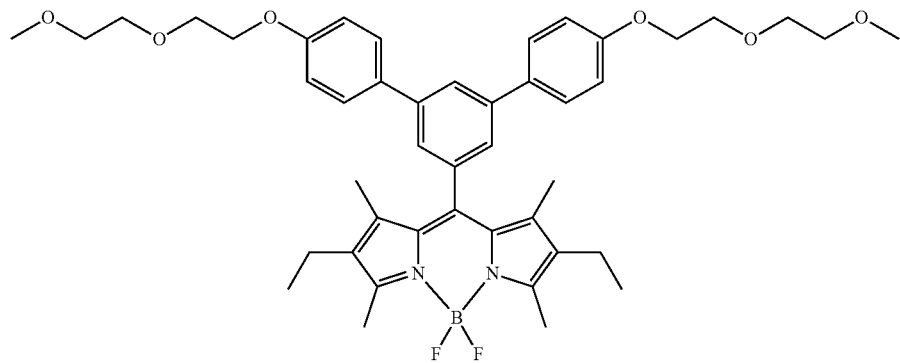
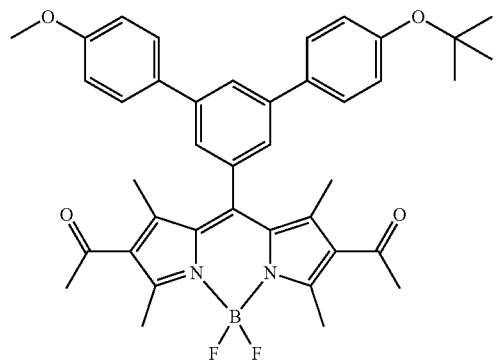

41
-continued
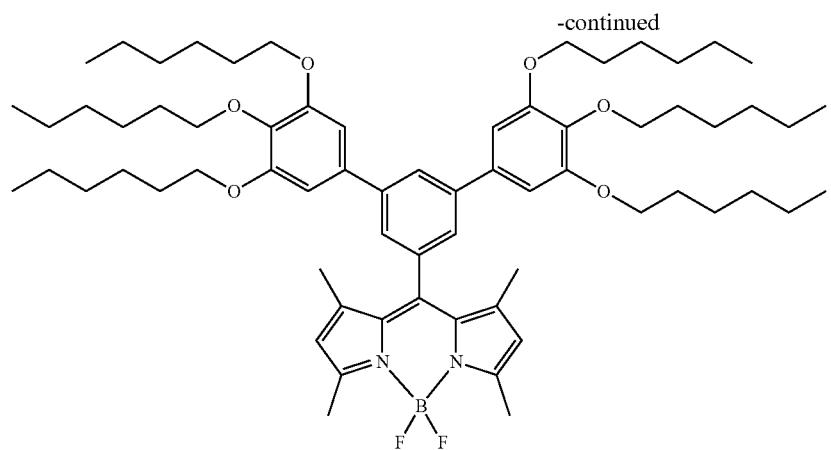
[Chem. 11]
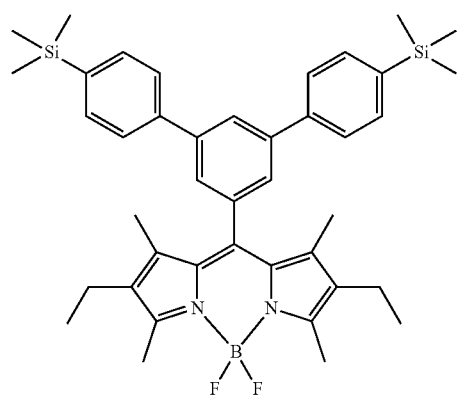
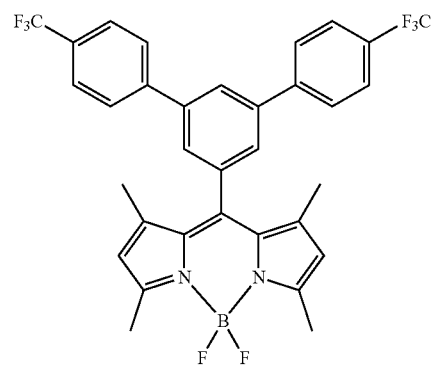
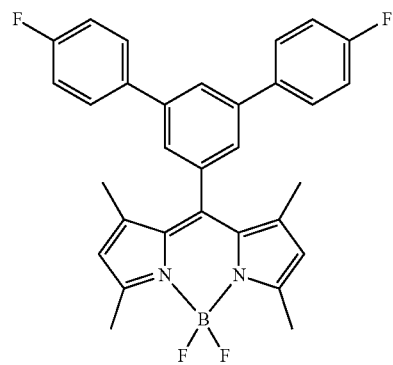
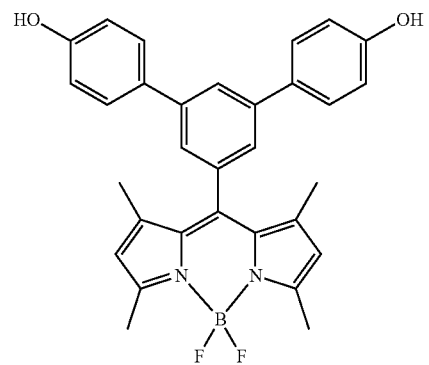
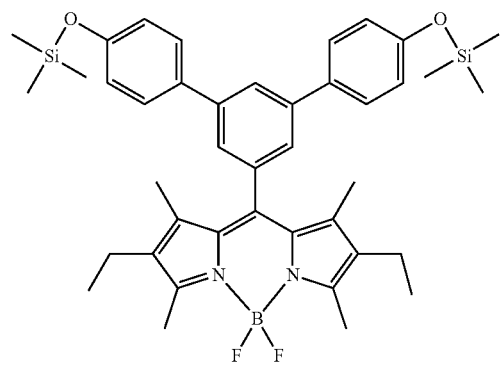
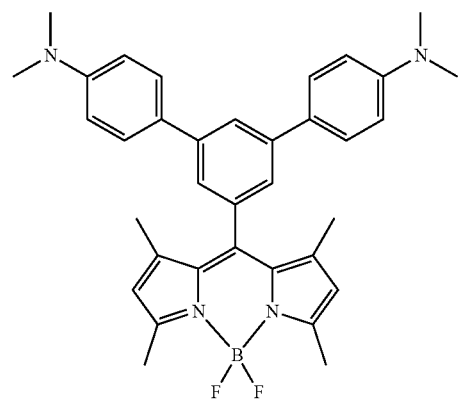

43
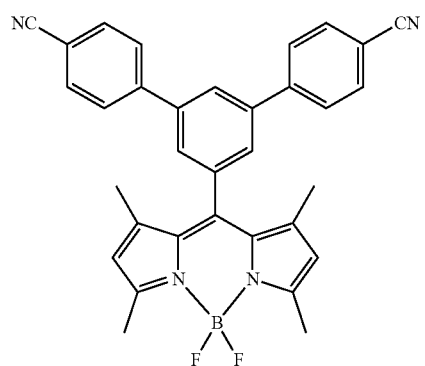
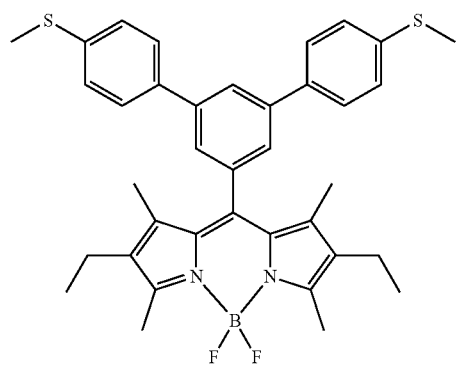
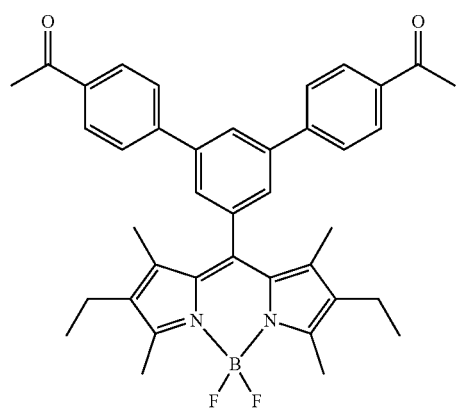
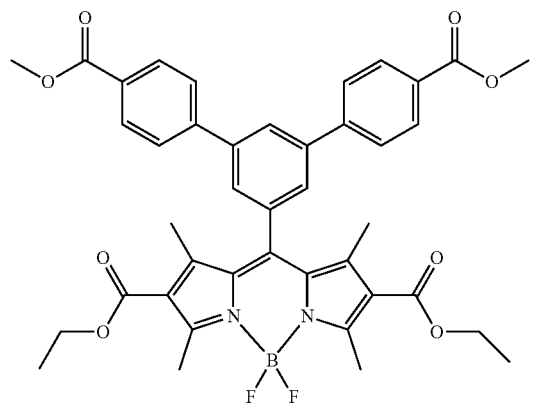
44
-continued
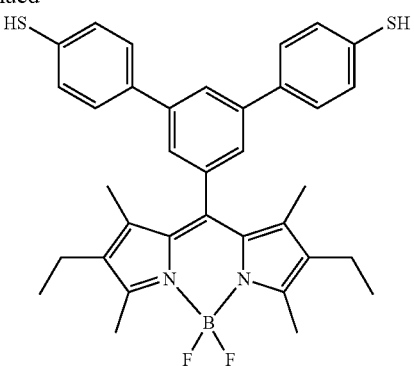
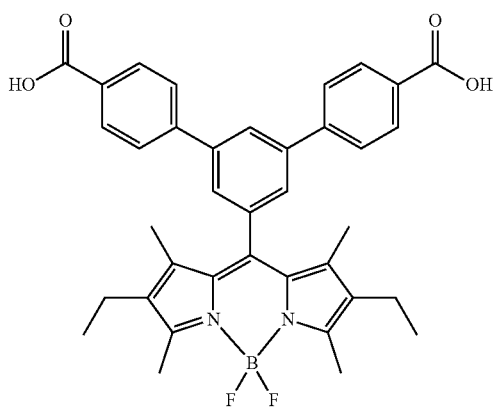
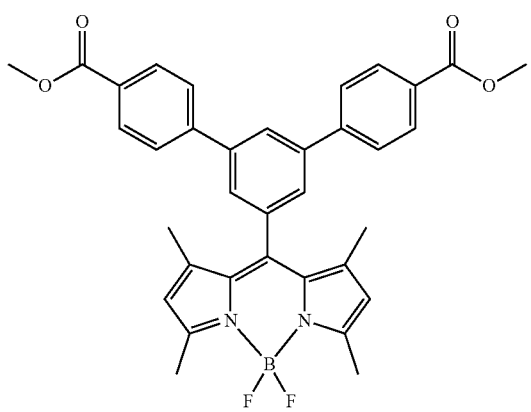
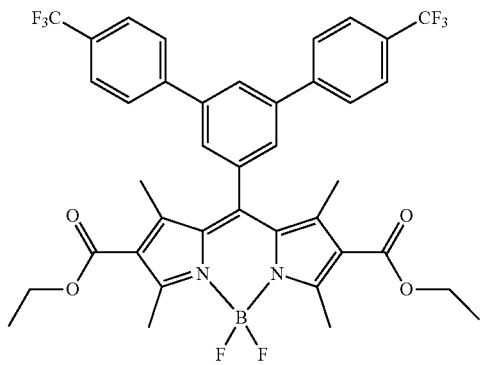

[Chem. 12]
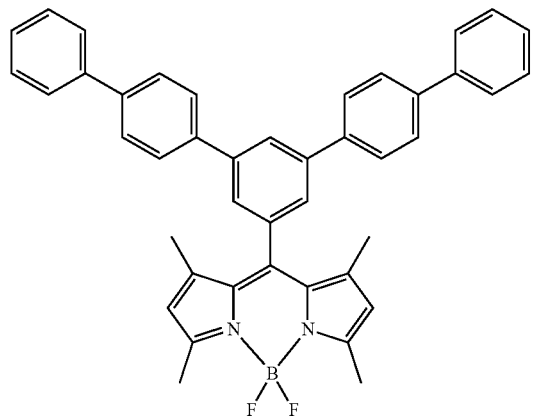
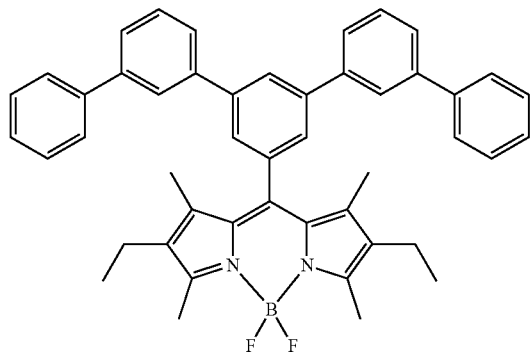
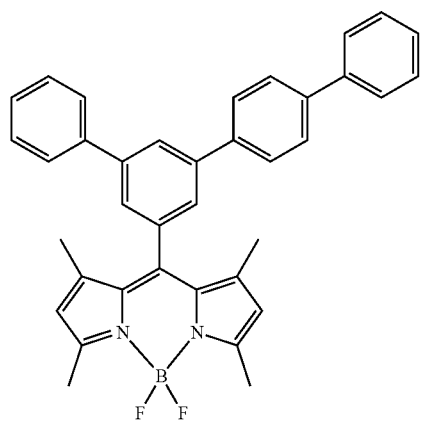
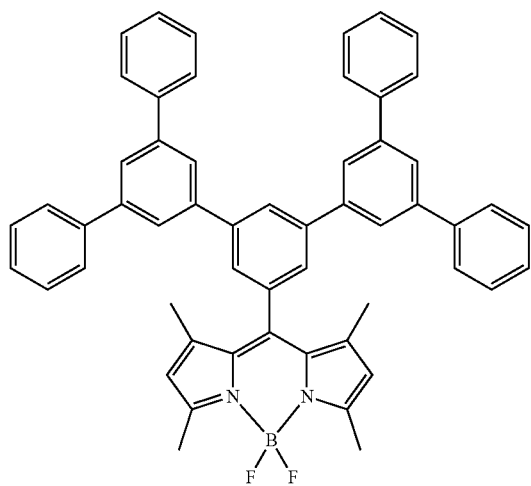
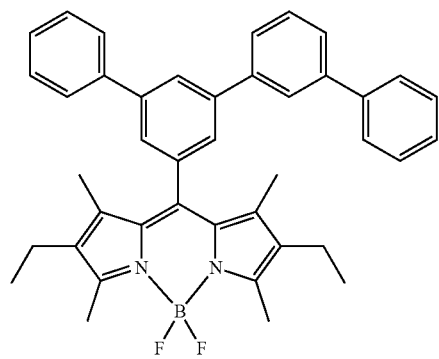
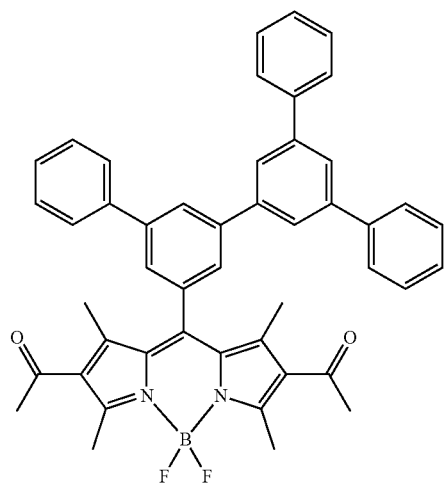

-continued
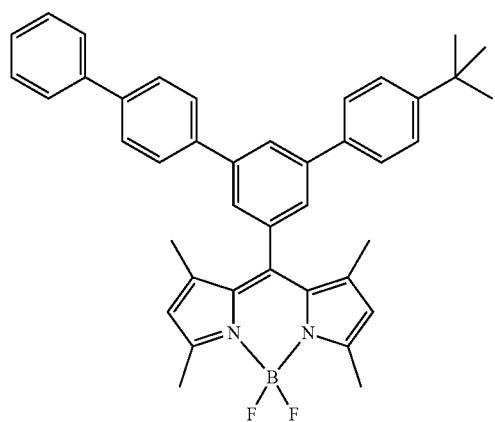
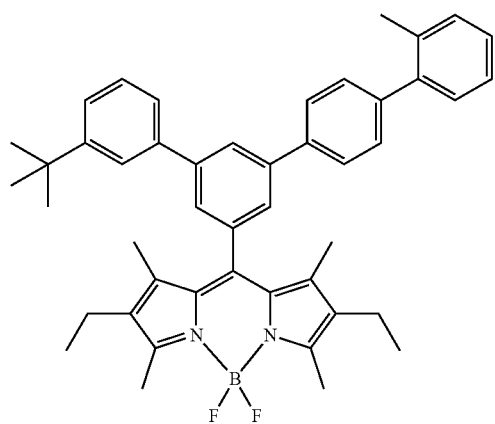
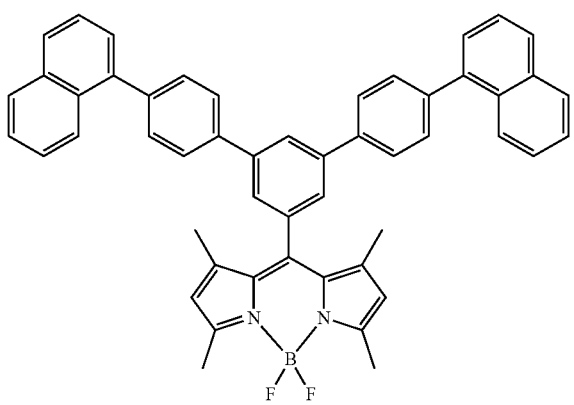
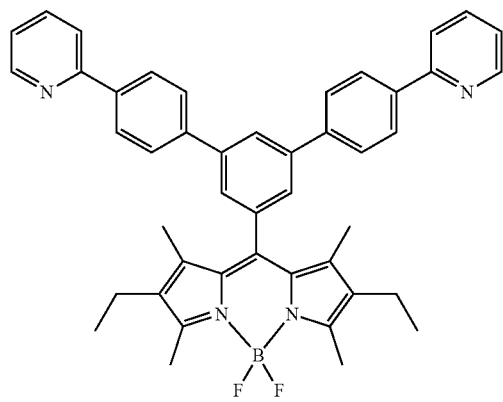
[Chem. 13]
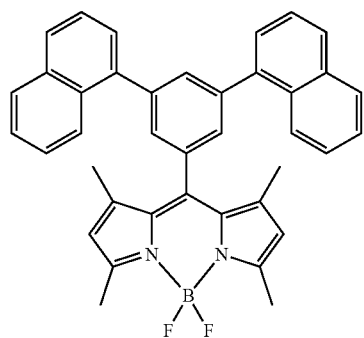
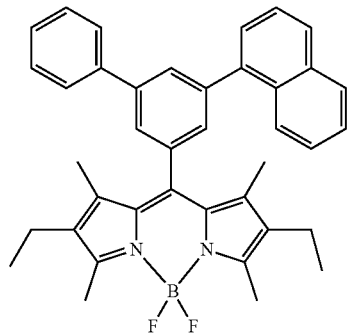

-continued
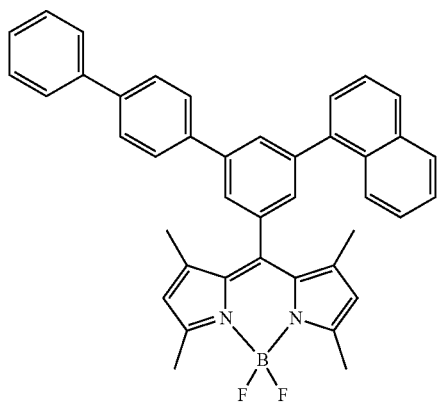
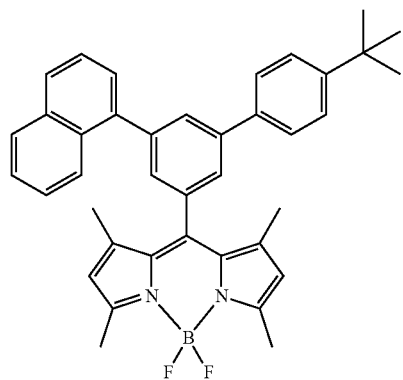
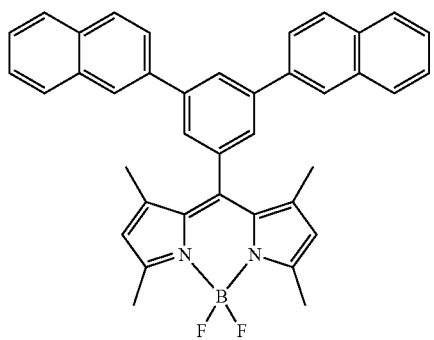
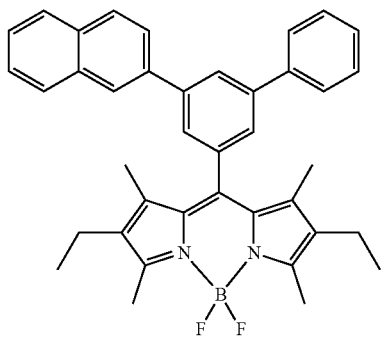
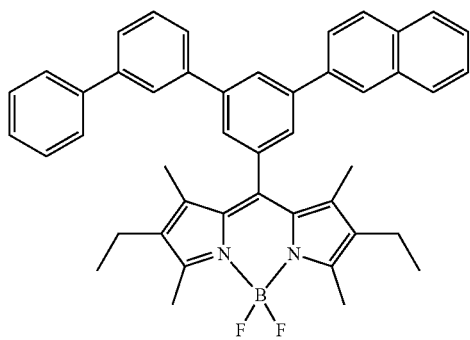
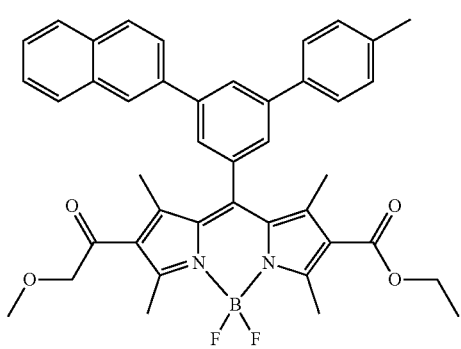
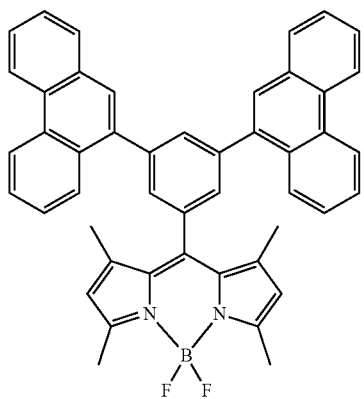
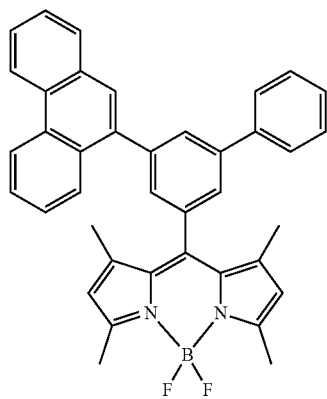

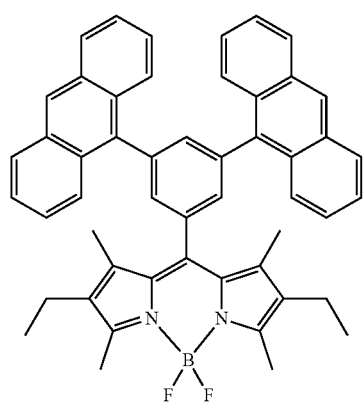
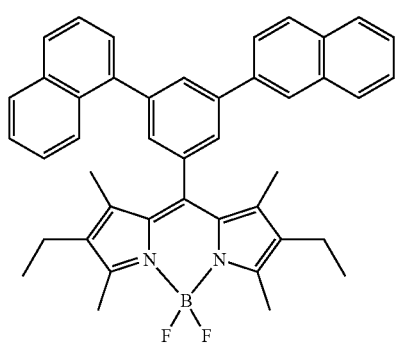
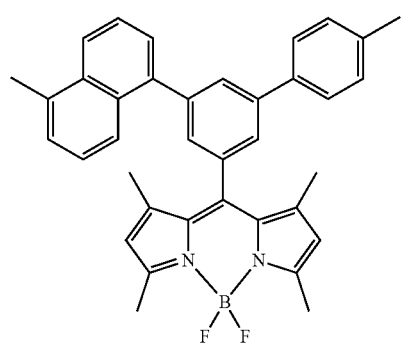
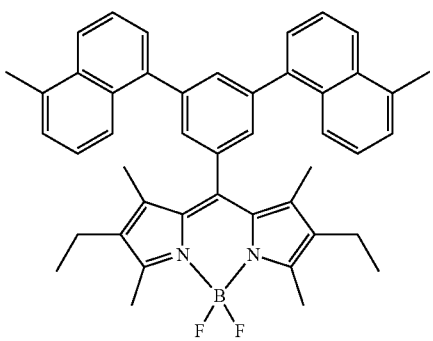
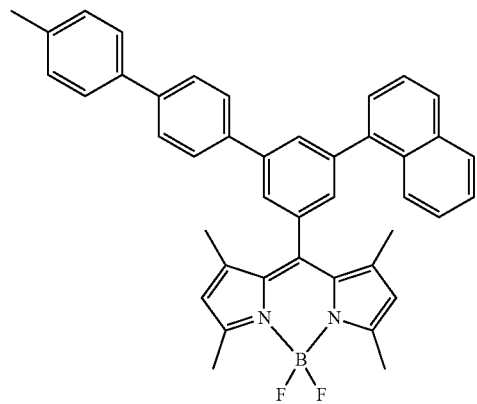
[Chem. 14]
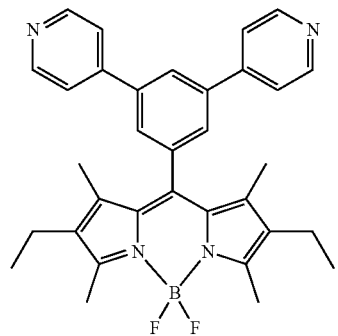
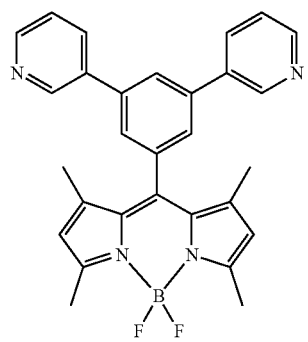
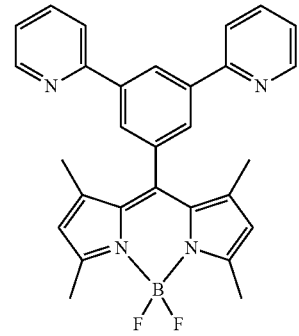

-continued
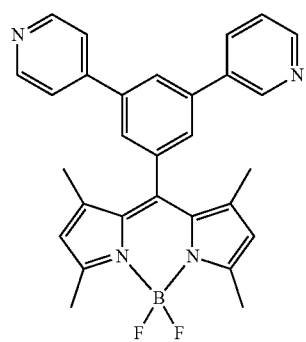
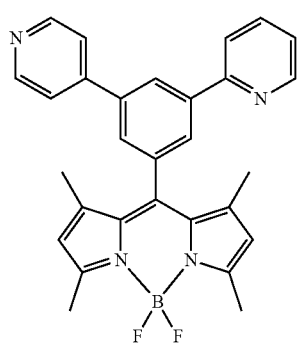
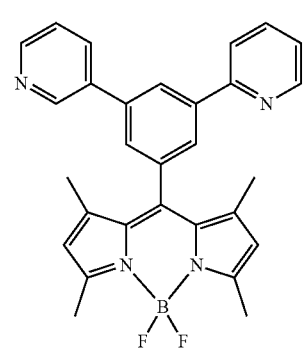
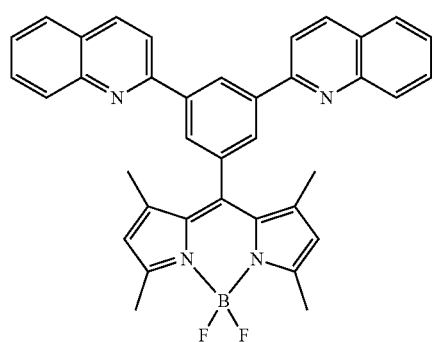
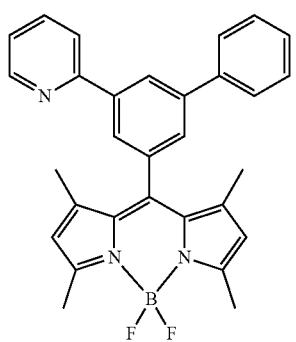
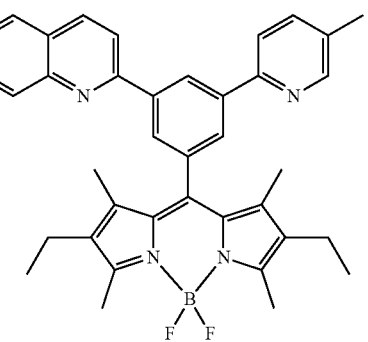
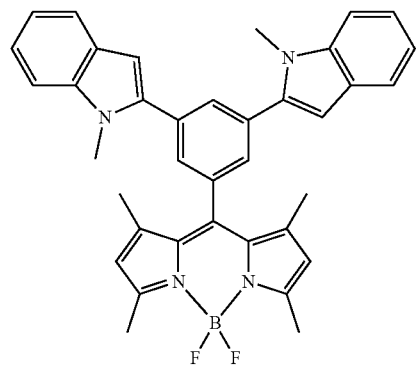
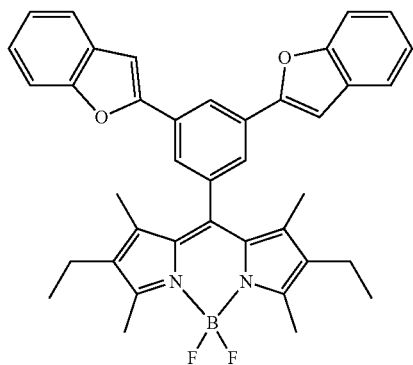
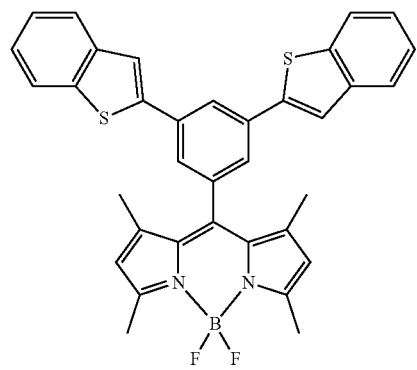
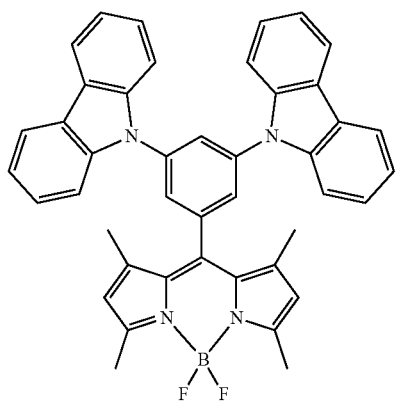

55
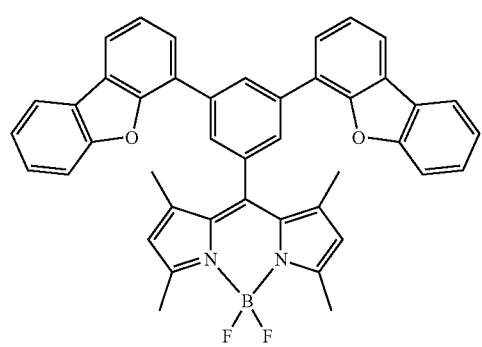
56
-continued
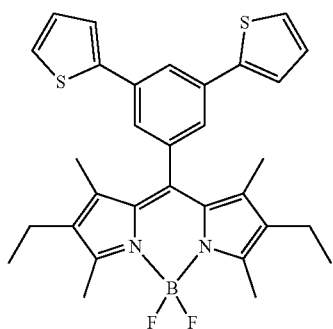
[Chem. 15]
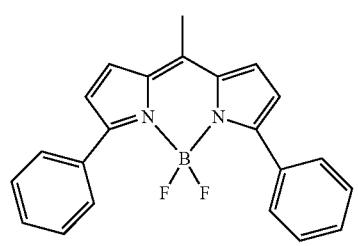
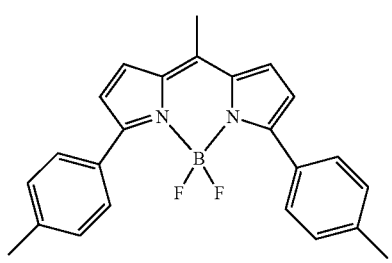
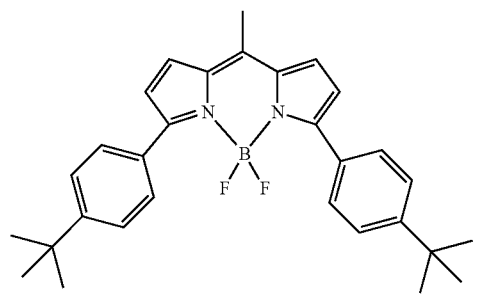
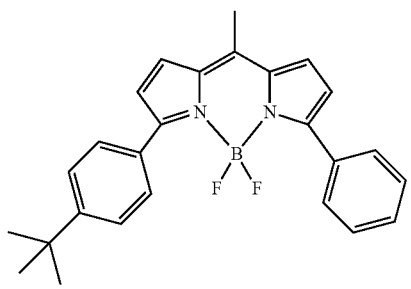
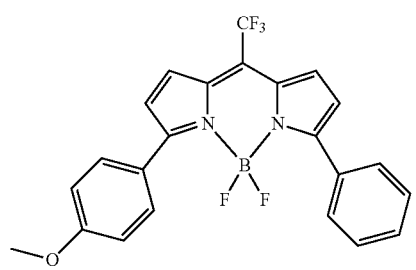
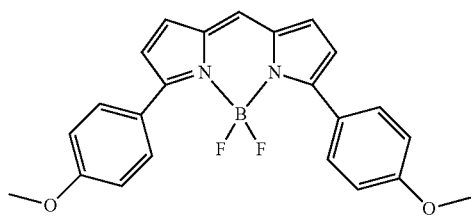
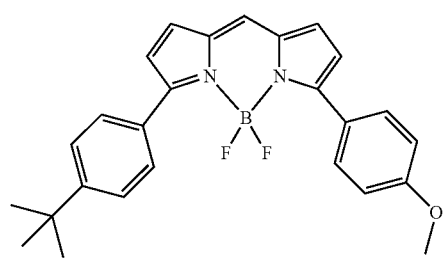
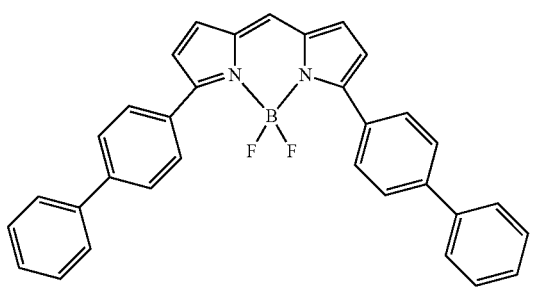

-continued
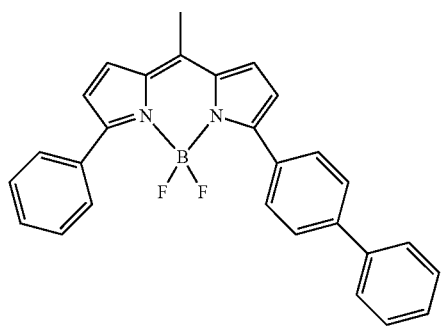
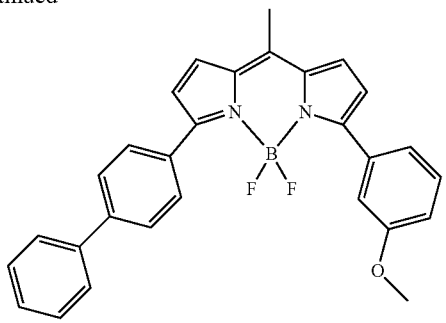
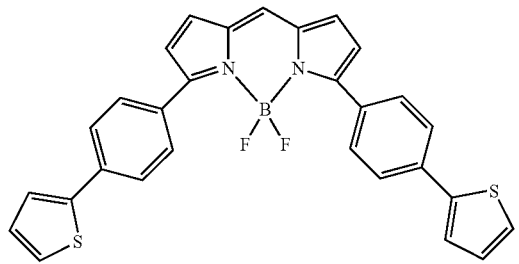
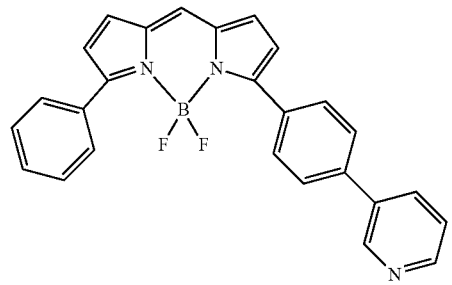
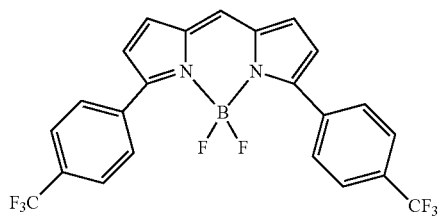
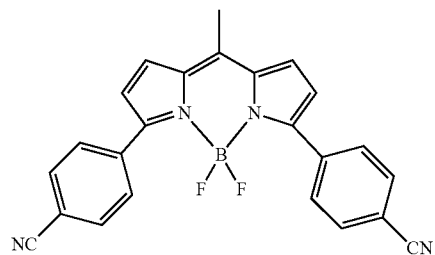
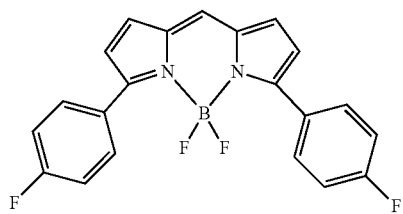
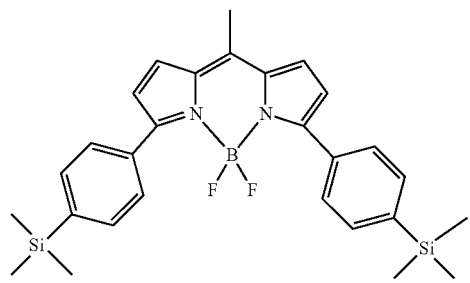
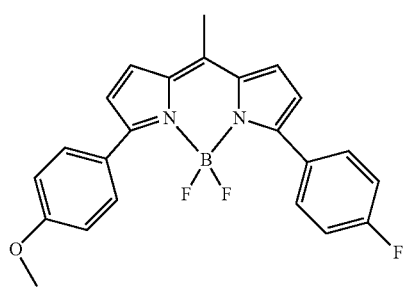
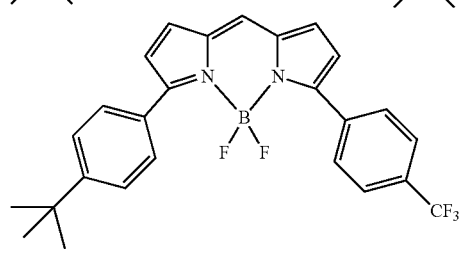

[Chem. 16]
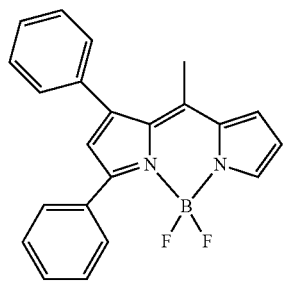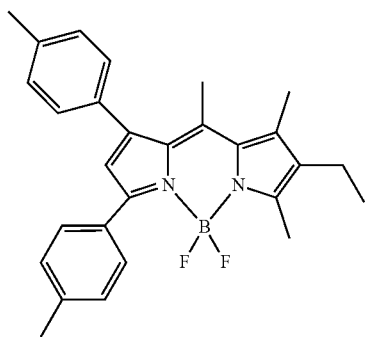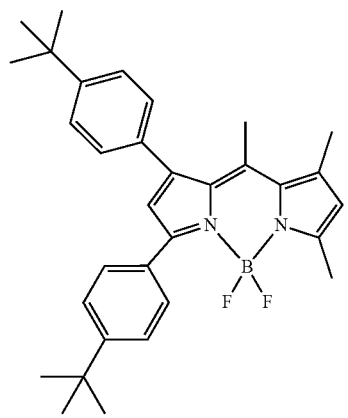
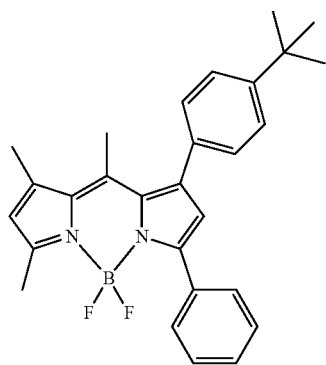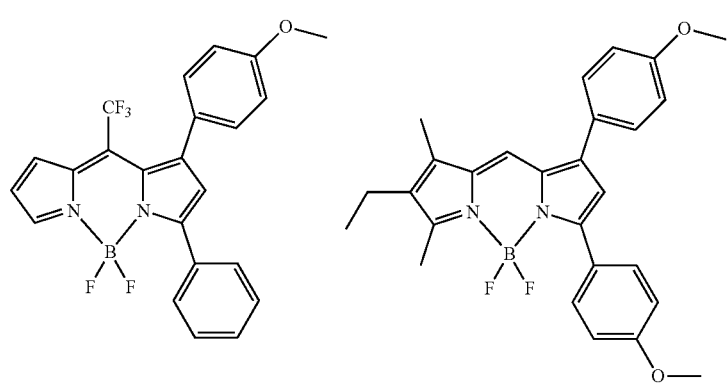
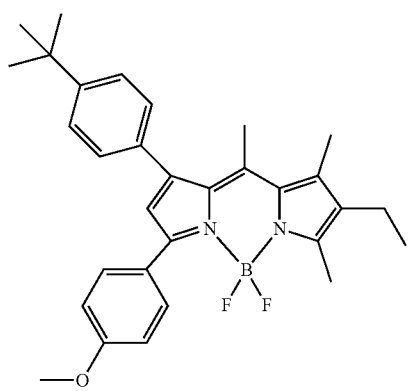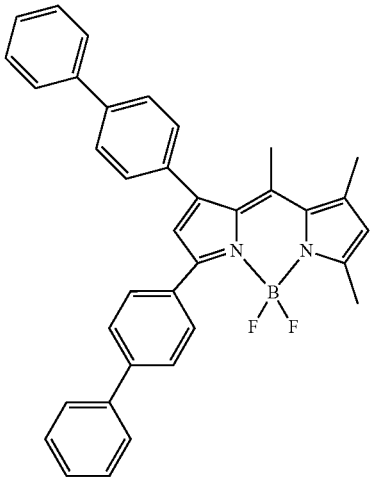

61
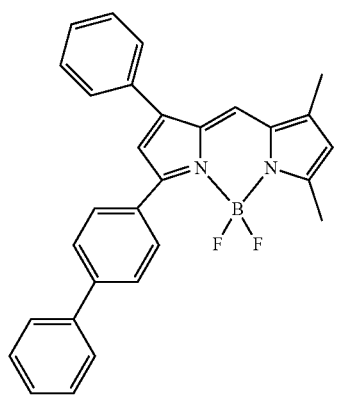
62
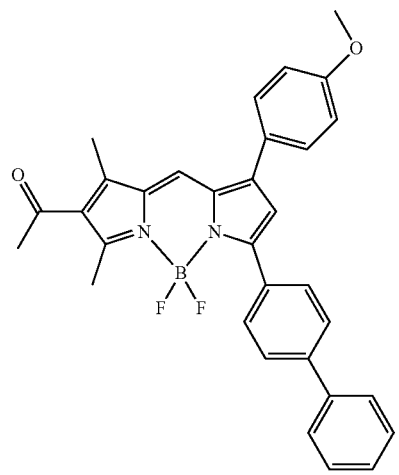
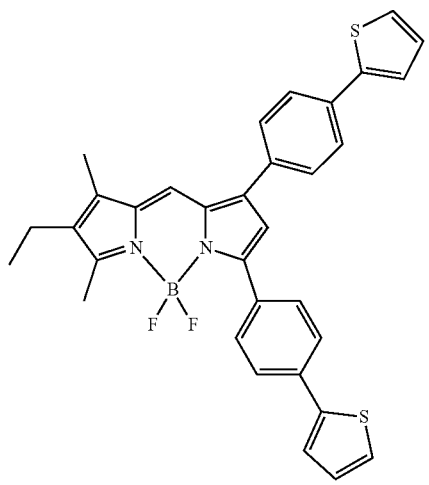
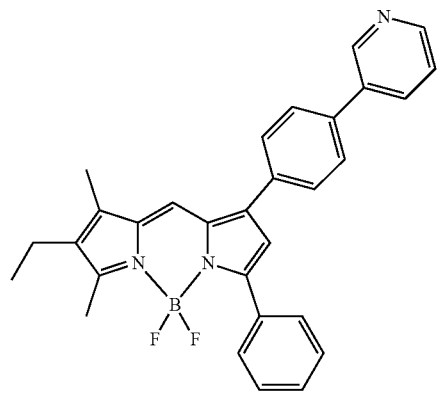
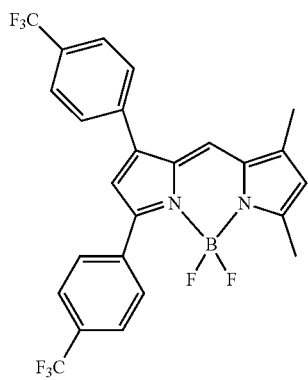
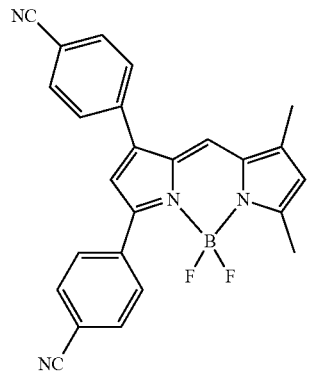
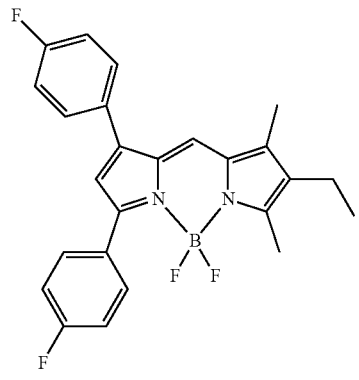

-continued
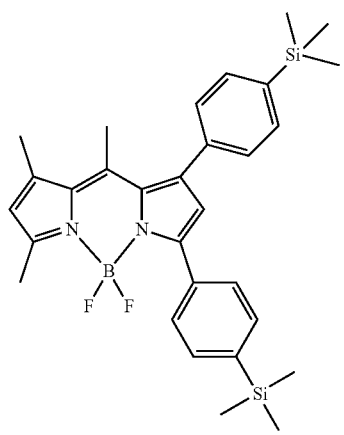
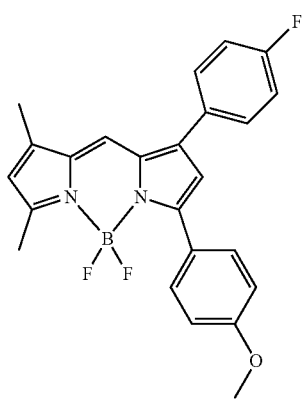
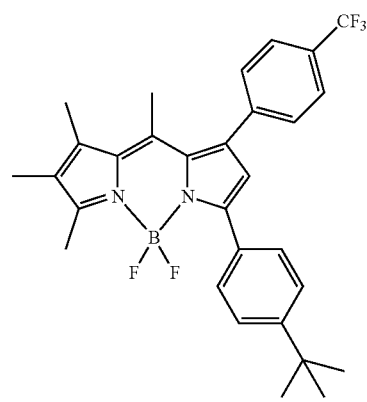
[Chem. 17]
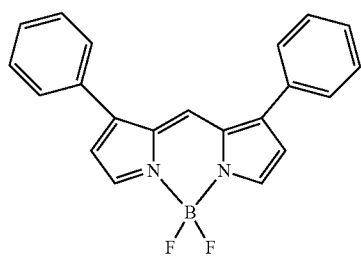
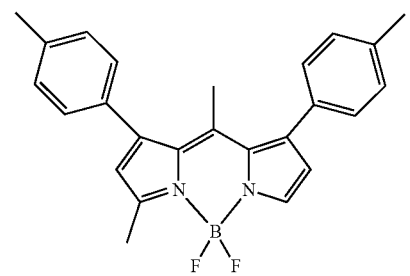
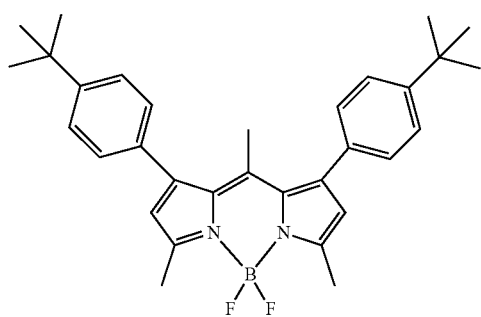
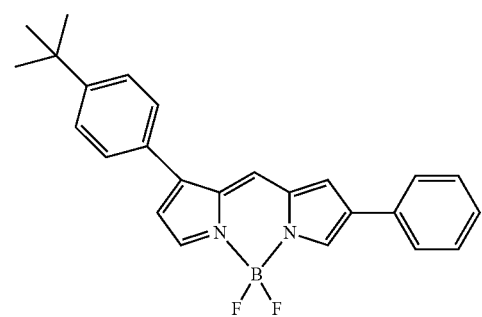
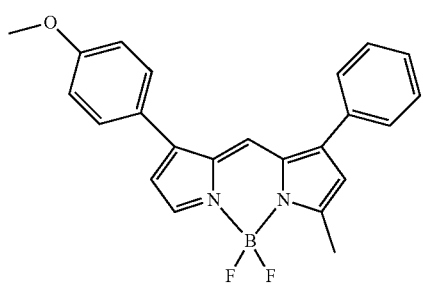
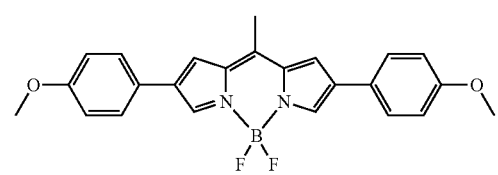
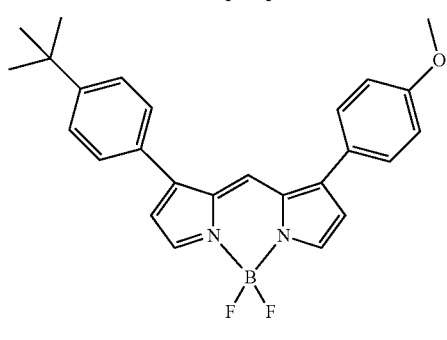
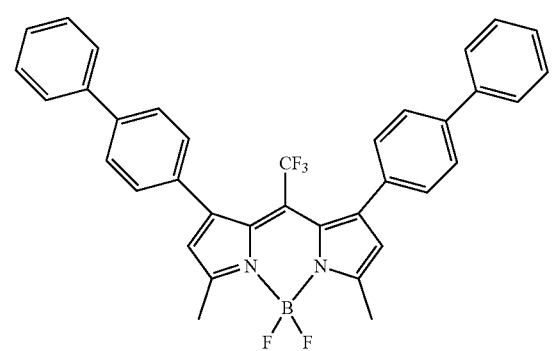

-continued
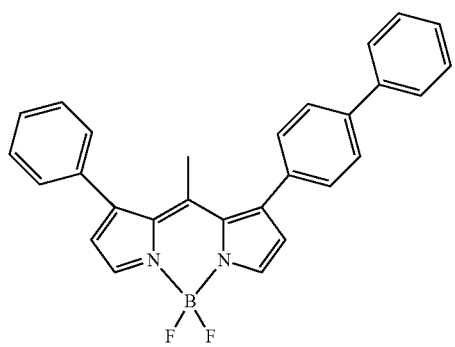
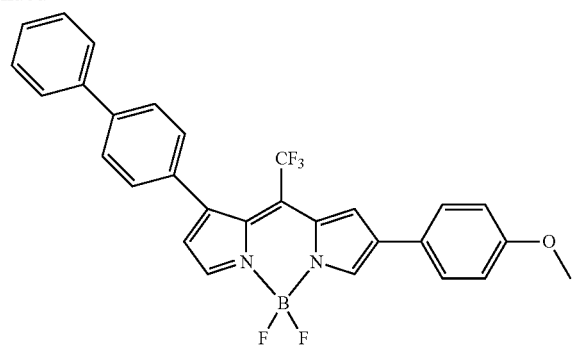
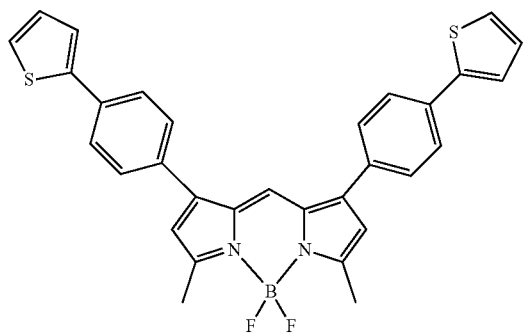
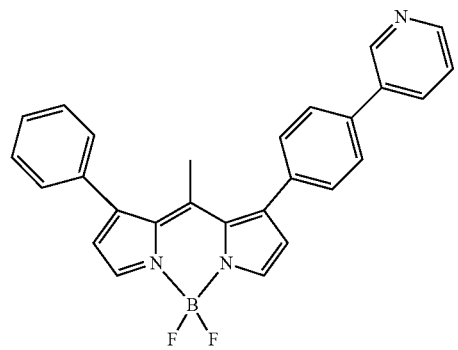
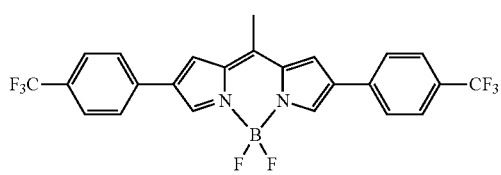
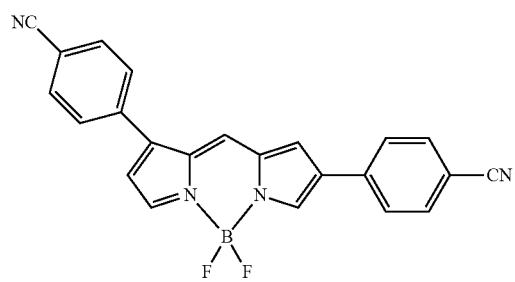
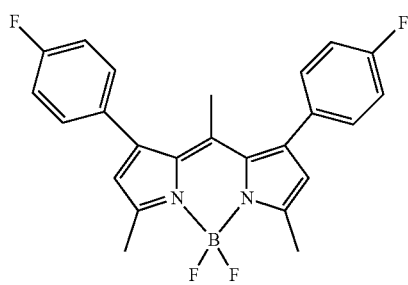
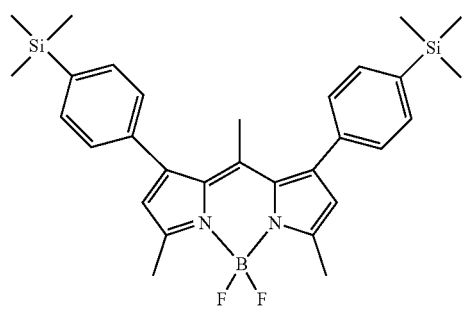
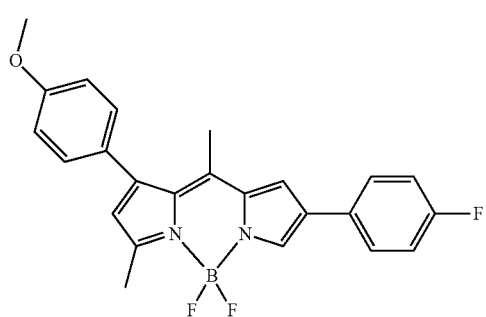
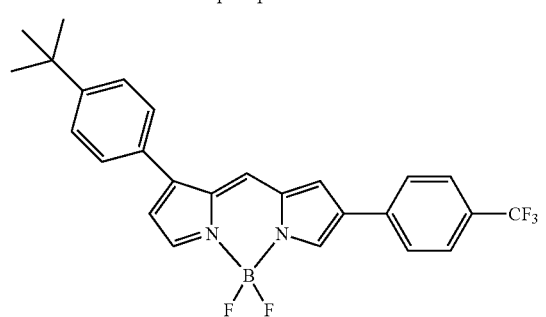

[Chem. 18]
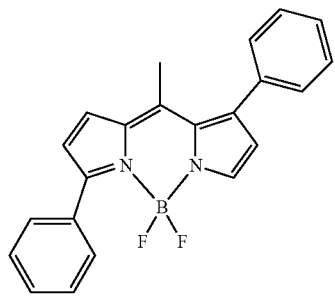
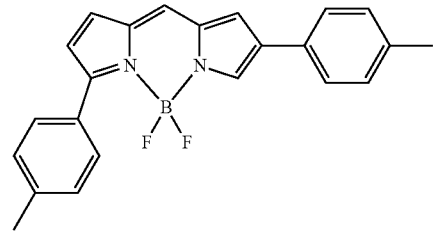
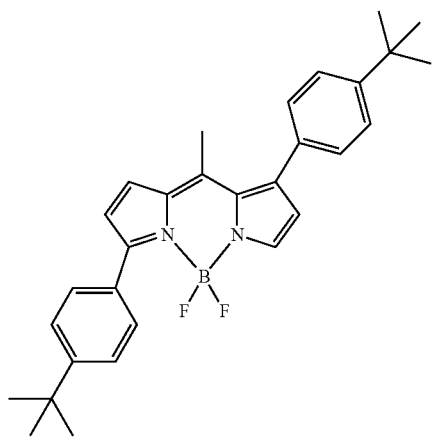
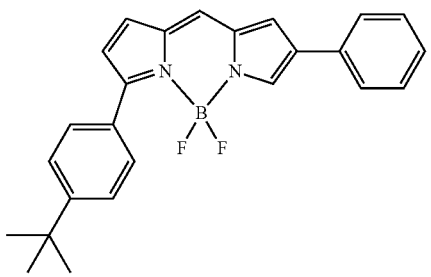
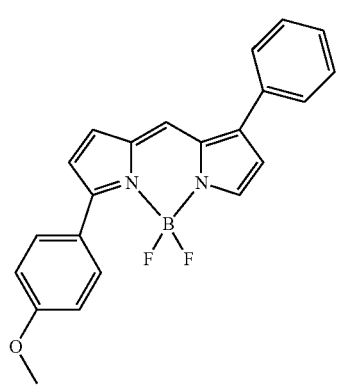
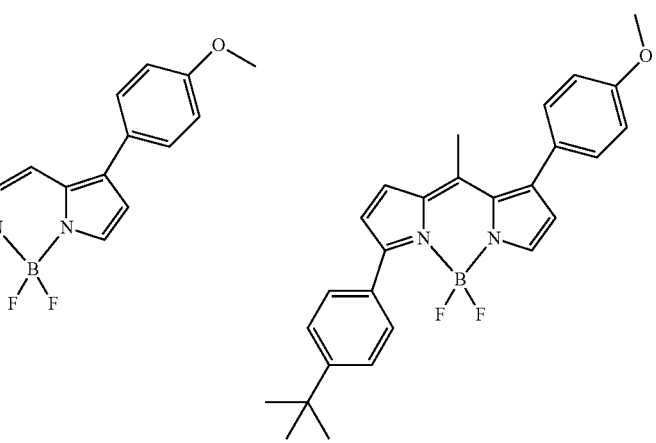
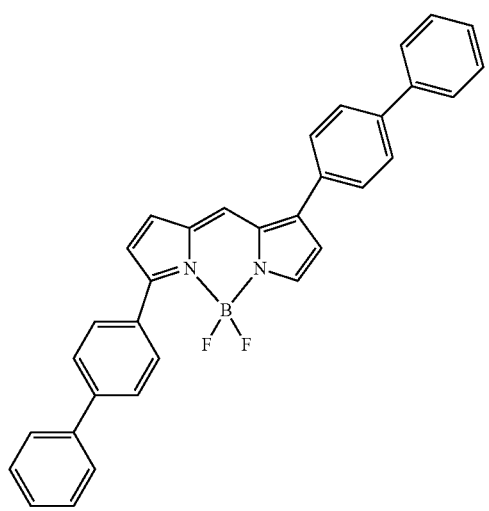
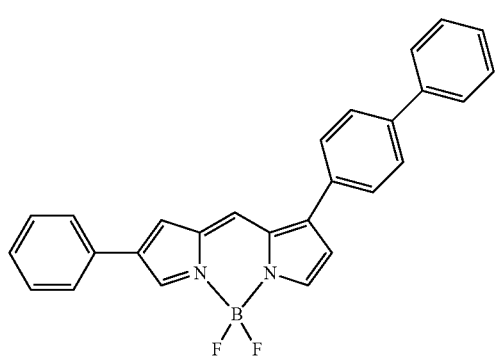

-continued
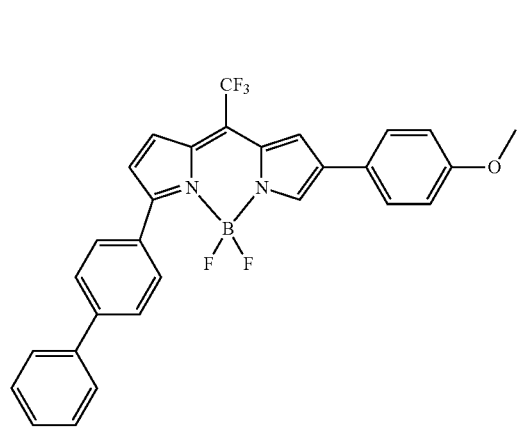
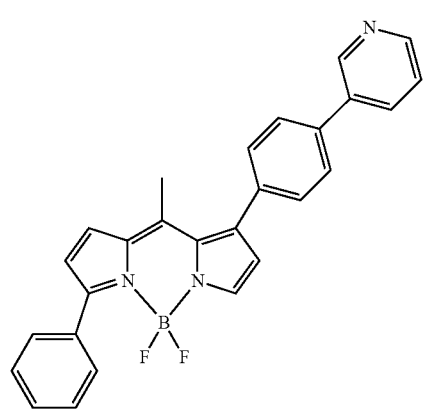
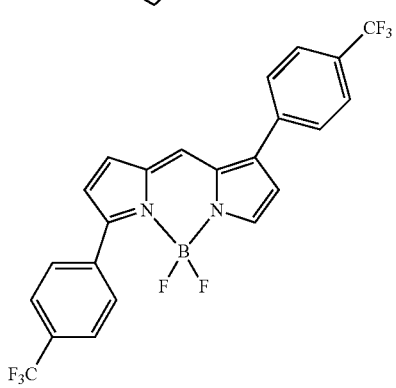
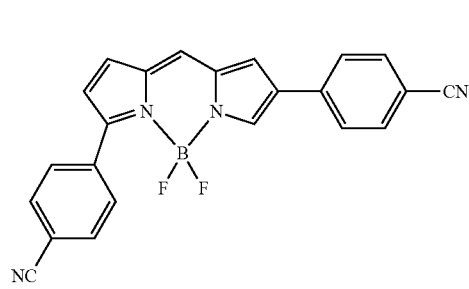
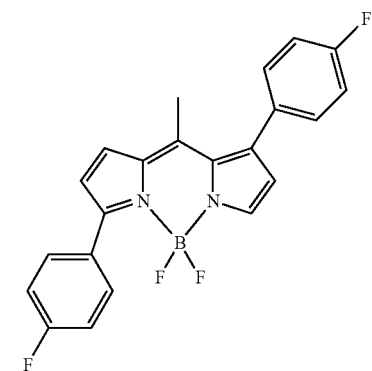
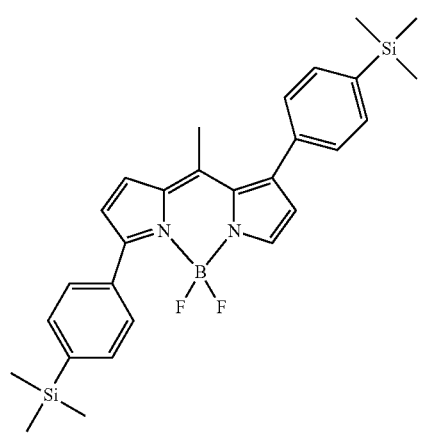
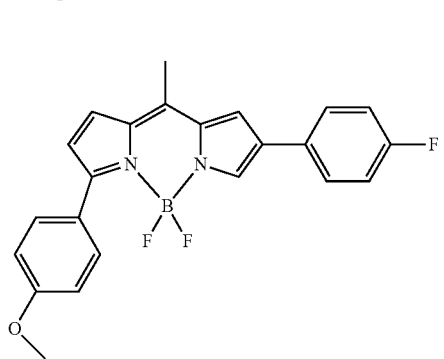

-continued
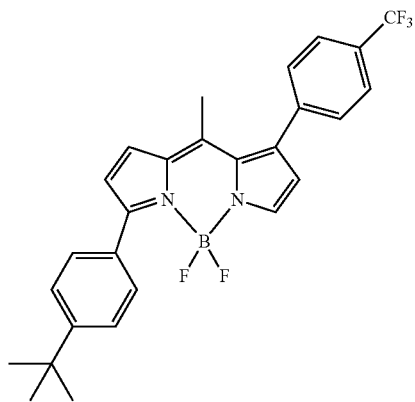
[Chem. 19]
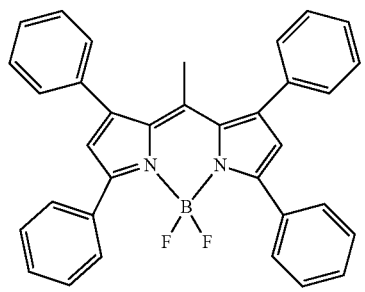
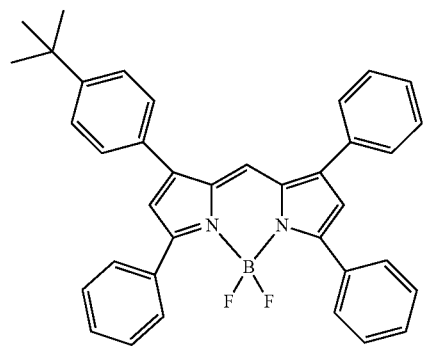
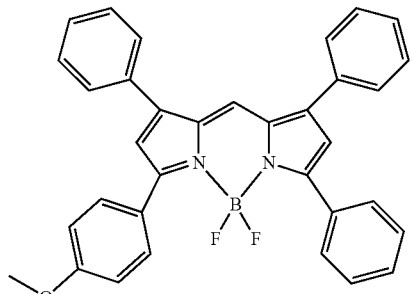
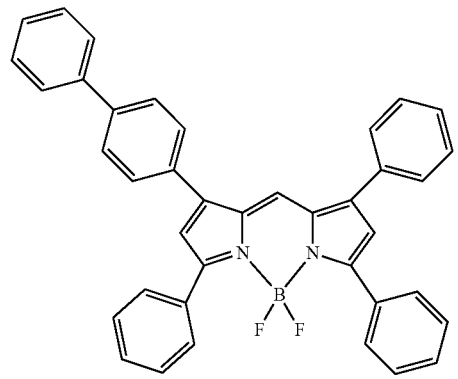
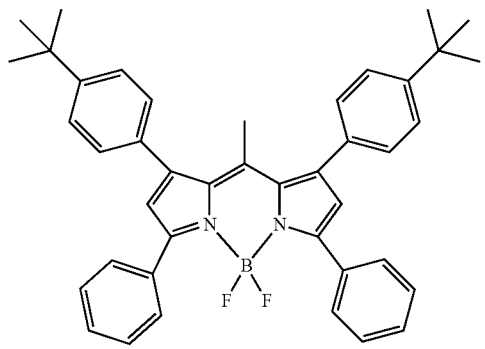
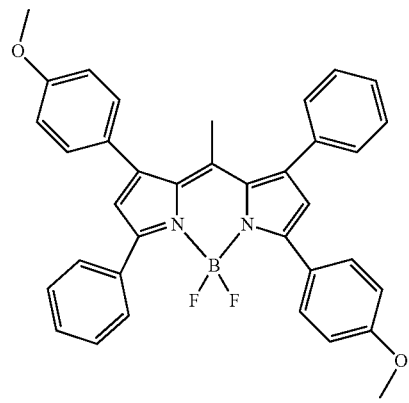

73
74
-continued
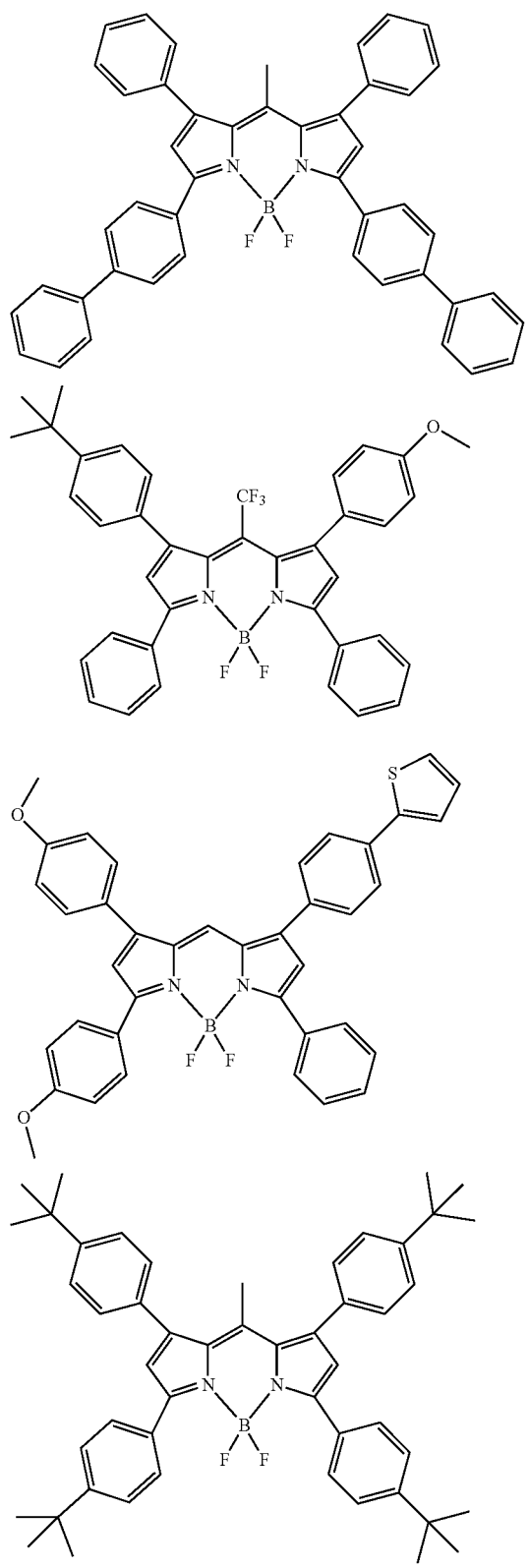
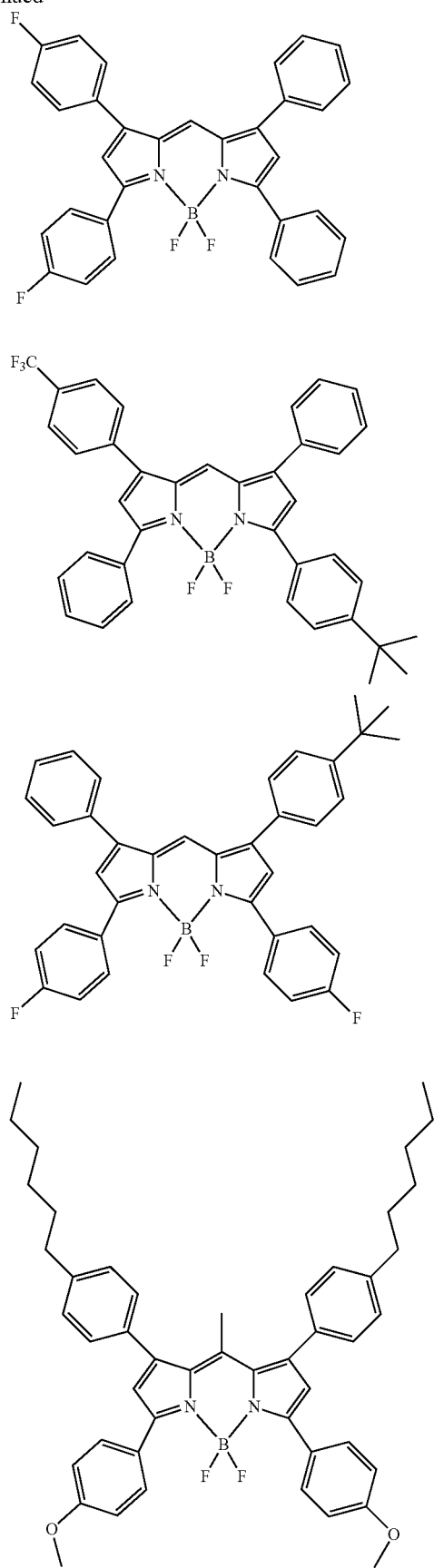

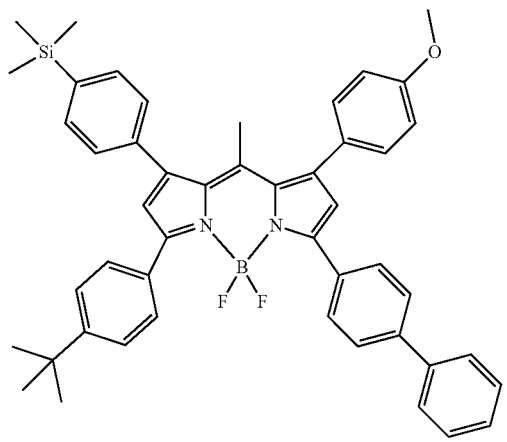
[Chem. 20]
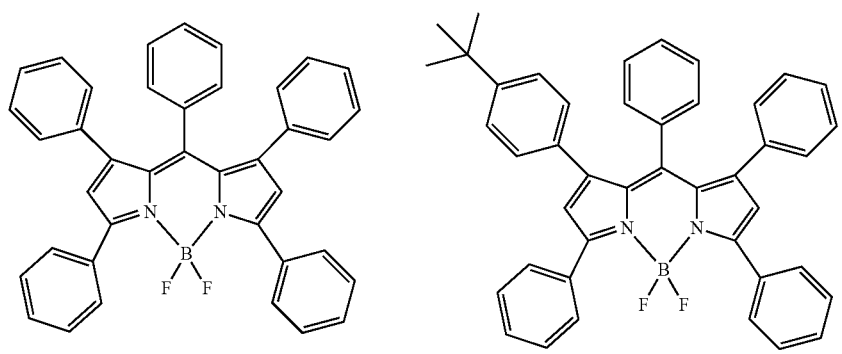
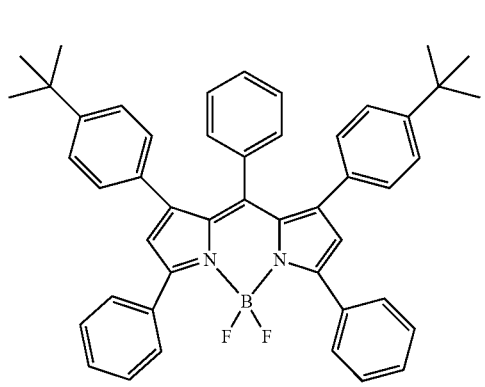
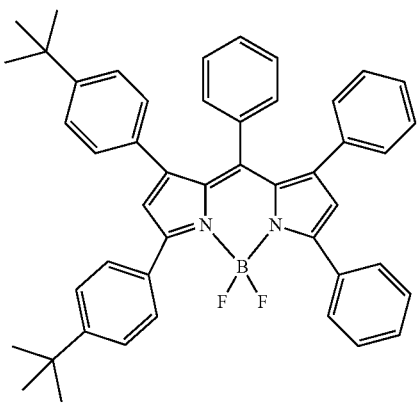
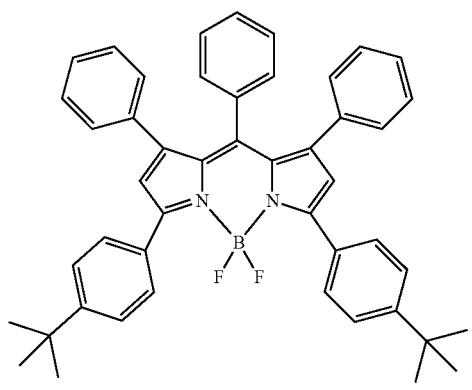
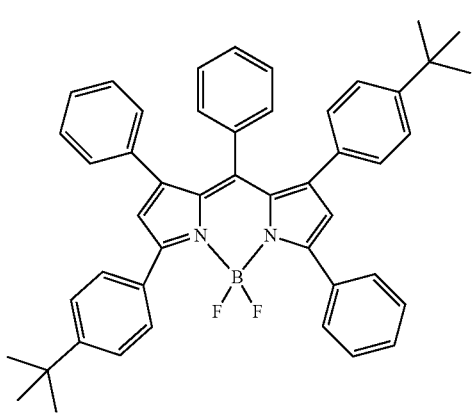

-continued
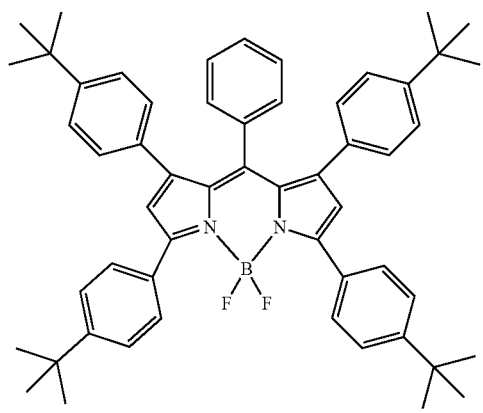
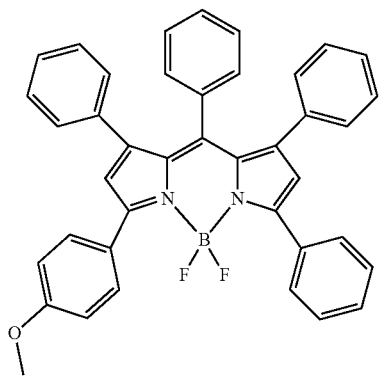
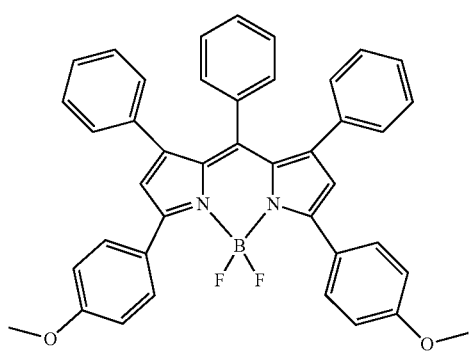
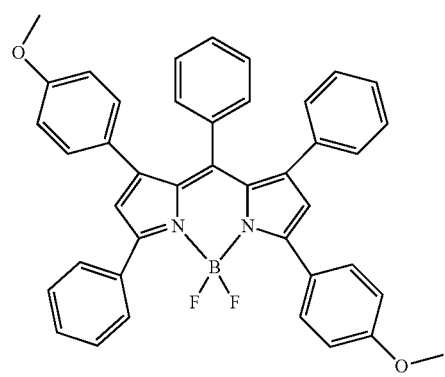
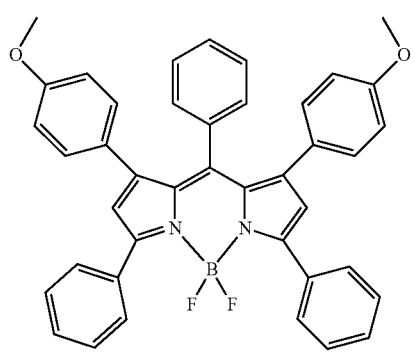
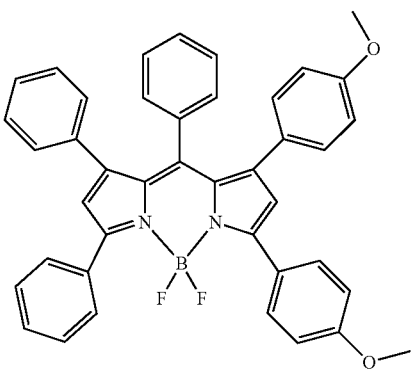
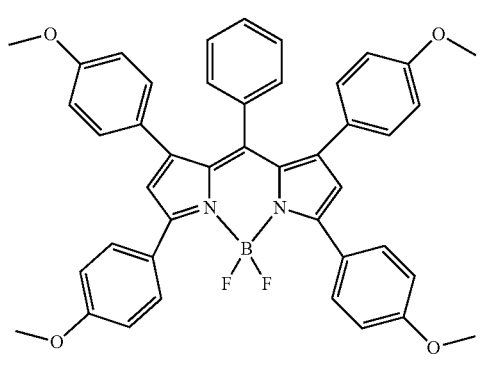
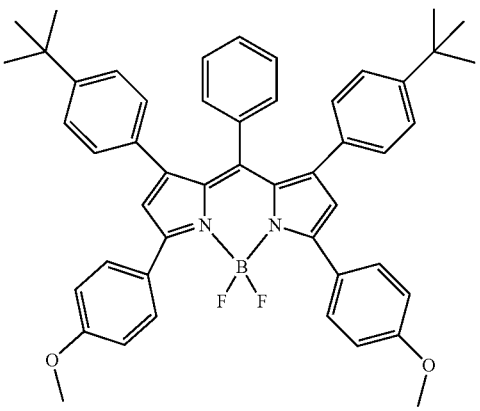

-continued
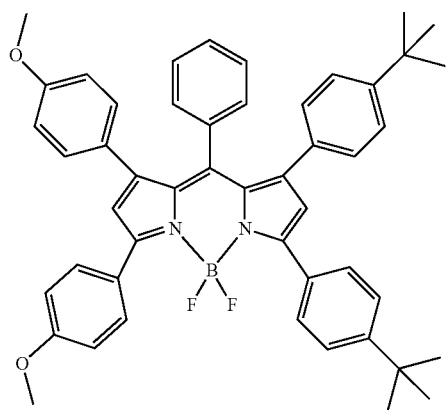
[Chem. 21]
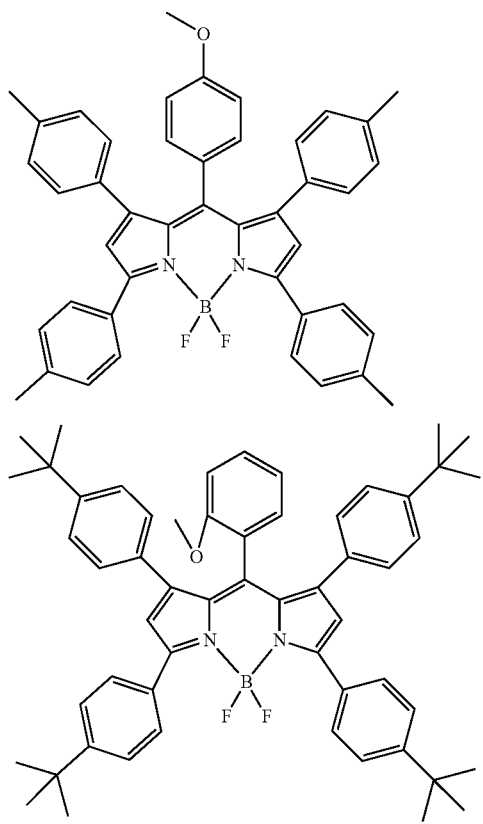
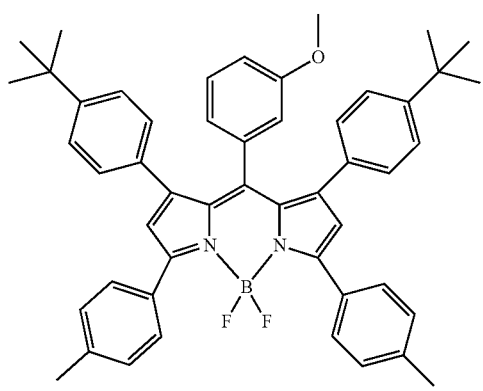
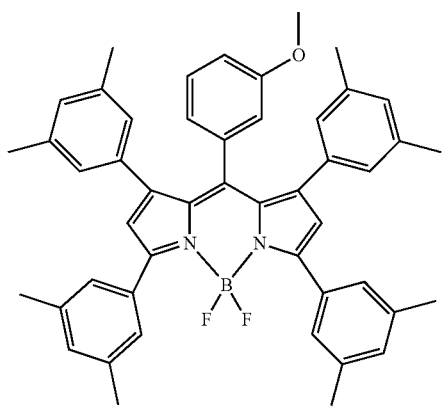
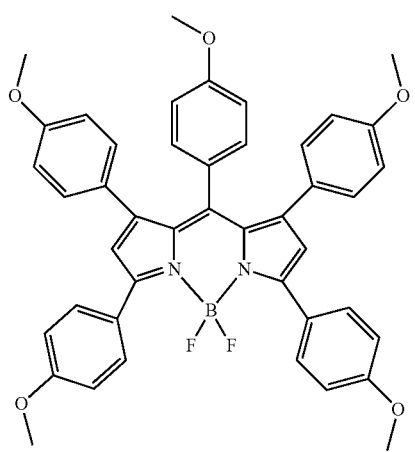
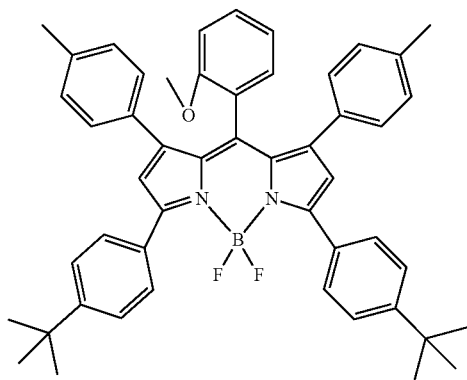

81 82
-continued
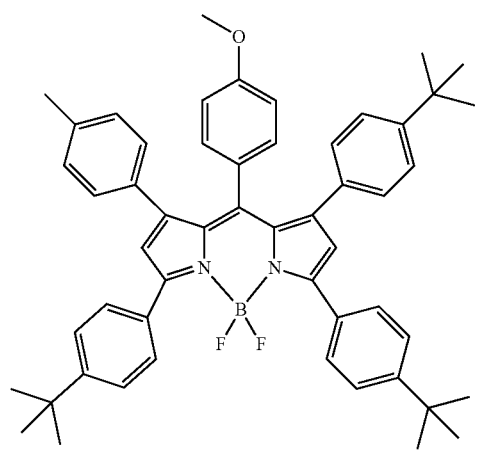
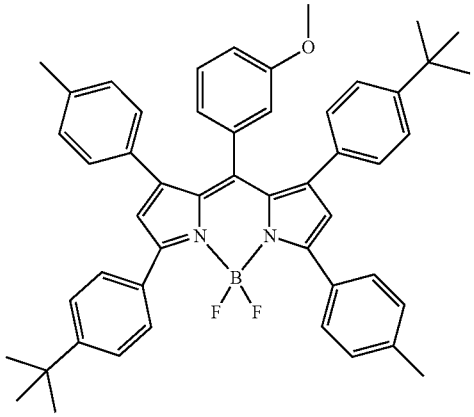
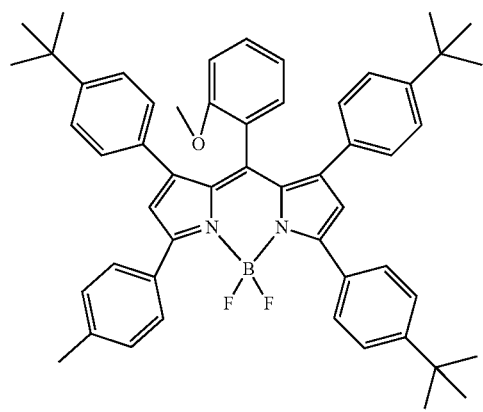
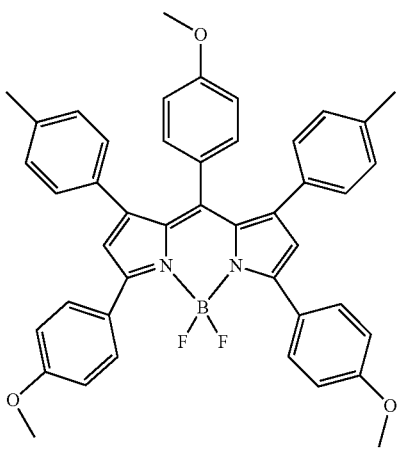
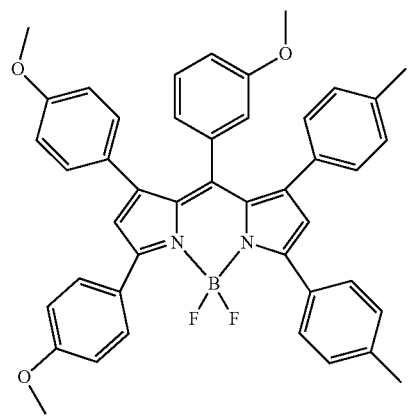
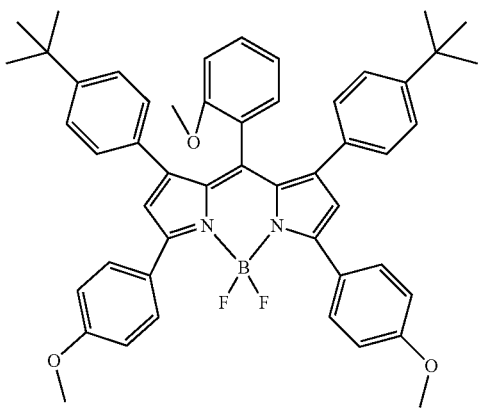

83
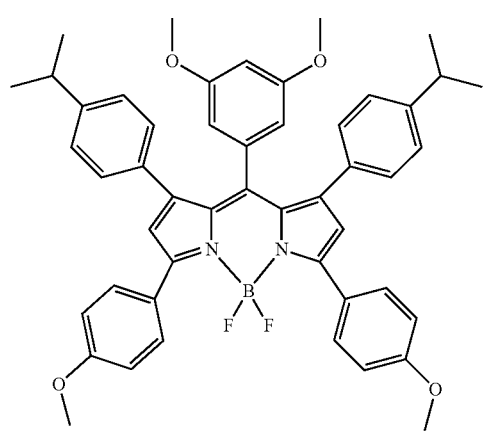
84
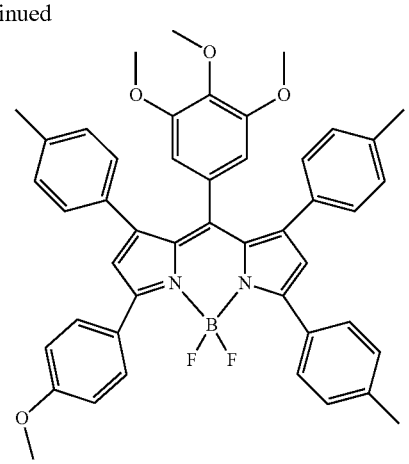
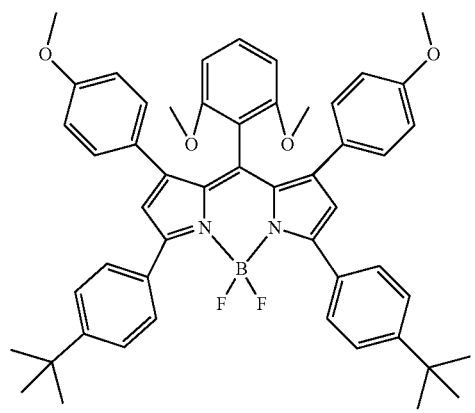
[Chem. 22]
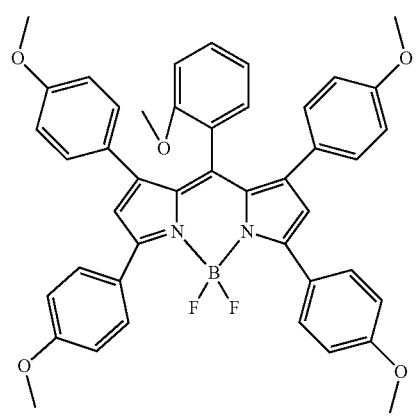
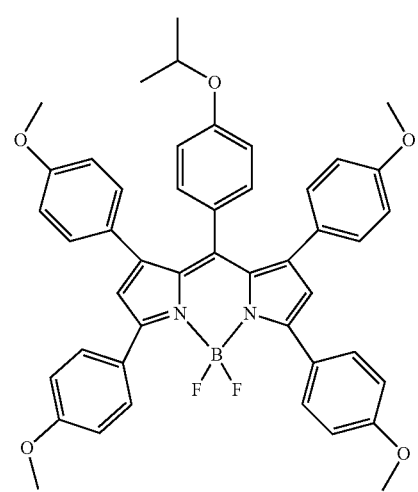

85
86
-continued
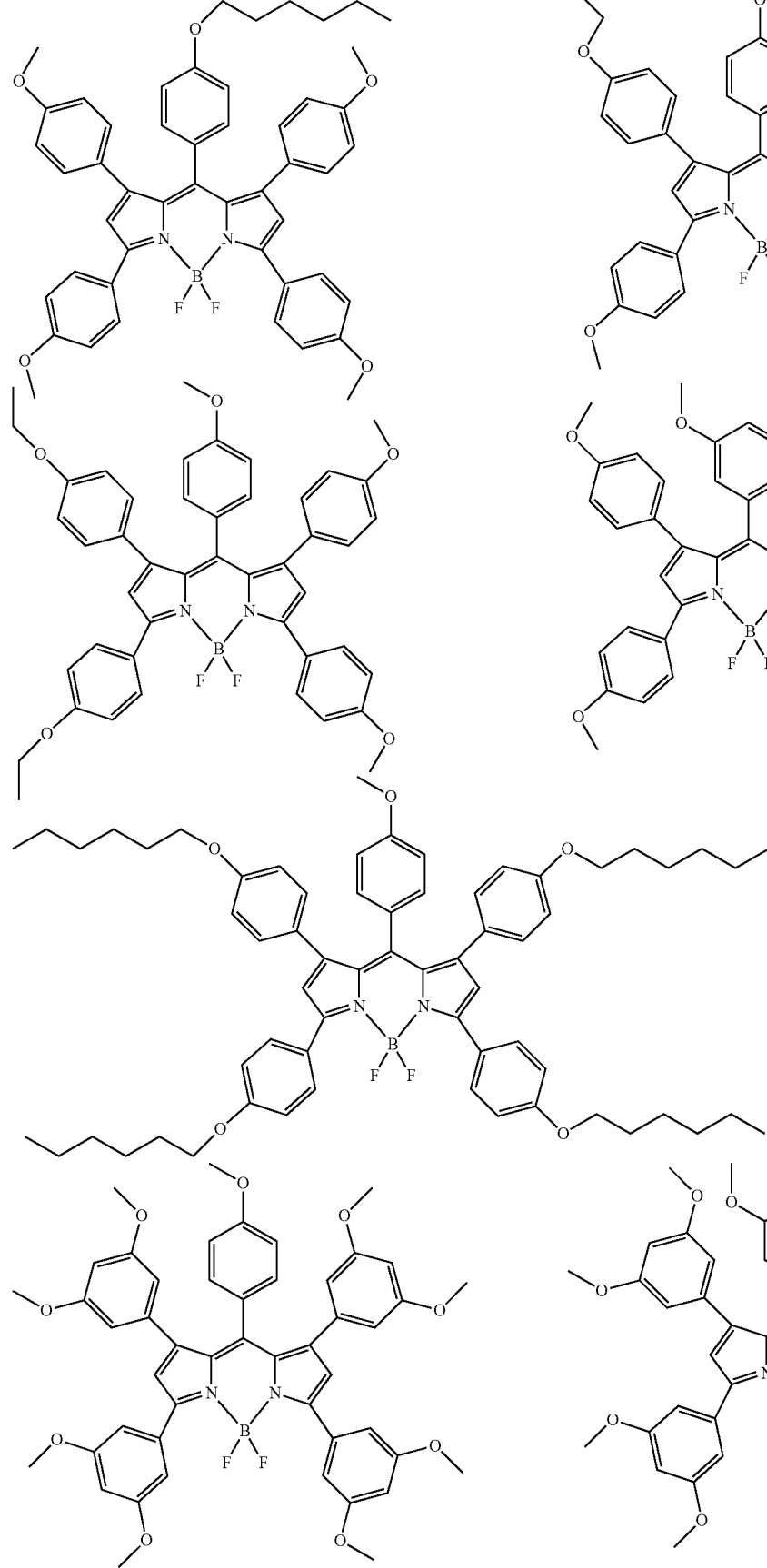
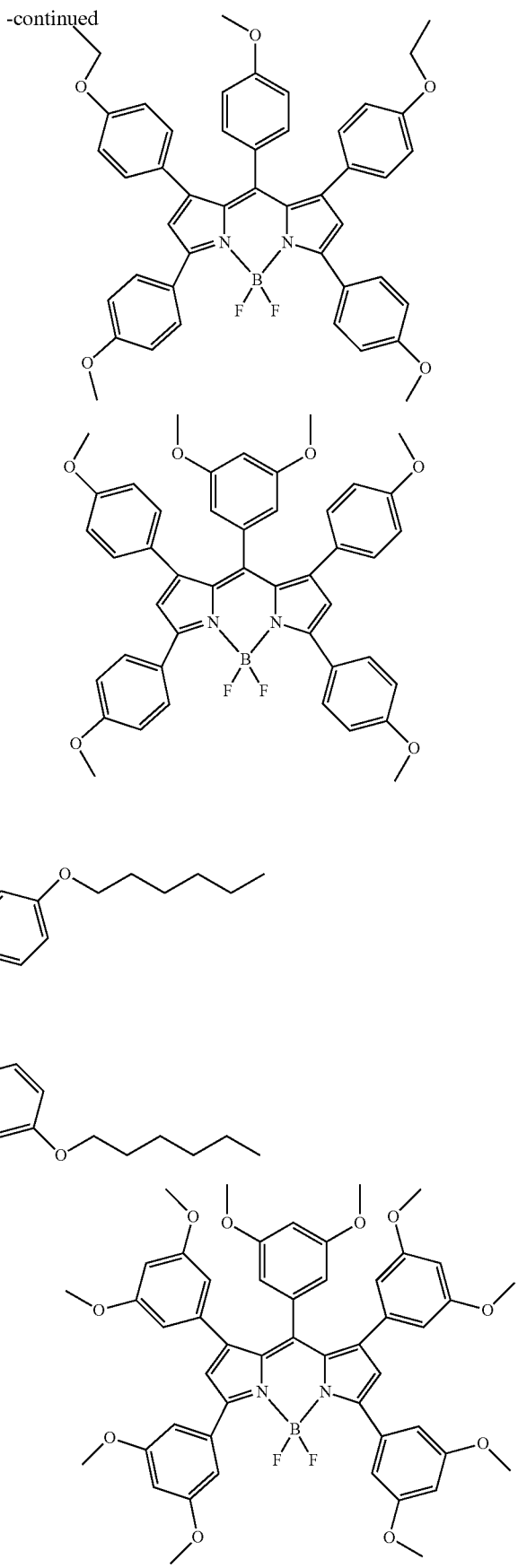

87
88
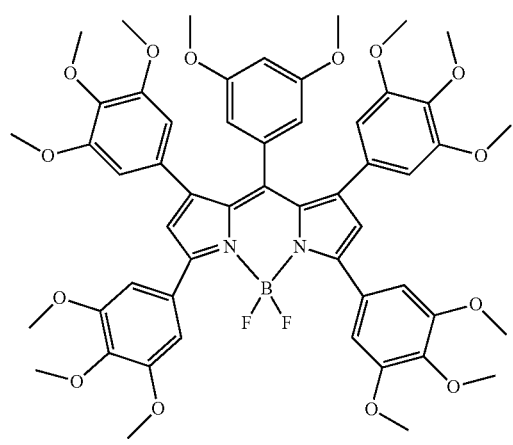
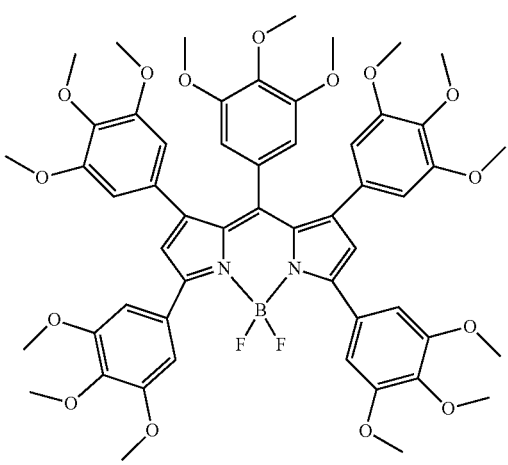
[Chem. 23]
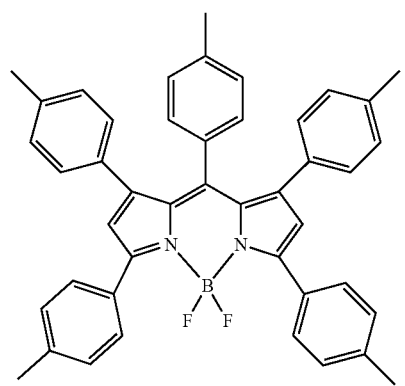
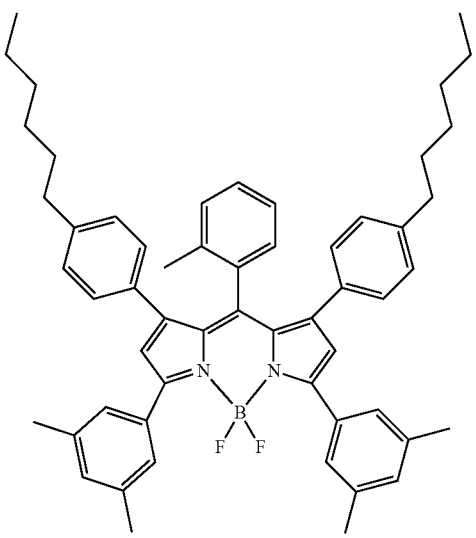
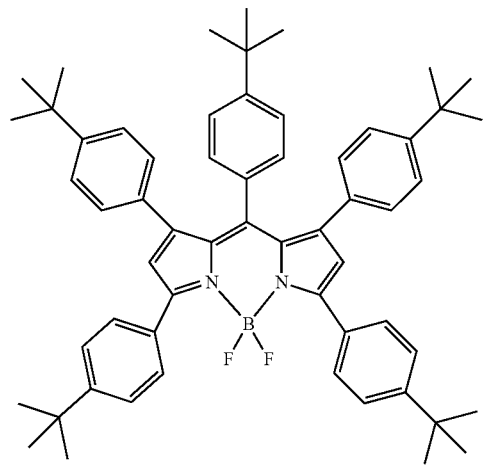
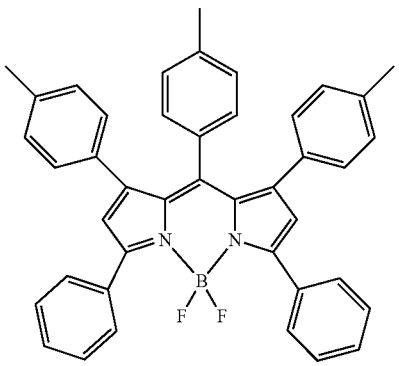

-continued
89
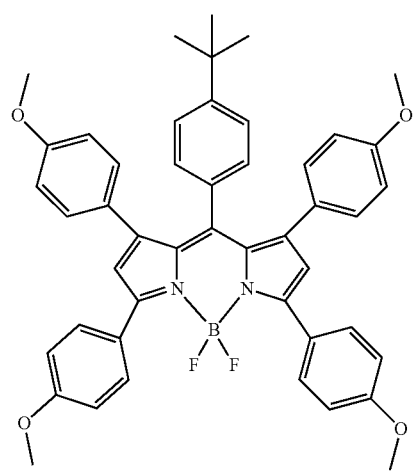
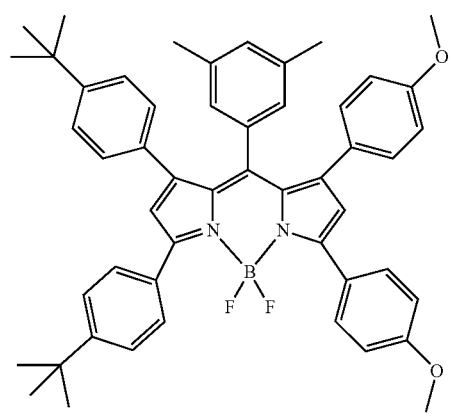
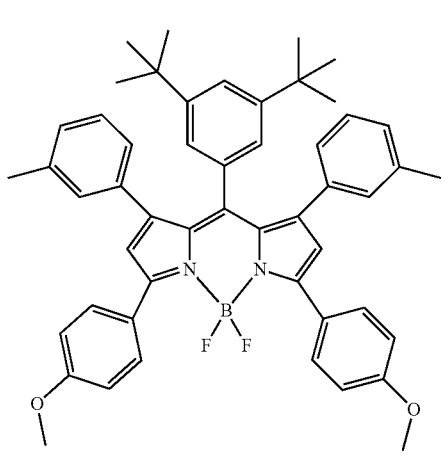
90
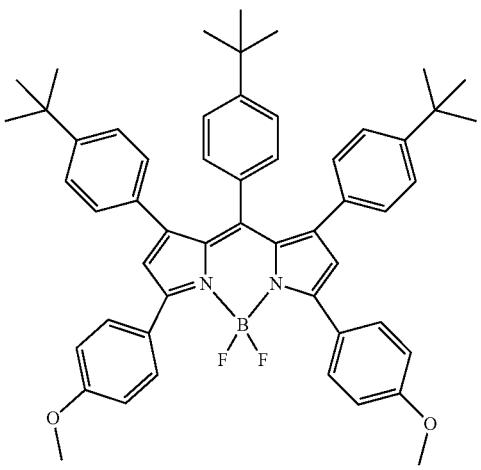
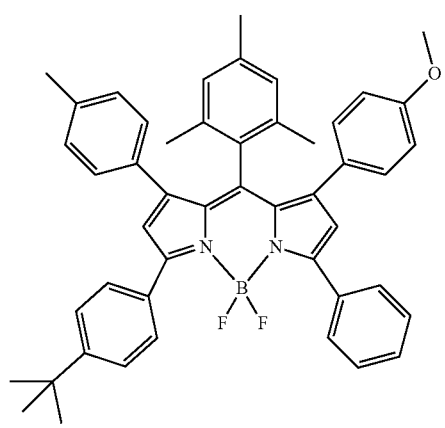
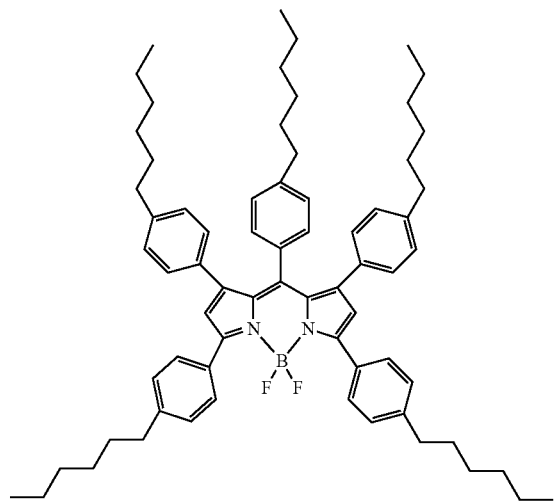

-continued
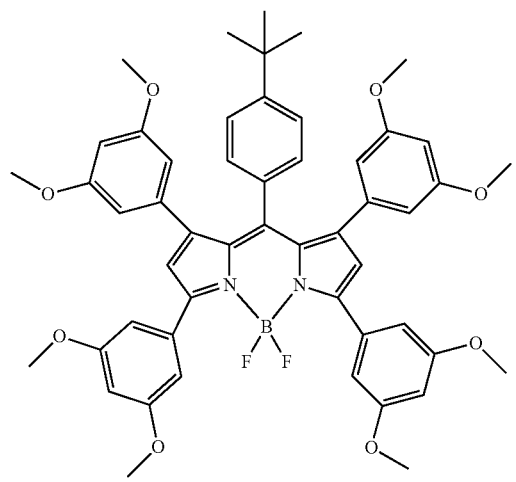
[Chem. 24]
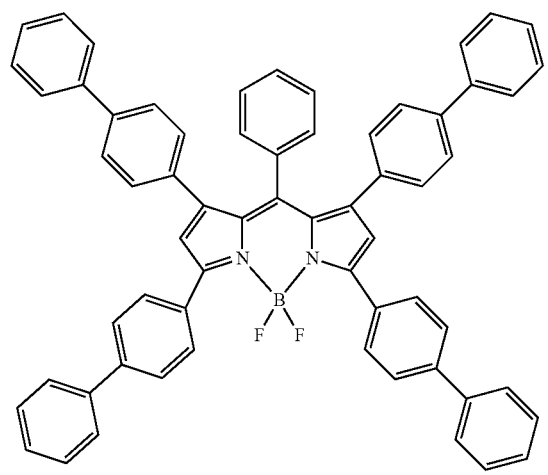
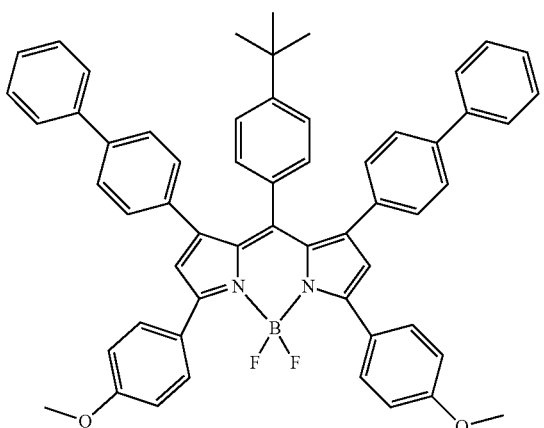
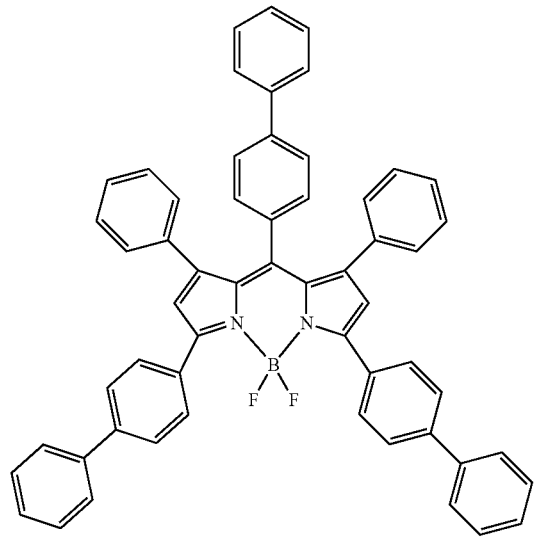
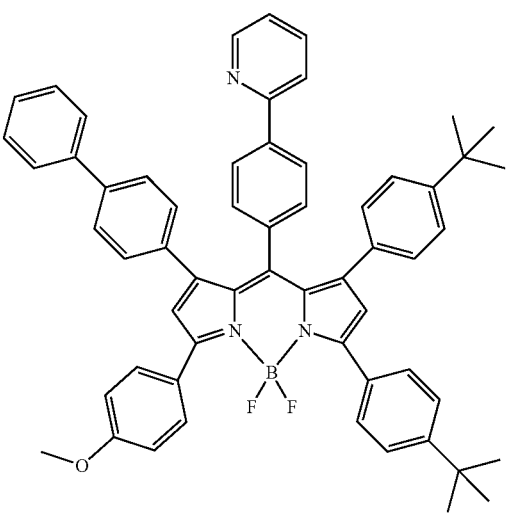

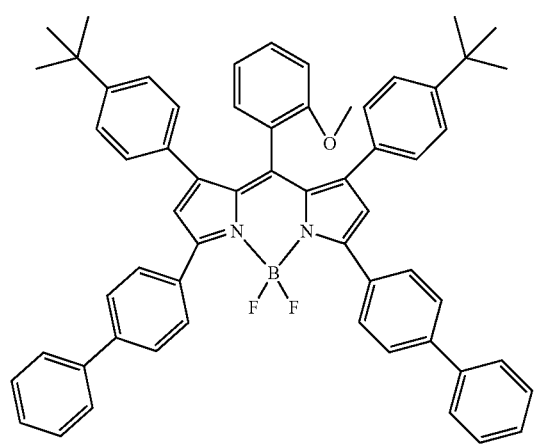
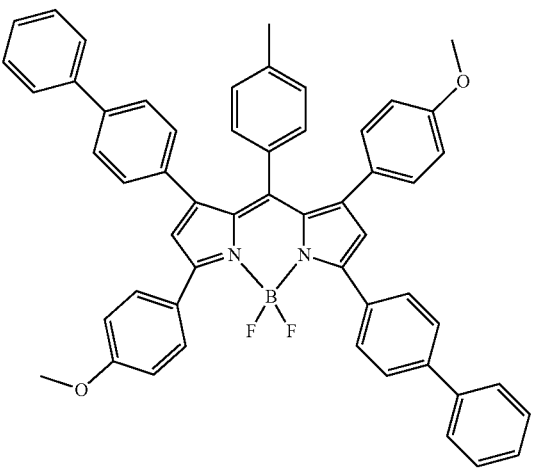
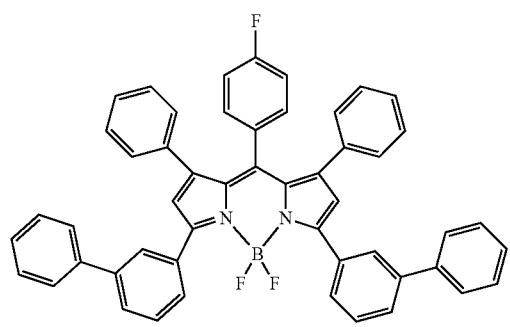
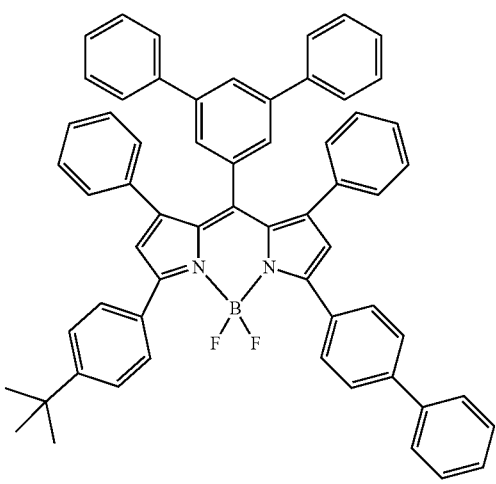
[Chem. 25]
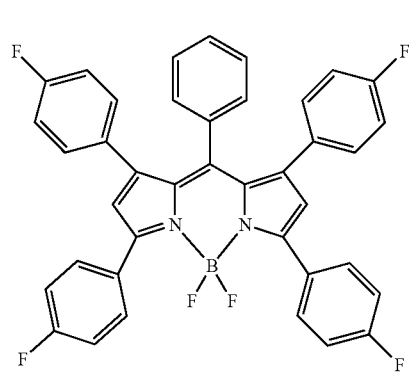
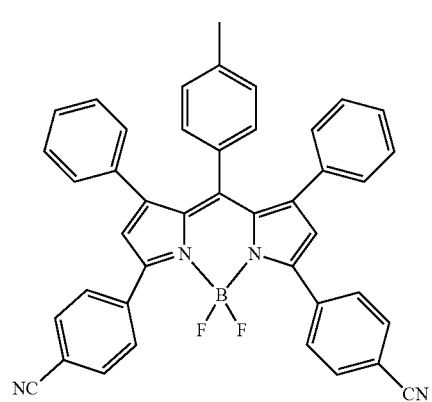

-continued
95
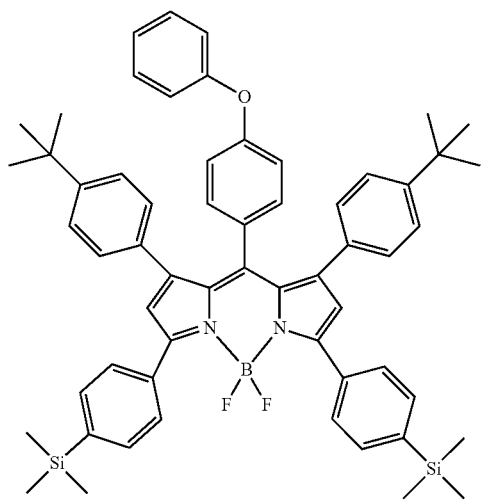
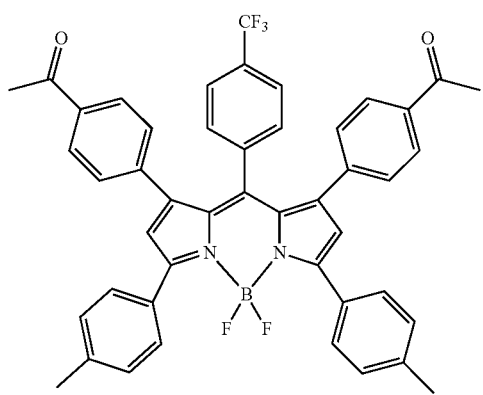
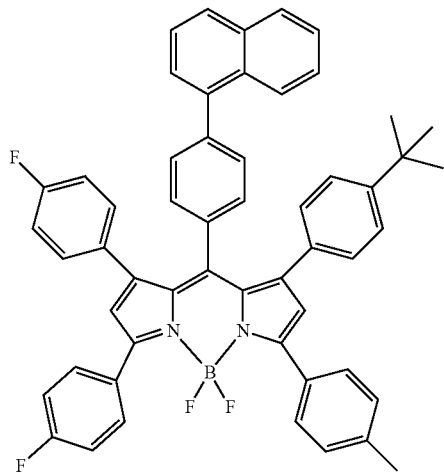
96
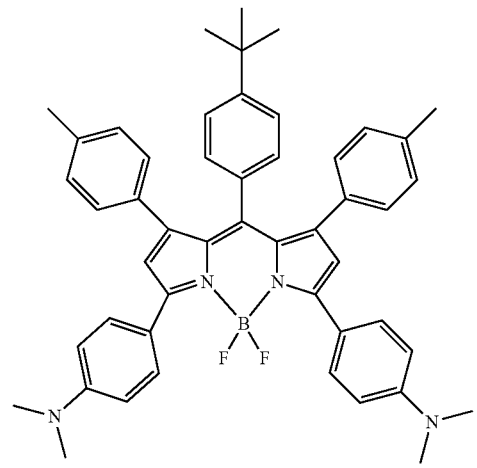
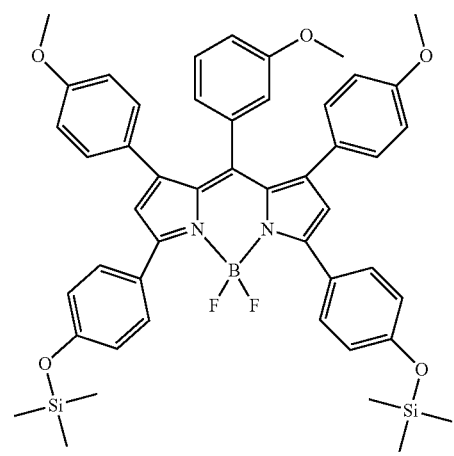
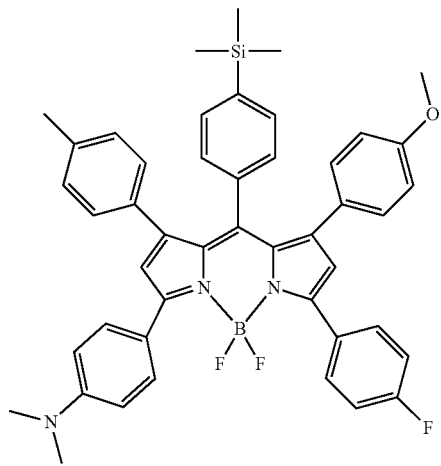

97
98
-continued
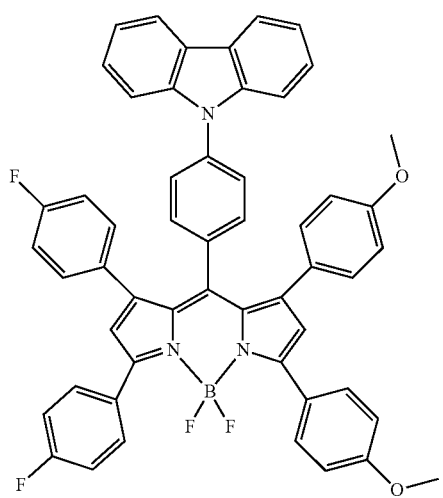
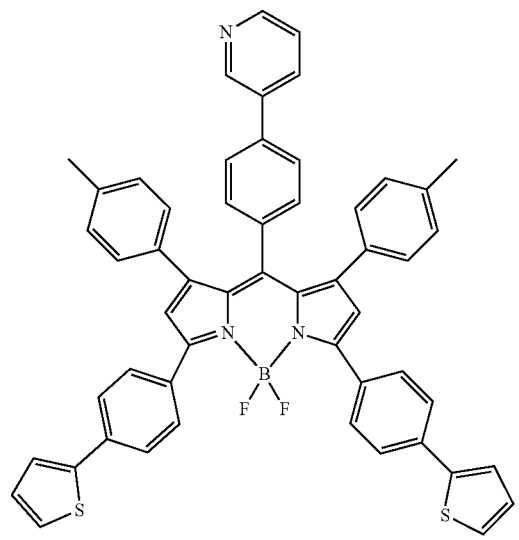
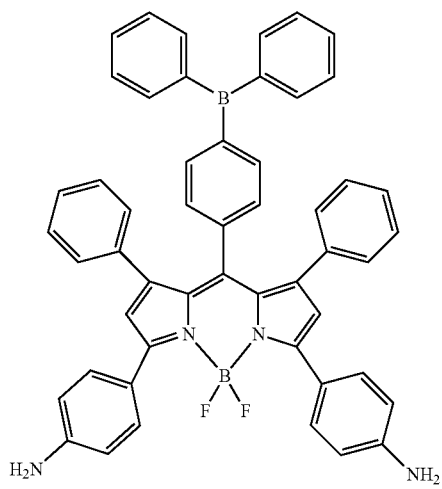
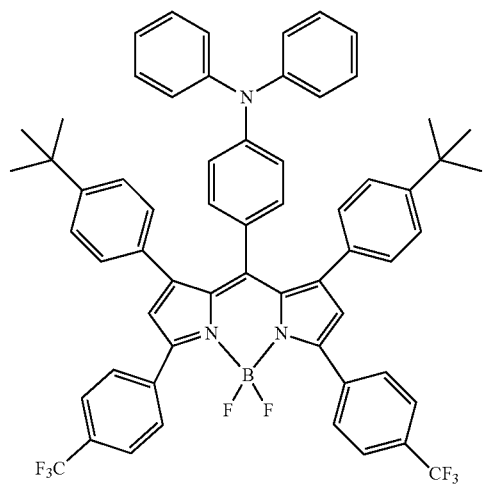
[Chem. 26]
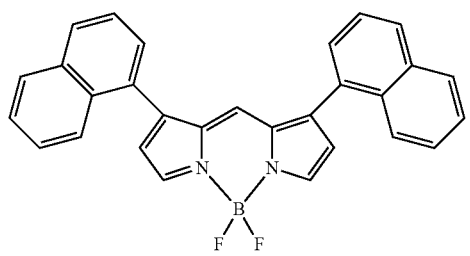
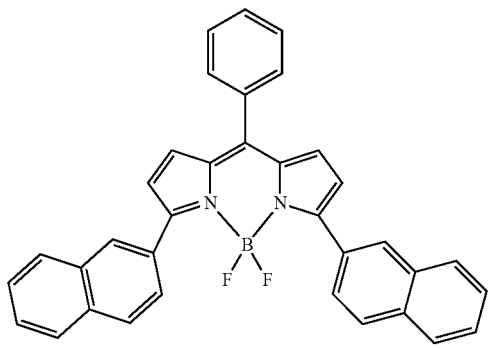

-continued
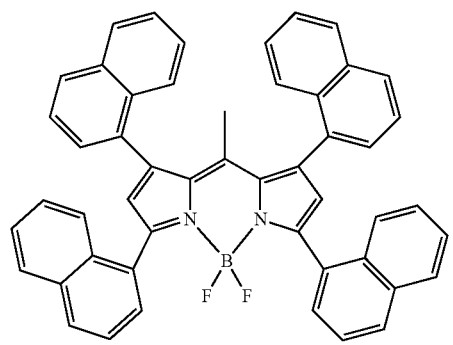
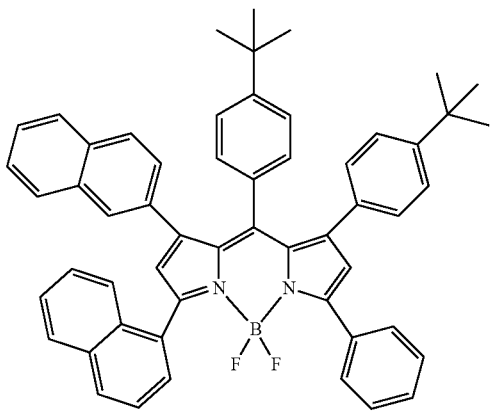
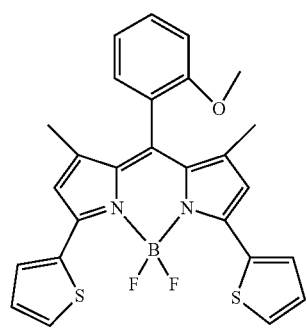
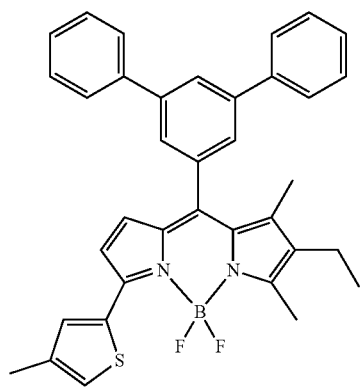
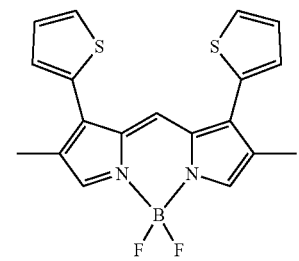
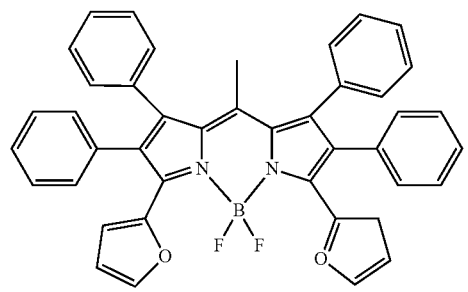
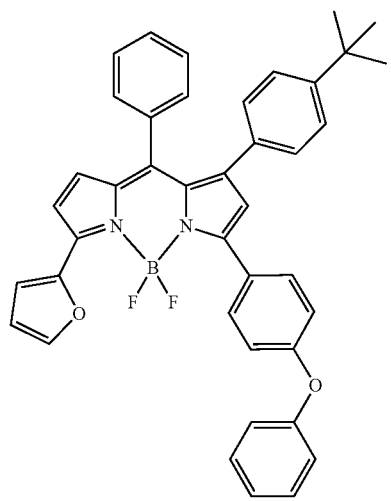

101
-continued
102
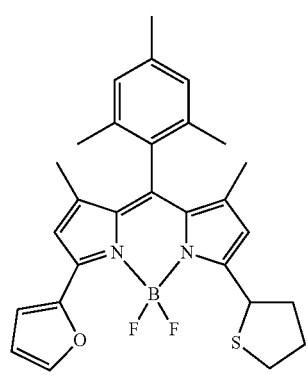
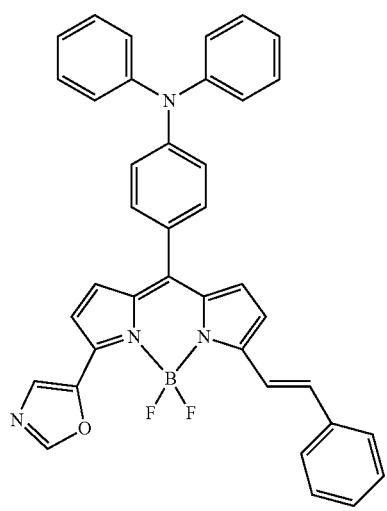
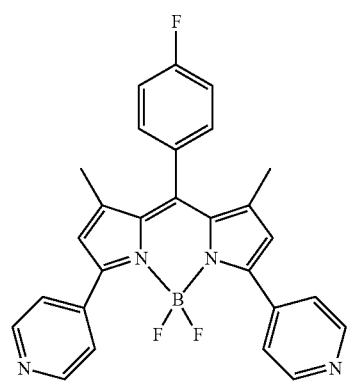
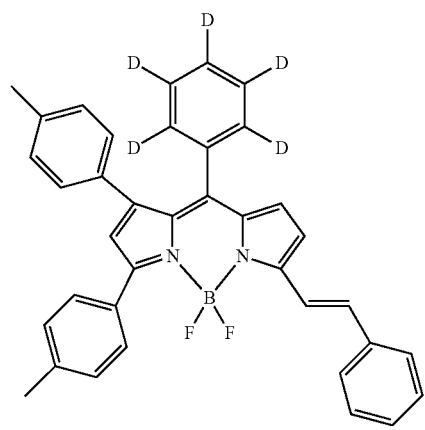
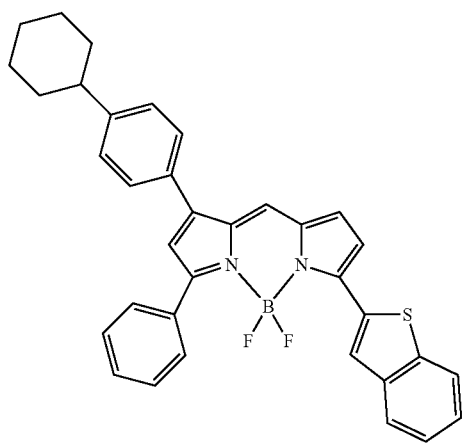
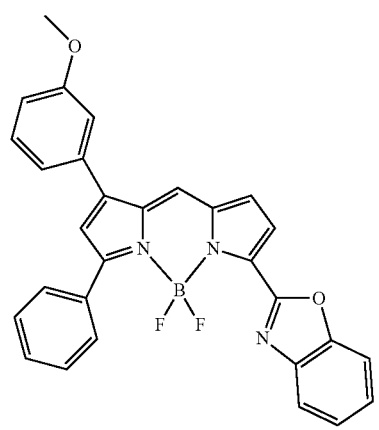

[Chem. 27]
-continued
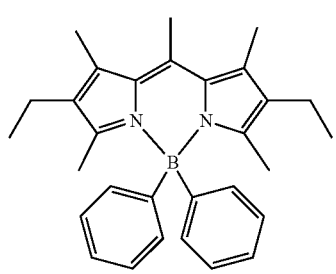
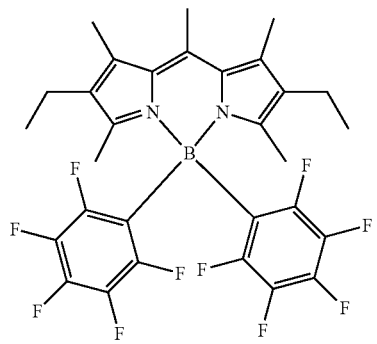
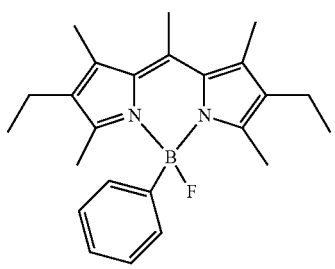
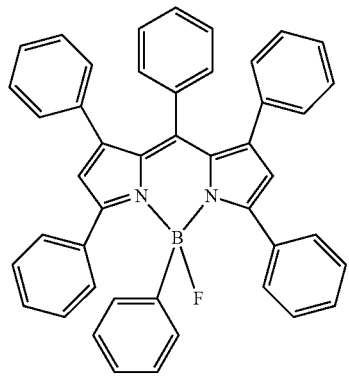
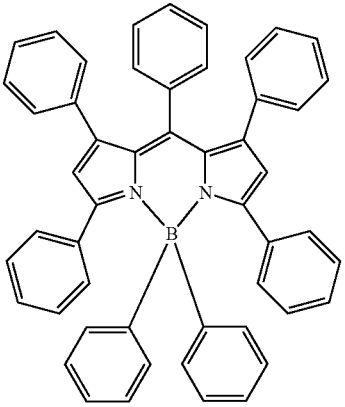
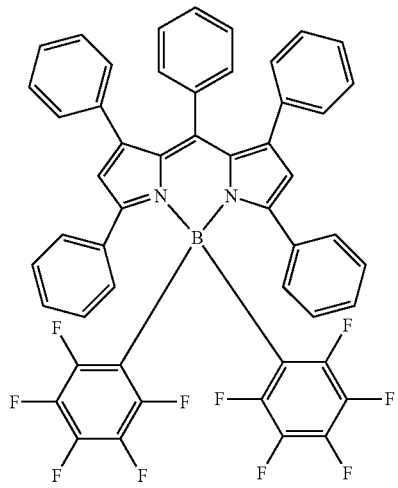
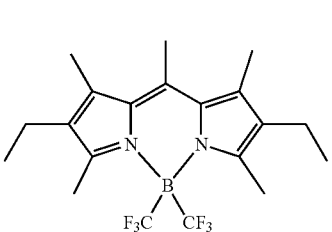
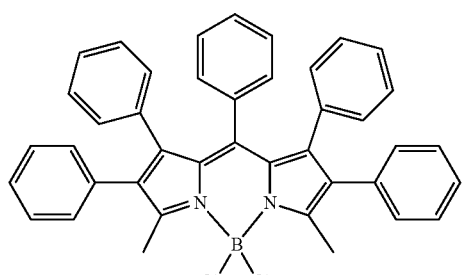
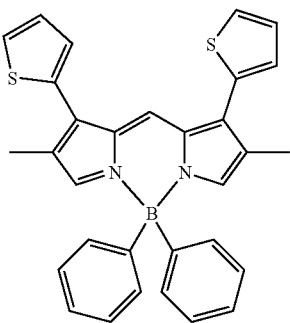

-continued
105
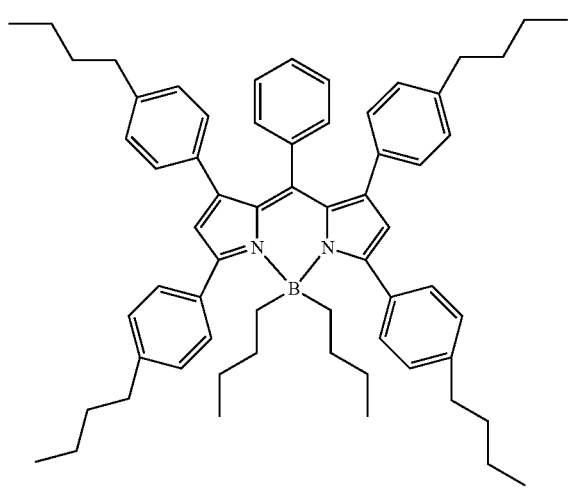
106
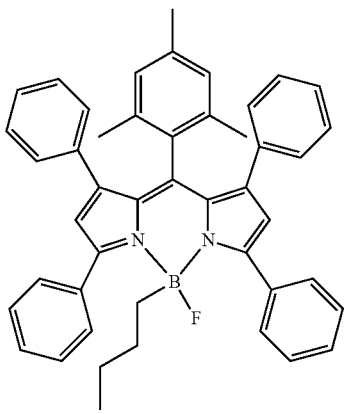
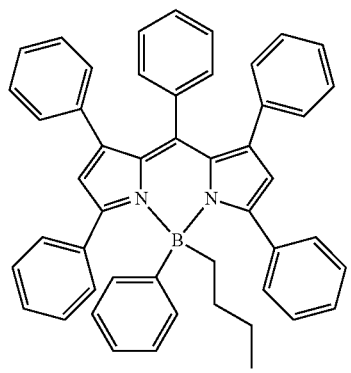
[Chem. 28]
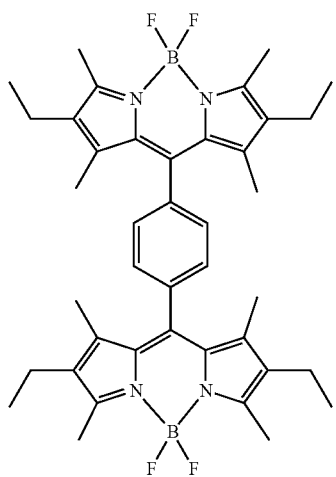
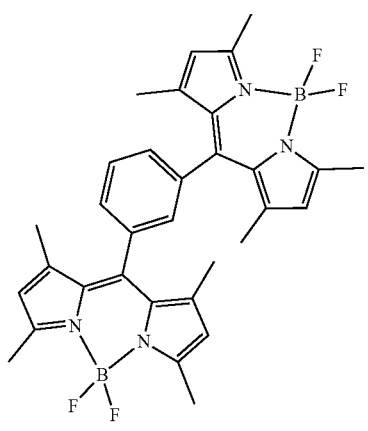

-continued
107
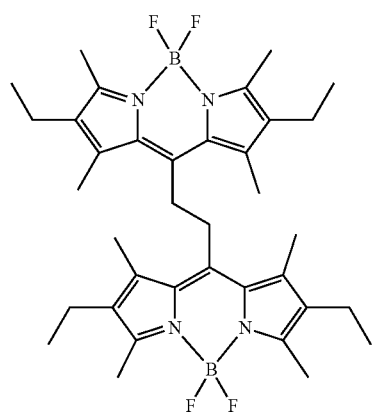
108
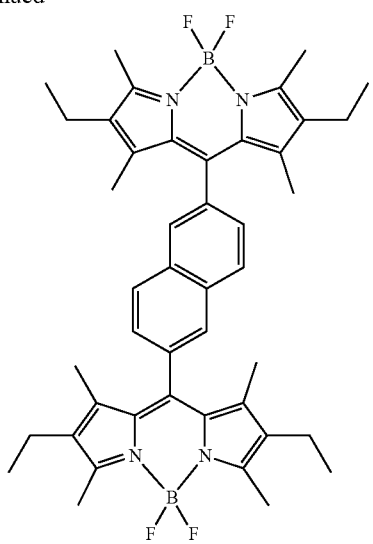
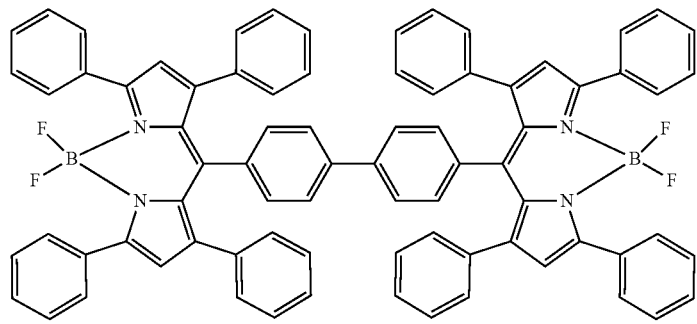
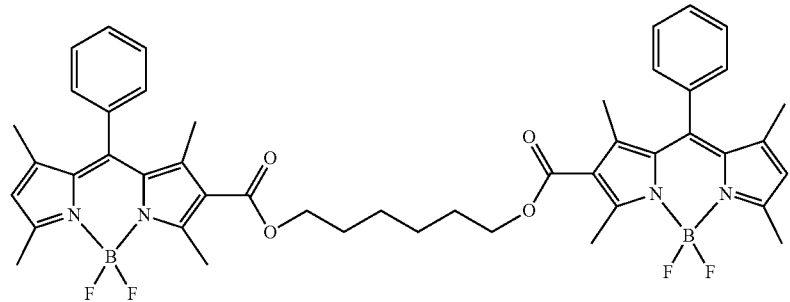
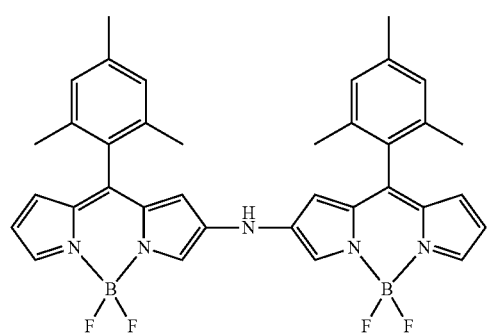
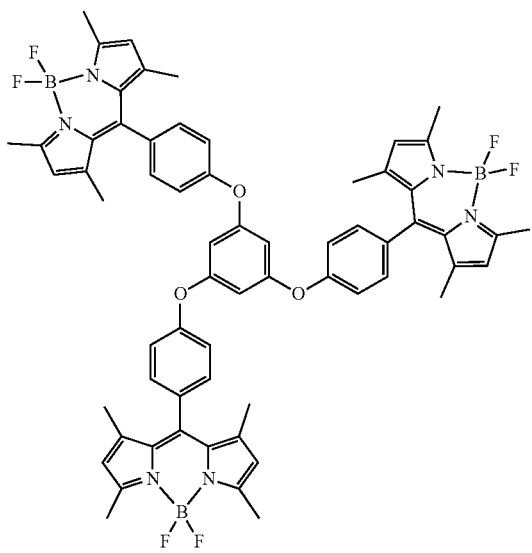

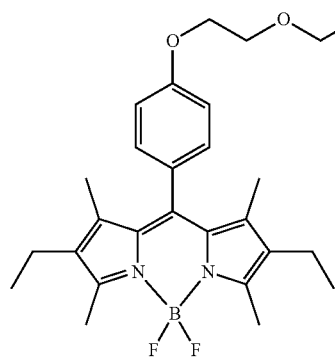
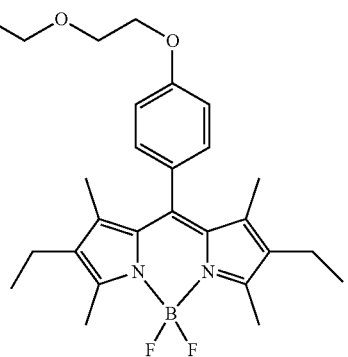
[Chem. 29]
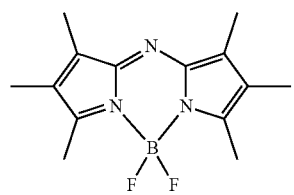
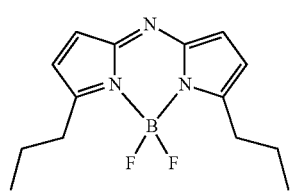
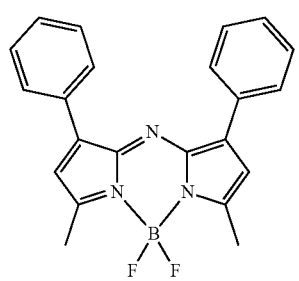
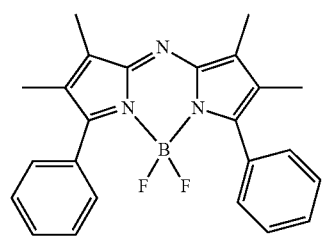
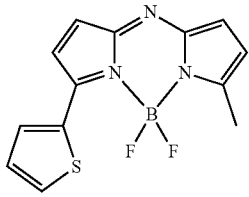
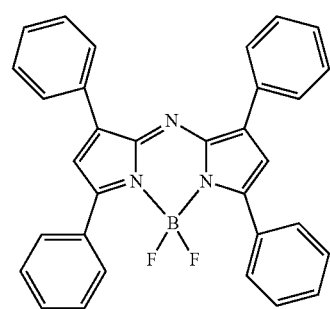
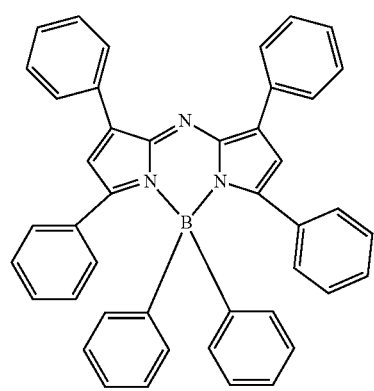
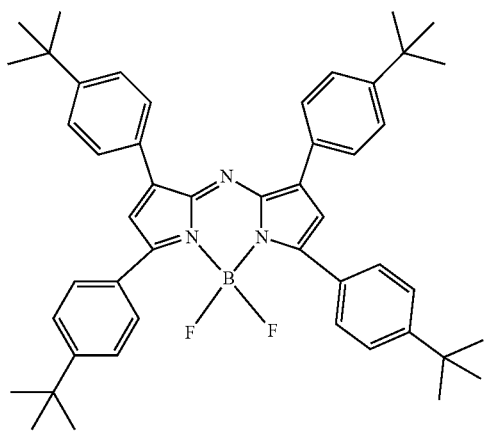

-continued
111
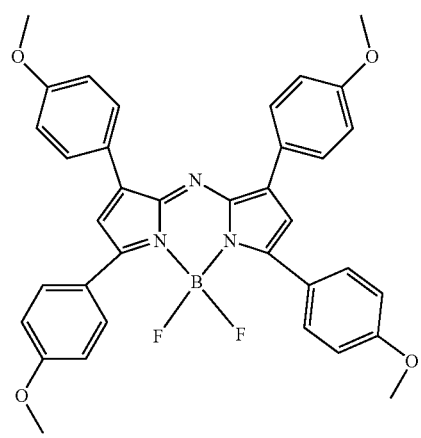
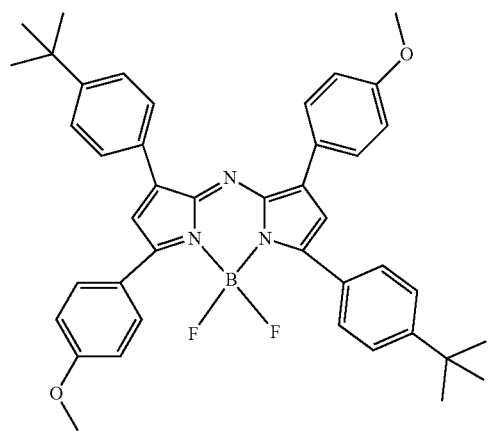
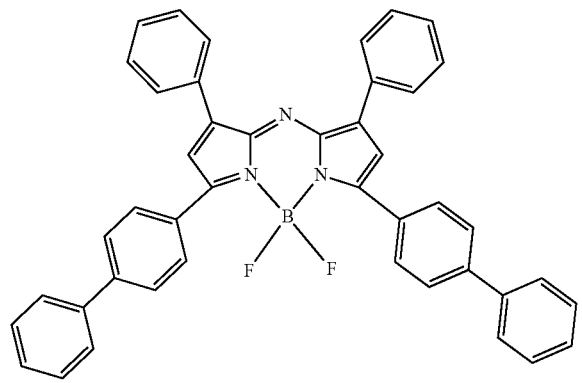
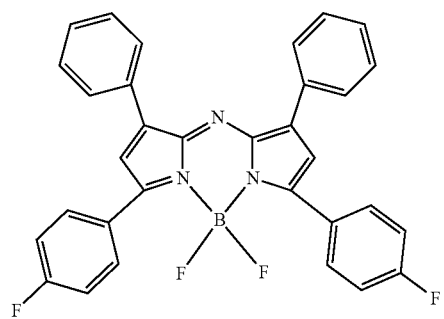
112
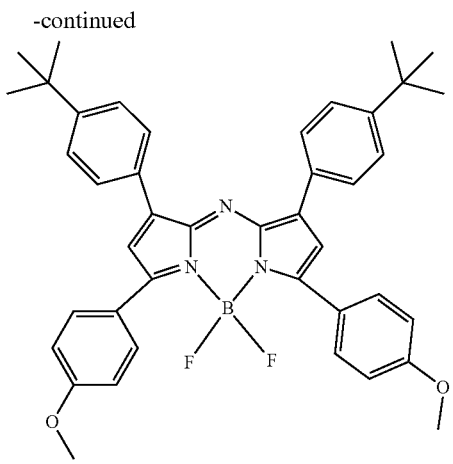
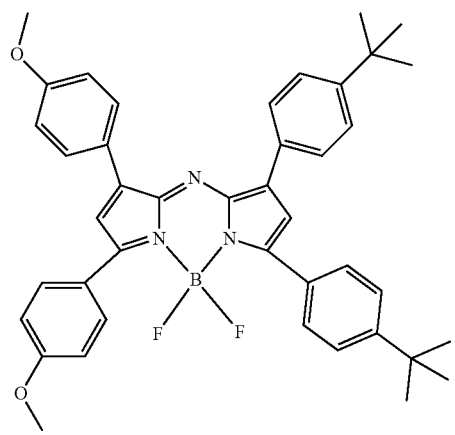
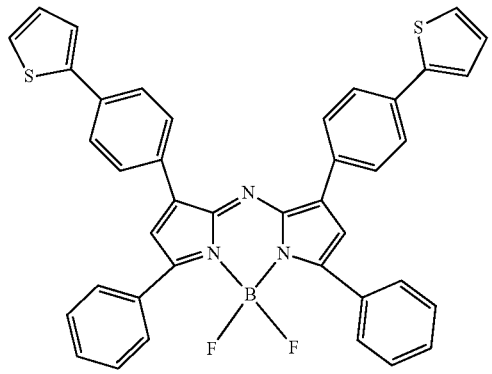

[Chem. 30]

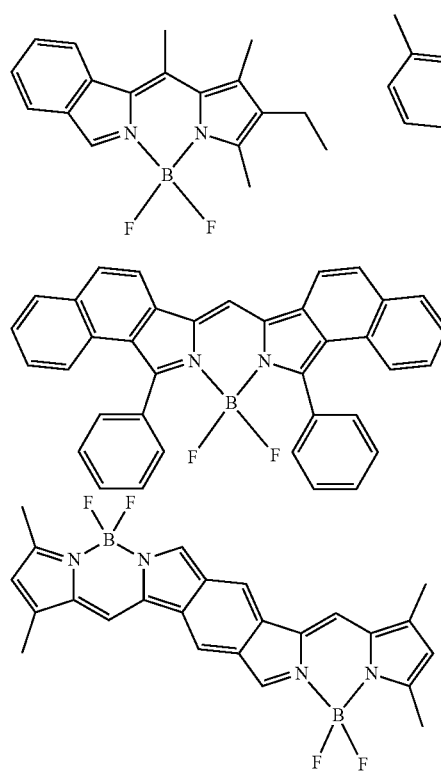

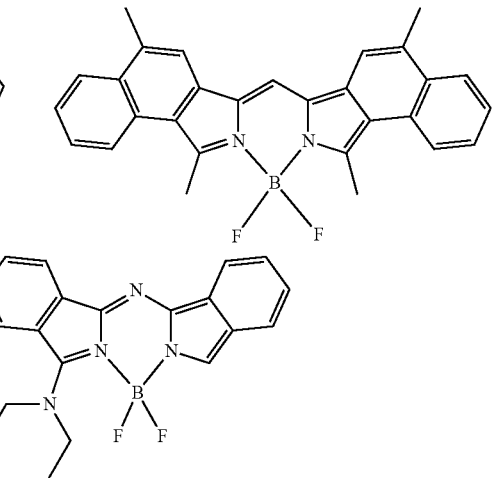

The compound represented by formula (1) can be produced by the method described, for example, in JP-T-8-509471 or JP-A-2000-208262. More specifically, a target pyrromethene-based metal complex is obtained by reacting a pyrromethene compound with a metal salt in the co-presence of a base.

As to the synthesis of a pyrromethene-boron fluoride complex, the compound can be produced by referring to the method described in *J. Org. Chem.*, Vol. 64, No. 21, pp. 7813-7819 (1999), *Angew. Chem., Int. Ed. Engl.*, Vol. 36, pp. 1333-1335 (1997), etc. The method includes, but is not limited to, for example, a method of heating a compound represented by the following formula (4) and a compound represented by formula (5) in 1,2-dichloromethane in the presence of phosphorus oxychloride, and then reacting a compound represented by the following formula (6) in 1,2-dichloroethane in the presence of triethylamine. Here, $R^1$ to $R^9$ are the same as above. J represents a halogen.

[Chem. 31]

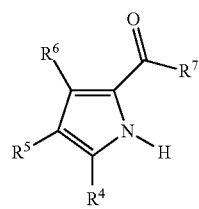

(4)

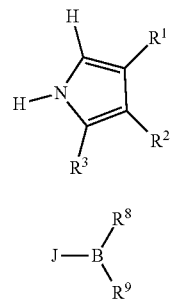

(5)

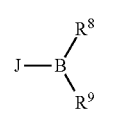

(6)

Furthermore, the method for introducing an aryl group or a heteroaryl group includes, but is not limited to, a method of producing a carbon-carbon bond by using a coupling reaction of a halogenated derivative with a boronic acid or a boronic ester derivative. Similarly, the method for introducing an amino group or a carbazolyl group includes, but is not limited to, a method of producing a carbon-nitrogen bond by using a coupling reaction of a halogenated derivative with an amine or carbazole derivative in the presence of a metal catalyst such as palladium.

The color conversion composition of the present invention may appropriately contain another compound, if desired, other than the compound represented by formula (1). For example, the composition may contain an assist dopant such as rubrene to further enhance the energy transfer efficiency from excitation light to the compound represented by formula (1). In the case of intending to add an emission color other than the emission color of the compound represented by formula (1), the above-described organic luminescent material can be added. In addition, other than the organic luminescent material, a known luminescent material such as inorganic fluorescent substance, fluorescent pigment, fluorescent dye and quantum dot may be added in combination.

Examples of the organic luminescent material other than the compound represented by formula (1) are illustrated below, but the present invention is not limited thereto.

[Chem. 32]

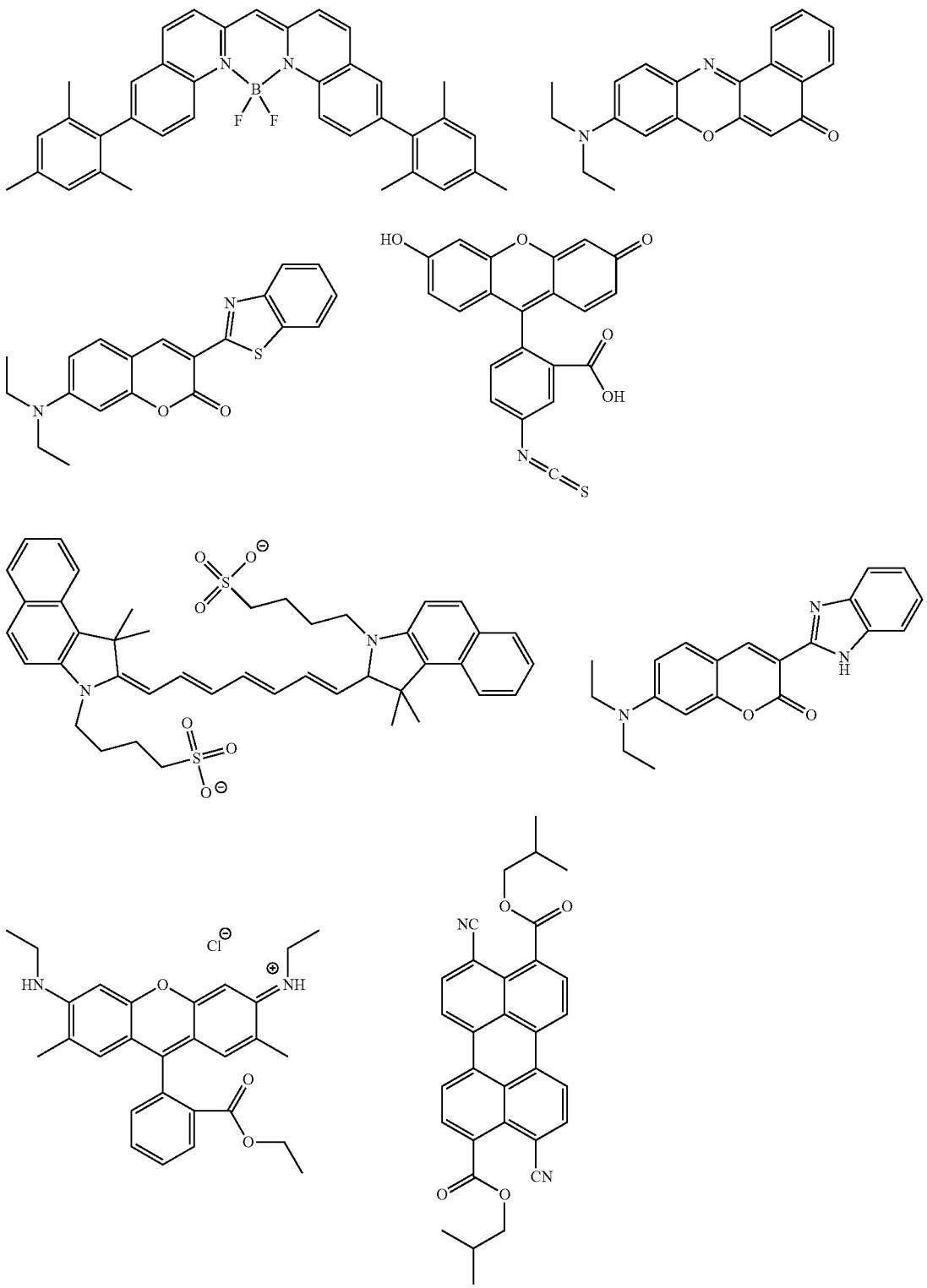

-continued
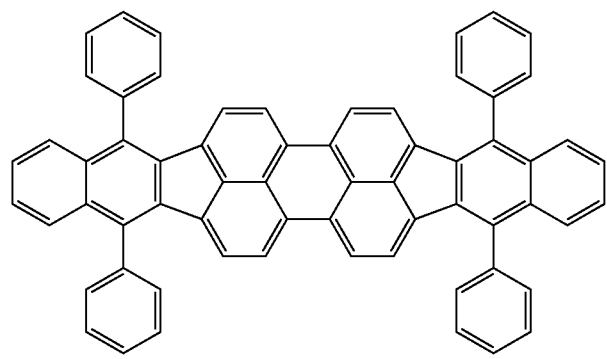
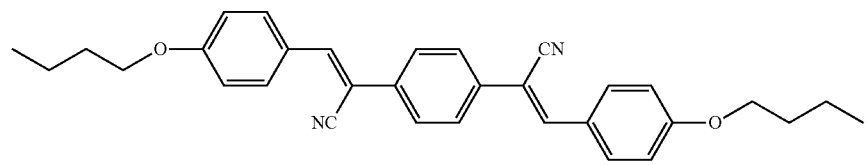
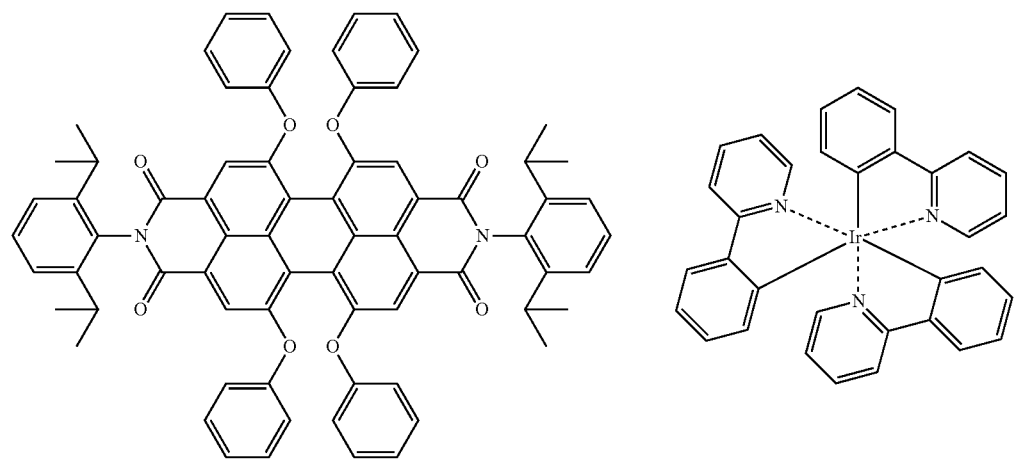
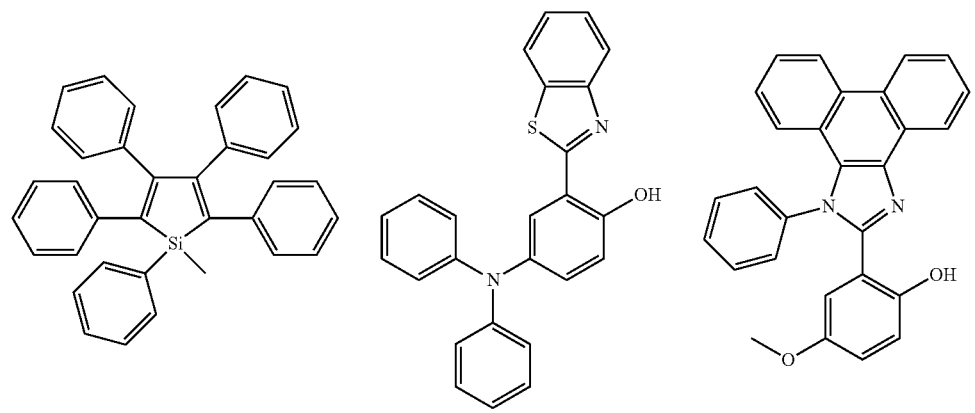

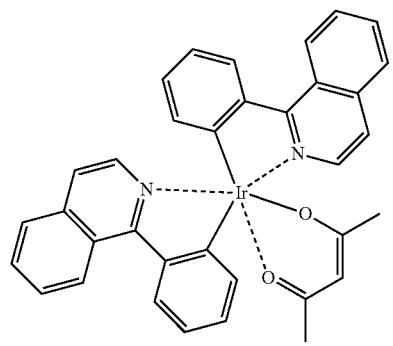
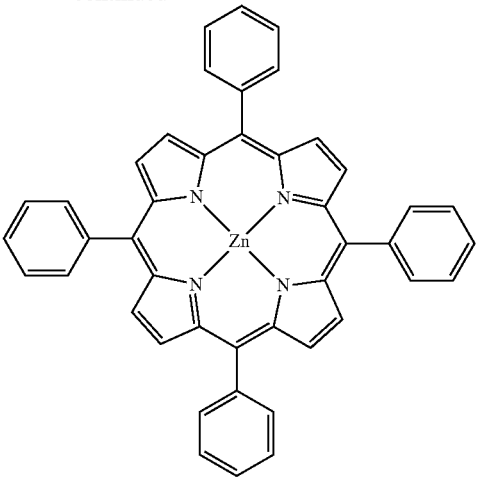
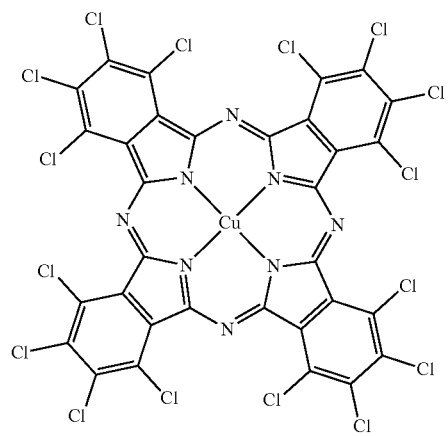

The color conversion composition of the present invention preferably contains a luminescent material emitting light having a peak wavelength observed in the region of 500 to 580 nm by use of excitation light having a wavelength of 430 to 500 nm (hereinafter, referred to as "luminescent material (a)"). Hereinafter, emission of light having a peak wavelength observed in the region of 500 to 580 nm is referred to as "green emission". In general, excitation light having lager energy is more likely to cause decomposition of a material, but the excitation energy of excitation light having a wavelength of 430 to 500 nm is relatively small, and green emission having a good color purity is therefore obtained without causing decomposition of a luminescent material in the color conversion composition.

The color conversion composition of the present invention preferably contains (a) a luminescent material emitting light having a peak wavelength of 500 to 580 nm by use of excitation light having a wavelength of 430 to 500 nm and (b) a luminescent material emitting light having a peak wavelength observed in the region of 580 to 750 nm upon excitation by at least either one or both of excitation light having a wavelength of 430 to 500 nm and luminescence from the luminescent material (a) (hereinafter, referred to as "luminescent material (b)"). Hereinafter, emission of light having a peak wavelength observed in the region of 580 to 750 nm is referred to as "red emission".

Part of the excitation light having a wavelength of 430 to 500 nm partially transmits through the color conversion film of the present invention, and in the case of using a blue LED having a sharp emission peak, each of blue, green and red colors exhibits an emission spectrum in a sharp profile, making it possible to obtain white light with good color purity. As a result, particularly in a display, more vivid colors and a larger color gamut can be efficiently produced. In the lighting applications, compared with a currently prevailing white LED fabricated by combining a blue LED and a yellow phosphor, the light emission characteristics particularly in the green and red regions are improved, and the color rendering properties are thereby enhanced to provide a preferable white light source.

The suitable luminescent material (a) includes, but is not particularly limited to, a coumarin derivative such as coumarin 6, coumarin 7 and coumarin 153, a cyanine derivative such as indocyanine green, a fluorescein derivative such as fluorescein, fluorescein isothiocyanate and carboxyfluorescein diacetate, a phthalocyanine derivative such as phthalocyanine green, a perylene derivative such as diisobutyl-4,10-dicyanoperylene-3,9-dicarboxylate, a pyrromethene derivative, a stilbene derivative, an oxazine derivative, a naphthalimide derivative, a pyrazine derivative, a benzimidazole derivative, a benzoxazole derivative, a benzothiazole derivative, an imidazopyridine derivative, an azole derivative, a compound having a fused aryl ring, such as anthracene, or a derivative thereof, an aromatic amine derivative, an organic metal complex compound, etc.

Among these compounds, a pyrromethene derivative gives a high fluorescence quantum yield, has good durability, and is therefore a particularly suitable compound, and above all, a compound represented by formula (1) exhibits light emission with high color purity and is thus preferred.

The suitable luminescent material (b) includes, but is not particularly limited to, a cyanine derivative such as 4-dicyanomethylene-2-methyl-6-(p-dimethylaminostyryl)-4H-pyrane, a rhodamine derivative such as rhodamine B, rhodamine 6G, rhodamine 101 and sulforhodamine 101, a pyridine derivative such as 1-ethyl-2-(4-(p-dimethylaminophenyl)-1,3-butadienyl)-pyridinium-perchlorate, a perylene derivative such as N,N-bis(2,6-diisopropylphenyl)-1,6,7,12-tetraphenoxyperylene-3,4:9,10-bisdicarboimide, a porphyrin derivative, a pyrromethene derivative, an oxazine derivative, a pyrazine derivative, a compound having a fused aryl ring, such as naphthacene or dibenzodiindenoperylene, or a derivative thereof, an organic metal complex compound, etc.

Among these compounds, a pyrromethene derivative gives a high fluorescence quantum yield, has good durability, and is therefore a particularly suitable compound, and above all, a compound represented by formula (1) exhibits light emission with high color purity and is preferred.

The content of the component (A) in the color conversion composition of the present invention may vary depending on the molar extinction coefficient, fluorescence quantum yield and absorption intensity at excitation wavelength of the compound and the thickness or transmittance of the film formed but is usually from $1.0 \times 10^{-4}$ to 30 parts by weight, preferably from $1.0 \times 10^{-3}$ to 10 parts by weight, more preferably from $1.0 \times 10^{-2}$ to 5 parts by weight, per 100 parts by weight of the component (B).

In the case where the color conversion composition contains both (a) a luminescent material providing green emission and (b) a luminescent material providing red emission, since part of green emission is converted to red emission, the content $w_a$ of the luminescent material (a) and the content $w_b$ of the luminescent material (b) preferably have a relationship of $w_a \geq w_b$. The content ratio of respective materials is $w_a:w_b$=from 1000:1 to 1:1, preferably from 500:1 to 2:1, more preferably from 200:1 to 3:1. Here, $w_a$ and $w_b$ are the weight percent relative to the weight of the component (B).

<(B) Binder Resin>

The binder resin forms a continuous phase and may be sufficient if it is a material excellent in mold processability, transparency, heat resistance, etc. A known resin, for example, a photocurable resist material having a reactive vinyl group, such as acrylic acid-based, methacrylic acid-based, polyvinyl cinnamate-based and cyclic rubber-based resins, an epoxy resin, a silicone resin (including a cured (crosslinked) organopolysiloxane such as silicone rubber and silicone gel), a urea resin, a fluororesin, a polycarbonate resin, an acrylic resin, a urethane resin, a melamine resin, a polyvinyl resin, a polyamide resin, a phenol resin, a polyvinyl alcohol resin, a polyvinyl butyral resin, a cellulose resin, an aliphatic ester resin, an aromatic ester resin, an aliphatic polyolefin resin, and an aromatic polyolefin resin, may be used. It is also possible to use a copolymerized resin thereof. A resin useful for the color conversion composition of the present invention is obtained by appropriately designing the resins above.

Among these resins, a thermosetting resin is more preferred, because the film forming process is facilitated. In view of transparency, heat resistance, etc., an epoxy resin, a silicone resin, an acrylic resin, a polyester resin, or a mixture thereof may be suitably used.

In addition, as an additive, a dispersant or leveling agent for stabilizing the coated film, plasticizer, a crosslinking agent such as epoxy compound, a curing agent such as amine, acid anhydride or imidazole, and as a modifier of the film surface, an adhesion aid, e.g., a silane coupling agent, may also be added. Furthermore, an inorganic particle such as silica particles or silicone fine particles may also be added as a color conversion material precipitation inhibitor.

As the binder resin, a silicone resin is preferably used in view of heat resistance. Among silicone resins, an addition reaction-curable silicone composition is preferred. The addition reaction-curable silicone composition is cured by heating at normal temperature or at a temperature of 50 to 200° C. and is excellent in the transparency, heat resistance and adhesiveness. The addition reaction-curable silicone composition is formed, for example, by a hydrosilylation reaction of a compound containing an alkenyl group bonded to a silicon atom with a compound having a hydrogen atom bonded to a silicon atom. Such a material includes those formed by a hydrosilylation reaction of a compound containing an alkenyl group bonded to a silicon atom, such as vinyltrimethoxysilane, vinyltriethoxysilane, allyltrimethoxysilane, propenyltrimethoxysilane, norbornenyltrimethoxysilane and octenyltrimethoxysilane, with a compound having a hydrogen atom bonded to a silicon atom, such as methylhydrogenpolysiloxane, dimethylpolysiloxane-CO-methylhydrogenpolysiloxane, ethylhydrogenpolysiloxane and methylhydrogenpolysiloxane-CO-methylphenylpolysiloxane. In addition, known materials described, for example, in JP-A-2010-159411 may also be utilized.

Furthermore, a commercially available silicone sealant for use in general LED may also be used. Specific examples thereof include OE-6630A/B, OE-6336A/B, both produced by Dow Corning Toray Co., Ltd., SCR-1012A/B, and SCR-1016A/B, both produced by Shin-Etsu Chemical Co., Ltd.

In the color conversion composition for the preparation of color conversion film of the present invention, as other components, a hydrosilylation reaction retarder such as acetylene alcohol is preferably blended to inhibit curing at normal temperature and extend the pot life. In addition, for example, a fine particle such as fumed silica, glass powder or quartz powder, an inorganic filler such as titanium oxide, zirconium oxide, barium titanate or zinc oxide, a pigment, a flame retardant, a heat-resistant agent, an antioxidant, a dispersant, a solvent, and a tackifier such as silane coupling agent or titanium coupling agent, may be blended, if desired, to the extent of not impairing the effects of the present invention.

Above all, in view of surface smoothness of the color conversion film, a polydimethylsiloxane component having a low molecular weight, a silicone oil, etc. is preferably added to the silicone resin composition for the preparation of color conversion film. Such a component is preferably added in an amount of 100 to 2,000 ppm, more preferably from 500 to 1,000 ppm, relative to the whole composition.

As another embodiment of the present invention, the composition may also contain a silicone fine particle, in addition to a binder resin and a compound represented by formula (1). Here, as the binder resin and the compound represented by formula (1), the same as those described above are preferably used.

<(C) Tertiary Amine, Catechol Derivative and Nickel Compound>

For preventing deterioration of the luminescent material and achieving enhancement of durability, i.e., suppression of reduction in the light emission intensity over time, at least one of specific tertiary amines, catechol derivatives and nickel compounds is effective.

Such a compound has a role of light stabilizer, particularly as a singlet oxygen quencher.

The singlet oxygen quencher is a material trapping and inactivating singlet oxygen resulting from activation of oxygen molecule due to light energy. Co-presence of a singlet oxygen quencher in the composition makes it possible to prevent singlet oxygen from deteriorating the luminescent material.

Singlet oxygen is known to result from occurrence of exchange of electron and energy between a triplet excited state of a dye such as Rose Bengal and methylene blue, and an oxygen molecule in ground state. In the color conversion composition of the present invention, the luminescent material contained therein is excited by excitation light and emits light with a wavelength different from that of excitation light to thereby perform color conversion of the light. Since the cycle of excitation-light emission is repeated, the probability of generation of singlet oxygen due to interaction between the resulting excited species and oxygen contained in the composition increases. In turn, the probability of the luminescent material colliding with singlet oxygen increases and consequently, deterioration of the luminescent material readily proceeds. In particular, the compound represented by formula (1) has high reactivity with singlet oxygen, compared with a compound having a fused aryl ring such as perylene or other derivatives, and its durability is greatly affected by singlet oxygen.

Accordingly, singlet oxygen generated is promptly deactivated by at least one of specific tertiary amines, catechol derivatives and nickel compounds, and the durability of the compound represented by formula (1), which is excellent in the quantum yield and color purity, can thereby be enhanced.

In order not to block light from a light source or light emitted by the luminescent material, the compound of the component (C) preferably has a small extinction coefficient in the visible region. Specifically, the molar extinction coefficient ε is 100 or less in the whole wavelength region from 400 nm to 800 nm. ε is preferably smaller, more preferably 80 or less, still more preferably 60 or less, particularly preferably 50 or less. Use of a component having no absorption in the visible region makes it possible to enhance the durability of the color conversion composition without reducing the luminous efficiency.

The tertiary amine indicates a compound having a structure where all N—H bonds of ammonia are replaced by an N—C bond. The substituent on the nitrogen atom is selected from an alkyl group, a cycloalkyl group, a heterocyclic group, an alkenyl group, a cycloalkenyl group, an alkynyl group, an aryl group, a heteroaryl group, an aldehyde group, a carbonyl group, a carboxyl group, an oxycarbonyl group, a carbamoyl group, and a fused ring and an aliphatic ring each formed between adjacent substituents. This substituent may further be substituted with the above-described substituent.

In view of light stability, the substituent on the nitrogen atom is preferably a substituted or unsubstituted alkyl group, a substituted or unsubstituted cycloalkyl group, a substituted or unsubstituted aryl group, or a substituted or unsubstituted heteroaryl group, more preferably a substituted or unsubstituted alkyl group, a substituted or unsubstituted cycloalkyl group, or a substituted or unsubstituted aryl group.

In this case, the aryl group is preferably a phenyl group or a naphthyl group, more preferably a phenyl group, because these groups do not block light from a light source or light emitted by the luminescent material. If the number of aryl groups on the nitrogen atom is large, increase in absorption in the visible region may be concerned. For this reason, out of three substituents on the nitrogen atom, the number of aryl groups is preferably two or less, more preferably 1 or less.

Out of three substituents on the nitrogen atom, at least one is preferably a substituted or unsubstituted alkyl group, because singlet oxygen can be more efficiently trapped. Above all, out of three substituents, two or more are preferably a substituted or unsubstituted alkyl group.

Preferable tertiary amines include, but are not particularly limited to, triethylamine, 1,4-diazabicyclo[2.2.2]octane, tri-n-butylamine, N,N-diethylaniline, 1,2,2,6,6-pentamethylpiperidine, bis(1,2,2,6,6-pentamethyl-4-piperidyl)sebacate, 1,2,2,6,6-pentamethyl-4-piperidyl methacrylate, etc.

The catechol derivative indicates a compound having two or more hydroxyl groups on the benzene ring, including an isomer such as resorcinol and hydroquinone. This compound can more efficiently trap singlet oxygen, compared with a phenol derivative having one hydroxyl group on the benzene ring.

The substituent on the benzene ring is, other than a hydroxyl group, selected from hydrogen, an alkyl group, a cycloalkyl group, a heterocyclic group, an alkenyl group, a cycloalkenyl group, an alkynyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a fused ring and an aliphatic ring each formed between adjacent substituents. This substituent may further be substituted with the above-described substituent.

Among others, a substituted or unsubstituted alkyl group, a substituted or unsubstituted cycloalkyl group, a substituted or unsubstituted aryl group, a substituted or unsubstituted heteroaryl group, and a halogen are preferred in view of light stability, and a substituted or unsubstituted alkyl group, a substituted or unsubstituted cycloalkyl group, a substituted or unsubstituted aryl group, and a halogen are more preferred. Furthermore, for the reason that discoloration after reaction with a singlet oxygen quencher is lessened, a substituted or unsubstituted alkyl group, a substituted or unsubstituted cycloalkyl group, and a halogen are still more preferred, and a substituted or unsubstituted alkyl is particularly preferred.

As for the position of a hydroxyl group on the benzene ring, at least two hydroxyl groups are preferably adjoined, because the compound is not readily photooxidized, compared with resorcinol (1,3-substitution) or hydroquinone (1,4-substitution). In addition, absorption in the visible region is small even after being oxidized and therefore, discoloration of the composition can be prevented.

Preferable catechol derivatives include, but are not particularly limited to, 4-tert-butylbenzene-1,2-diol, 3,5-di-tert-butylbenzene-1,2-diol.

The nickel compound is a compound containing nickel and includes, but is not particularly limited to, an inorganic salt such as nickel chloride, a complex such as bisacetylacetonatonickel, an organic acid salt such as nickel carbamate, etc. The organic acid as used herein indicates an organic compound having a carboxyl group, a sulfonyl group, a phenolic hydroxyl group, or a thiol group.

Among others, a complex and an organic acid salt are preferred from the viewpoint of being uniformly dispersed in the composition.

The nickel complex and the nickel salt of an organic acid, which can be suitably used as the singlet oxygen quencher, include, but are not particularly limited to, for example, an acetylacetonate-based nickel complex, a bisdithio-α-diketone-based nickel complex, a dithiolate-based nickel complex, an aminothiolate-based nickel complex, a thiocatechol-based nickel complex, a salicylaldehyde oxime-based nickel complex, a thiobisphenolate-based nickel complex, an indoaniline-based nickel compound, a carboxylic acid-based nickel salt, a sulfonic acid-based nickel salt, a phenol-based nickel salt, a carbamic acid-based nickel salt, and a dithiocarbamic acid-based nickel salt.

Among these, at least one of a nickel salt of an organic acid, an acetylacetonate-based nickel complex, and a thiobisphenolate-based nickel complex is preferred.

In view of ease of synthesis and low cost, a nickel salt of an organic acid is preferred.

Furthermore, a sulfonic acid-based nickel salt has a small molar extinction coefficient in the visible region and does not absorb light from a light source or the luminescent material and is therefore preferred. A nickel salt of an arylsulfonic acid is more preferred from the viewpoint of exhibiting higher singlet oxygen quenching effect, and a nickel salt of an alkylsulfonic acid is preferred in view of solubility in a wide variety of solvents.

The aryl group of the arylsulfonic acid is preferably a substituted or unsubstituted phenyl group, and in view of solubility and dispersibility in a solvent, a phenyl group substituted with an alkyl group is more preferred.

Furthermore, in view of solubility in an organic solvent and a small molar extinction coefficient in the visible region, an acetylacetonate-based nickel complex and a thiobisphenolate-based nickel complex are preferred.

The ligand on nickel in these complexes may be substituted with a substituent such as alkyl group, cycloalkyl group, heterocyclic group, alkenyl group, cycloalkenyl group, alkynyl group, thiol group, alkoxy group, alkylthio group, aryl ether group, aryl thioether group, aryl group, heteroaryl group, halogen, cyano group, aldehyde group, carbonyl group, carboxyl group, oxycarbonyl group, carbamoyl group, amino group, nitro group, silyl group, siloxanyl group, boryl group and phosphine oxide group, and this substituent may further be substituted with the above-described substituent.

Among others, a substituted or unsubstituted alkyl group, a substituted or unsubstituted cycloalkyl group, a substituted or unsubstituted aryl group, a substituted or unsubstituted heteroaryl group, and a halogen are preferred in view of light stability, and a substituted or unsubstituted alkyl group, a substituted or unsubstituted cycloalkyl group, a substituted or unsubstituted aryl group, and a halogen are more preferred. Furthermore, for the reason that discoloration after reaction with a singlet oxygen quencher is lessened, a substituted or unsubstituted alkyl group, a substituted or unsubstituted cycloalkyl group, and a halogen are still more preferred, and a substituted or unsubstituted alkyl is particularly preferred.

The nickel compound having a molar extinction coefficient ε of 100 or less in the whole wavelength region from 400 nm to 800 nm includes, but is not limited to, a nickel salt of p-toluylsulfonic acid, an acetylacetone nickel(II) complex, a hexafluoroacetylacetone nickel(II) complex, 2,2'-thiobisphenolate-n-butylamine nickel(II) complex, a [2,2'-thiobis(4-tert-octylphenolate)]-2-ethylhexylamine nickel(II) complex, and among these nickel compounds, a nickel compound is suitably used as long as it has a molar extinction coefficient ε of 100 or less in the whole wavelength region from 400 nm to 800 nm.

One of these compounds as the component (C) may be used alone, or a plurality of kinds thereof may be used in combination.

The content of the component (C) in the color conversion composition of the present invention varies depending on the molar extinction coefficient, fluorescence quantum yield and absorption intensity at excitation wavelength of the compound and the thickness or transmittance of the film formed, but the content is usually from $1.0 \times 10^{-3}$ to 30 parts by weight, preferably from $1.0 \times 10^{-2}$ to 15 parts by weight, more preferably from $1.0 \times 10^{-2}$ to 10 parts by weight, particularly preferably from $1.0 \times 10^{-1}$ to 10 parts by weight, per 100 parts by weight of the component (B).

In the case of a nickel compound, if the content is excessively large, this adversely affects, for example, the strength or thermal stability at the time of processing and molding into a film, etc., and therefore, the content of the nickel compound is preferably from $1.0 \times 10^{-3}$ to 15 parts by weight, more preferably from $1.0 \times 10^{-2}$ to 10 parts by weight, particularly preferably from $1.0 \times 10^{-1}$ to 10 parts by weight, per 100 parts by weight of the component (B).

<Other Additives>

The color conversion composition of the present invention may contain an antioxidant, a processing and heat stabilizer, a light fastness stabilizer such as ultraviolet absorber, a silane coupling agent, etc., other than the components (A), (B) and (C).

The antioxidant includes, but is not particularly limited to, a phenol-based antioxidant such as 2,6-di-tert-butyl-p-cresol and 2,6-di-tert-butyl-4-ethylphenol. One of these antioxidants may be used alone, or a plurality thereof may be used in combination.

The processing and heat stabilizer includes, but is not particularly limited to, a phosphorus-based stabilizer such as tributyl phosphite, tricyclohexyl phosphite, triethylphosphine and diphenylbutylphosphine. One of these stabilizers may be used alone, or a plurality thereof may be used in combination.

The light fastness stabilizer includes, but is not particularly limited to, for example, benzotriazoles such as 2-(5-methyl-2-hydroxyphenyl)benzotriazole and 2-[2-hydroxy-3,5-bis(α,α-dimethylbenzyl)phenyl]-2H-benzotriazole. One of these light fastness stabilizers may be used alone, or a plurality thereof may be used in combination.

The content of such an additive in the color conversion composition of the present invention may vary depending on the molar extinction coefficient, fluorescence quantum yield and absorption intensity at excitation wavelength of the compound and the thickness or transmittance of the film to be formed, but the content is usually from $1.0 \times 10^{-3}$ to 30 parts by weight, preferably from $1.0 \times 10^{-2}$ to 15 parts by weight, more preferably from $1.0 \times 10^{-1}$ to 10 parts by weight, per 100 parts by weight of the component (B).

<Solvent>

The color conversion composition of the present invention may contain a solvent. The solvent is not particularly limited as long as it can adjust the viscosity of the resin in the flowing state and does not excessively affect the emission from luminescent substance and the durability. The solvent includes, for example, water, 2-propanol, ethanol, toluene, methyl ethyl ketone, methyl isobutyl ketone, cyclohexanone, hexane, acetone, terpineol, texanol, methyl cellosolve, ethyl cellosolve, butyl carbitol, butyl carbitol acetate, 1-methoxy-2-propanol, and propylene glycol monomethyl ether acetate. It is also possible to mix and use two or more kinds of these solvents. Among these solvents, toluene does not affect deterioration of the compound represented by formula (1), leaves less residual solvent after drying and therefore, is suitably used.

<Production Method of Color Conversion Composition>

One example of the method for producing the color conversion composition of the present invention is described below. Predetermined amounts of a luminescent material, a binder resin, at least one of a tertiary amine, catechol derivative and a nickel compound, a solvent, etc., which are described above, are mixed. After mixing these components to afford a predetermined composition, the mixture is homogeneously mixed and dispersed by means of a stirrer/kneader such as homogenizer, rotation-revolution stirrer, three-roll mill, ball mill, planetary ball mill or beads mill, to obtain a color conversion composition. After mixing and dispersing or in the process of mixing and dispersing, defoaming is also preferably performed under a vacuum or reduced-pressure condition. In addition, it may also be possible to mix specific components in advance or apply a treatment such as aging. The solvent may be removed by an evaporator to give a desired solid content concentration.

<Preparation Method of Color Conversion Film>

Figure 2:
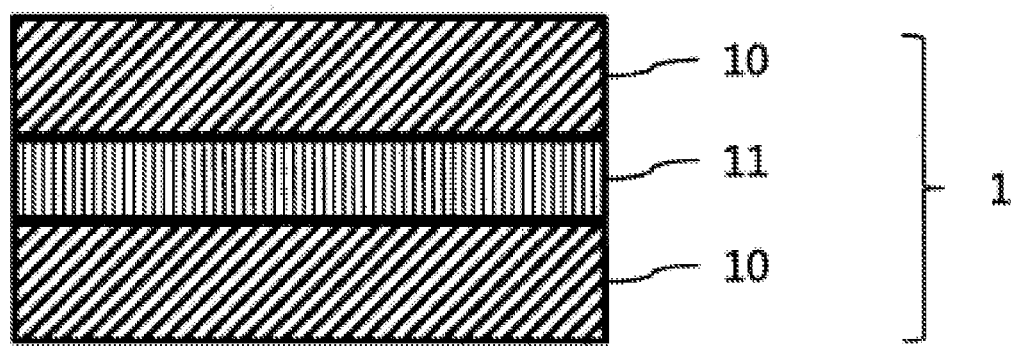
FIG. 2 is a schematic cross-sectional view illustrating one example of the color conversion film of the present invention.
Figure 3:
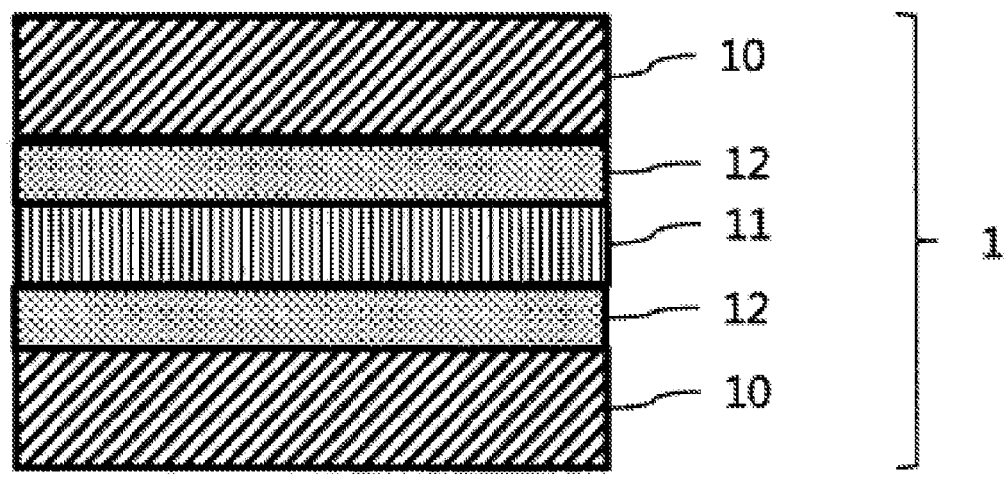
FIG. 3 is a schematic cross-sectional view illustrating one example of the color conversion film of the present invention.

In the present invention, the configuration of the color conversion film is not limited as long as the film contains a layer obtained by curing the color conversion composition. Representative structural examples of the color conversion film include a laminate having, as illustrated in FIG. 1, a substrate layer 10 and a color conversion layer 11 obtained by curing the color conversion composition, and a laminate having, as illustrated in FIG. 2, a color conversion layer 11 sandwiched by a plurality of substrate layers 10. In the color conversion film, as illustrated in FIG. 3, a barrier film 12 may be further provided so as to prevent deterioration of the color conversion layer due to oxygen, water or heat.

The thickness of the color conversion film is not particularly limited but is preferably from 1 to 5,000 μm in terms of a total thickness of all layers. If the thickness is less than 1 μm, there arises a problem that the toughness of the film is reduced. If the thickness exceeds 5,000 μm, cracking is likely to occur, making it difficult to mold a color conversion film. The thickness is more preferably from 10 to 1,000 μm, still more preferably from 15 to 500 μm, particularly preferably from 30 to 300 μm.

The thickness of the color conversion film as used in the present invention indicates the film thickness (average film thickness) measured based on JIS K7130 (1999), Plastics-Film and sheeting-Determination of thickness, Measurement Method A, a method of measuring the thickness by mechanical scanning.

(Substrate Layer)

As the substrate layer, known metal, film, glass, ceramic, paper, etc. can be used without any particular limitation. Specifically, the substrate includes a metal sheet or foil such as aluminum (including an aluminum alloy), zinc, copper and iron; a film of plastic such as cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin and thermoplastic fluororesin that is a tetrafluoroethylene-ethylene copolymer (ETFE); a film of plastic including α-polyolefin resin, polycaprolactone resin, acrylic resin, silicone resin, or a copolymerized resin thereof with ethylene; paper having laminated thereon the plastic above; paper coated with the plastic above; paper having laminated or vapor-deposited thereon the metal above; and a plastic film having laminated or vapor-deposited thereon the metal above. In the case where the substrate is a metal sheet, the surface may be subjected to chrome- or nickel-plating or ceramic treatment.

Among these, in view of easy preparation of the color conversion film and easy molding of the color conversion film, glass or a resin film is preferably used. In the case of handling a film-like substrate, a film having high strength is preferred so as to remove the fear of rupture. In view of these required properties or profitability, a resin film is preferred, and among others, in view of profitability and handleability, a plastic film selected from the group consisting of PET, polyphenylene sulfide, polycarbonate and polypropylene is preferred. In the case of drying the color conversion film or in the case of performing pressure bonding and molding of the color conversion film by means of an extruder at a high temperature of 200° C. or more, a polyimide film is preferred in view of heat resistance. For the reason that separation of the sheet is facilitated, the surface of the substrate layer may be previously subjected to a release treatment.

The thickness of the substrate layer is not particularly limited, but the lower limit thereof is preferably 5 μm or more, more preferably 25 μm or more, still more preferably 38 μm or more, and the upper limit thereof is preferably 5,000 μm or less, more preferably 3,000 μm or less.

(Color Conversion Layer)

One example of the method for producing the color conversion layer of the color conversion film of the present invention is described below. A color conversion composition prepared by the above-described method is applied onto a substrate and dried. The coating can be performed by means of a reverse roll coater, a blade coater, a slit die coater, a direct gravure coater, an offset gravure coater, a kiss coater, a natural roll coater, an air knife coater, a roll blade coater, a baribar roll blade coater, a two-stream coater, a rod coater, a wire bar coater, an applicator, a dip coater, a curtain coater, a spin coater, a knife coater, etc. In order to achieve thickness uniformity of the color conversion layer, the composition is preferably applied by means of a slit die coater or a dip coater.

The color conversion layer can be dried using a general heating apparatus such as hot air drier or infrared drier. For the heating of the color conversion film, a general heating apparatus such as hot air drier or infrared drier is used. In this case, the heating conditions are usually from 40 to 250° C. and from 1 minute to 5 hours, preferably from 60 to 200° C. and from 2 minutes to 4 hours. It is also possible to perform stepwise heating/curing such as step-cure.

After preparing the color conversion layer, the substrate may be changed, if desired. In this case, the simple method includes, but is not limited to, for example, a method of re-laminating the substrate by using a hot plate, and a method using a vacuum laminator or a dry film laminator.

The thickness of the color conversion layer is not particularly limited but is preferably from 1 to 1,000 μm, more preferably from 10 to 1,000 μm. If the thickness is less than 1 μm, there arises a problem that the toughness of the film is reduced. If the thickness exceeds 1,000 μm, cracking is likely to occur, making it difficult to mold a color conversion film. The thickness thereof is more preferably from 10 to 100 μm, still more preferably from 15 to 100 μm, particularly preferably from 30 to 100 μm.

(Barrier Film)

The barrier film includes a film appropriately used in the case of improving the gas barrier property for the color conversion layer, for example, a metal oxide or metal nitride thin film of an inorganic oxide such as silicon oxide, aluminum oxide, titanium oxide, tantalum oxide, zinc oxide, tin oxide, indium oxide, yttrium oxide and magnesium oxide, an inorganic nitride such as silicon nitride, aluminum nitride, titanium nitride and silicon carbide nitride, a mixture thereof, or the oxide or nitride having added thereto another element; and a film formed of various resins such as polyvinylidene chloride, acrylic resin, silicon-based resin, melamine-based resin, urethane-based resin, fluororesin, or a polyvinyl alcohol-based resin, e.g., saponified vinyl acetate. The film having a barrier function against water includes, for example, a film formed of various resins such as polyethylene, polypropylene, nylon, polyvinylidene chloride, vinylidene chloride-vinyl chloride copolymer, vinylidene chloride-acrylonitrile copolymer, fluororesin and polyvinyl alcohol-based resin, e.g., saponified vinyl acetate.

The barrier film may be provided, as illustrated in FIG. 3, on both surfaces of the color conversion layer 12 or may be provided only on one surface thereof.

In addition, according to the function required for the color conversion film, a light diffusion layer and an auxiliary layer having an antireflection function, an antiglare function, an antireflection-antiglare function, a hardcoat function (anti-friction function), an antistatic function, an antifouling function, an electromagnetic wave shielding function, an infrared cutting function, an ultraviolet cutting function, a polarizing function, or a toning function may be further provided.

<Excitation Light>

As for the kind of excitation light, any excitation light may be used as long as it emits light in the wavelength region where the mixed luminescent substance such as compound represented by formula (1) can absorb light. For example, excitation light from any of a fluorescent light source such as hot cathode tube, cold cathode tube and inorganic EL, an organic electroluminescence element light source, an LED light source, an incandescent light source, sunlight, etc. can be utilized in principle, but among others, an LED is suitable excitation light and in display or lighting applications, from the viewpoint that color purity of blue light is enhanced, a blue LED having excitation light in the range of 430 to 500 nm is more suitable excitation light. If the wavelength range of excitation light is present on the longer wavelength side than the range above, white light cannot be formed due to lack of blue light, and if the wavelength range of excitation light is present on the shorter wavelength side than the range above, a luminescent substance such as compound represented by formula (1) or an organic compound such as binder resin is disadvantageously apt to be deteriorated by light.

The excitation light may be light having one kind of an emission peak or may be light having two or more kinds of emission peaks, but in order to increase the color purity, excitation light having one kind of an emission peak is preferred. It is also possible to arbitrarily combine and use a plurality of excitation light sources differing in the kind of emission peak.

<Light Source Unit>

The light source unit in the present invention is configured to include at least a light source and the color conversion composition or color conversion film. In the case of including the color conversion composition, the method for disposing a light source and the color conversion composition is not particularly limited, and the unit may have a configuration where the color conversion composition is applied directly onto the light source, or may have a configuration where the color conversion composition is applied onto a film, glass, etc. kept separate from the light source. In the case of including the color conversion film, the method for disposing a light source and the color conversion film is not particularly limited, and the unit may have a configuration where a light source is firmly attached to the color conversion film, or may employ a remote phosphor system, in which a light source is separated from the color conversion film. In addition, for the purpose of increasing the color purity, the unit may have a configuration further including a color filter.

As described above, the excitation energy of excitation light in the range of 430 to 500 nm is relatively small and since decomposition of the luminescent substance such as compound represented by formula (1) can be prevented, the light source is preferably a light-emitting diode having maximum light emission in the range of 430 to 500 nm.

The light source unit in the present invention may be used in applications such as display, lighting, interior, indicator and signboard but, among others, is suitably used for the display or lighting applications.

EXAMPLES

The present invention is described below by referring to Examples, but the present invention is not limited by these Examples.

In the following Examples and Comparative Examples, Compounds G-1 to G-8, R-1 to R-4 and Q-1 to Q-10 are the compounds shown below.

[Chem. 33]

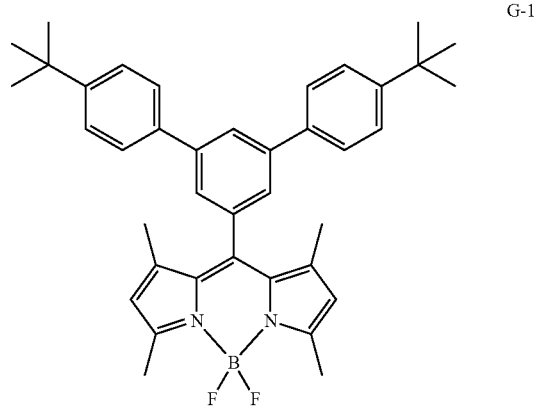

G-1

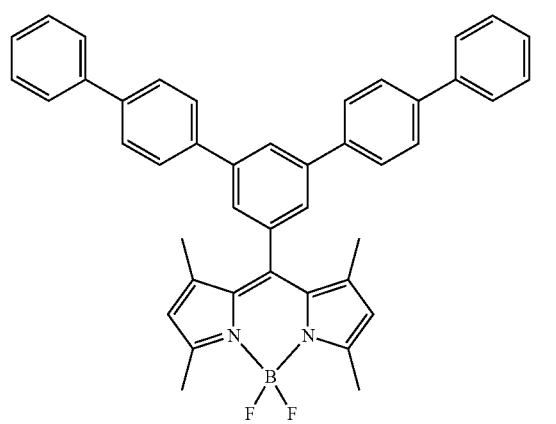

G-2

-continued
G-3
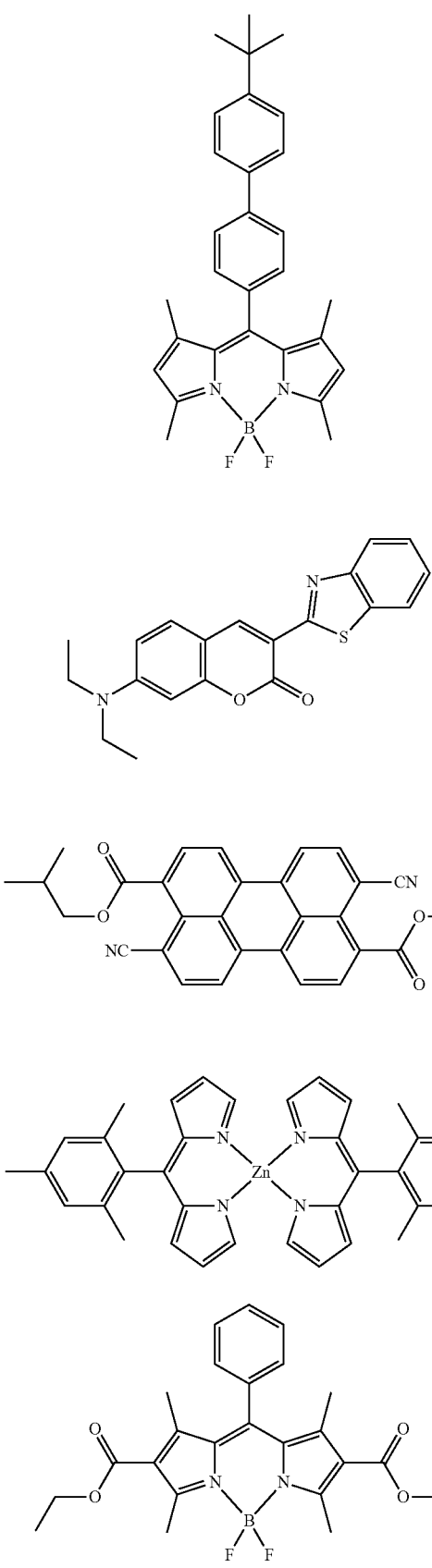
G-4
G-5
G-6
G-7
-continued
G-8
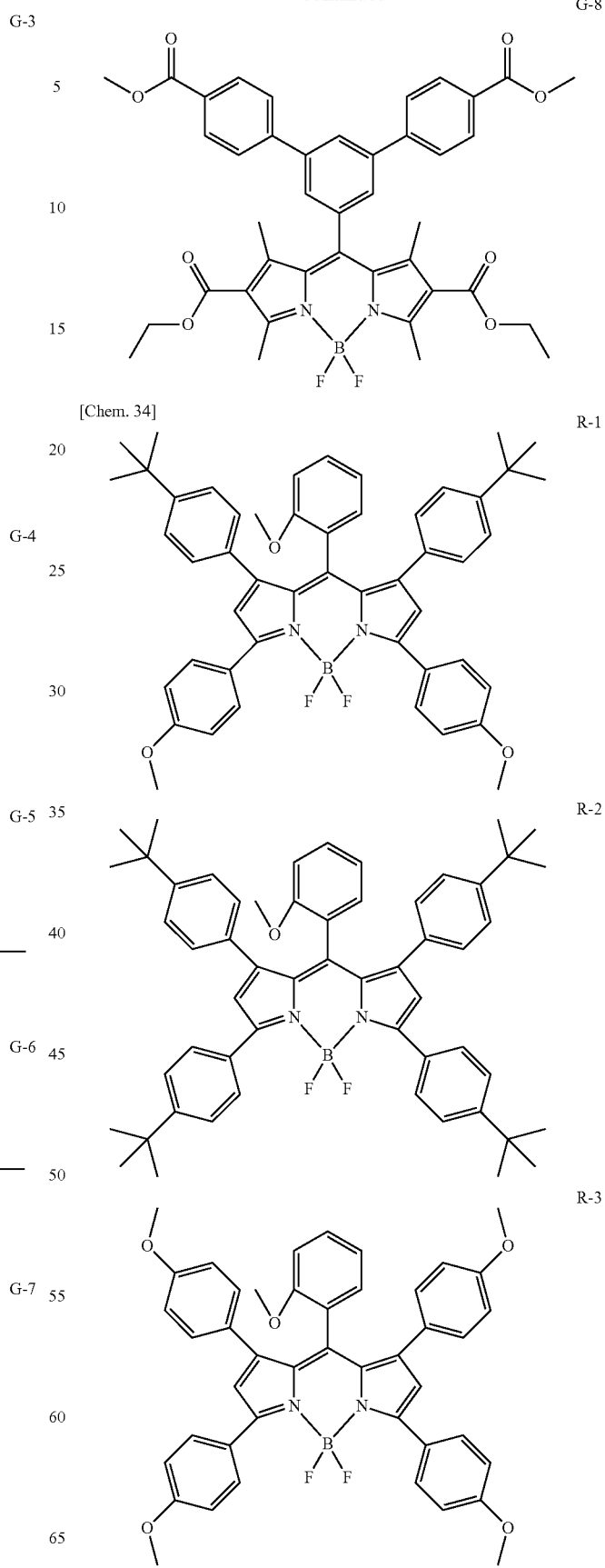
[Chem. 34]
R-1
R-2
R-3

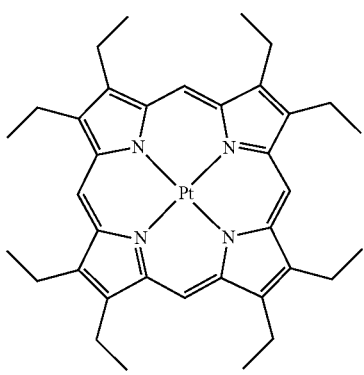

[Chem. 35]

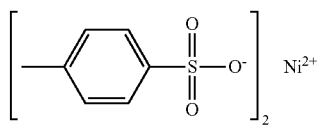

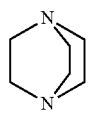 Q-2

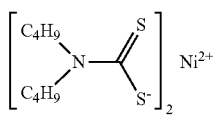 Q-3

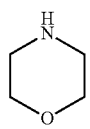 Q-4

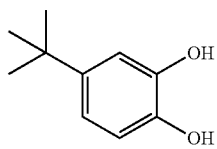 Q-5

Q-6

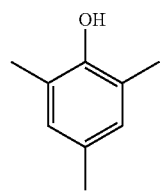

Q-7

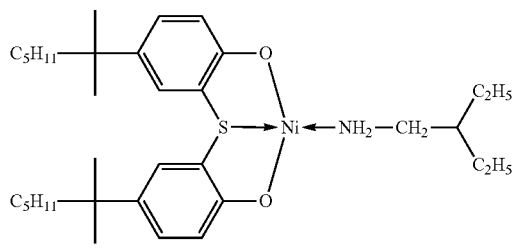

R-4

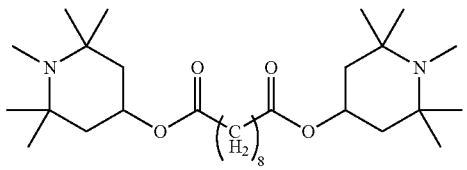 Q-8

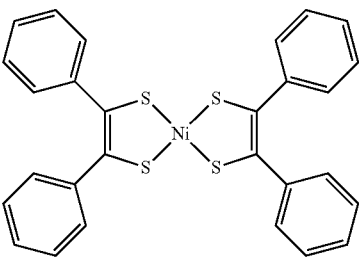 Q-9

Q-10

Evaluation methods as to structural analysis are described below.

<Measurement of $^1$H-NMR>

$^1$H-NMR of the compound was measured with a deuterated chloroform solution by using superconducting FTNMR EX-270 (manufactured by JEOL Ltd.).

<Measurement of Absorption Spectrum>

The absorption spectrum of the compound was measured on Spectrophotometer U-3200 (manufactured by Hitachi, Ltd.) after dissolving the compound in toluene at a concentration of $1×10^{-6}$ mol/L.

<Measurement of Fluorescence Spectrum>

As for the fluorescence spectrum of the compound, the fluorescence spectrum at the time of dissolving the compound in toluene at a concentration of $1×10^{-6}$ mol/L and exciting the solution at a wavelength of 460 nm was measured on Spectrofluorophotometer F-2500 (manufactured by Hitachi, Ltd.).

<Measurement of Color Conversion Characteristics>

An LED was lighted by flowing a current of 10 mA to a light emitting device having mounted therein each color conversion film and a blue LED element (Model Number PM2B-3LBE-SD, manufactured by ProLight, emission peak wavelength: 460 nm) and measured for the emission spectrum, light emission intensity at peak wavelength, and chromaticity by using a spectral radiance meter (CS-1000, manufactured by KONICA MINOLTA, INC.). The distance between each color conversion film and the blue LED element was set to be 3 cm.

<Light Durability Test>

An LED chip was lighted by flowing a current of 10 mA to a light emitting device having mounted therein each color conversion film and a blue LED element (Model Number PM2B-3LBE-SD, manufactured by ProLight, emission peak wavelength: 460 nm) and measured for the initial luminance by using a spectral radiance meter (CS-1000, manufactured by KONICA MINOLTA, INC.). Here, the distance between each color conversion film and the blue LED element was set to be 3 cm. Thereafter, light from the blue LED element was continuously irradiated at room temperature, and the light durability was evaluated by observing the time until the luminance was reduced by a certain amount.

<Measurement of Molar Extinction Coefficient>

Similarly to the above-described method for measuring the absorption spectrum, the compound was dissolved in toluene or ethanol at each concentration of $1\times10^{-5}$ mol/L, $5\times10^{-5}$ mol/L, $1\times10^{-4}$ mol/L, $5\times10^{-4}$ mol/L, or $1\times10^{-3}$ mol/L. The absorbancy at each wavelength was calculated based on the obtained absorption spectra and after forming a calibration curve from a graph having an ordinate representing the absorbancy and an abscissa representing the mol concentration (mol/L), the molar extinction coefficient for each wavelength was determined.

With respect to Compounds Q-1 to Q-10, the obtained molar extinction coefficient is shown in Table 2. In the Table, εmax is a maximum value of the molar extinction coefficient ε in the whole wavelength region from 400 nm to 800 nm.

TABLE 2

| | ε At Each Wavelength (L/mol · cm) | | | |
|---|---|---|---|---|
| | εmax | 460 nm | 520 nm | 630 nm |
| Q-1 | 7 | 1 | up to 0 | 1 |
| Q-2 | up to 0 | up to 0 | up to 0 | up to 0 |
| Q-3 | 5800 | 234 | 97 | 77 |
| Q-4 | up to 0 | up to 0 | up to 0 | up to 0 |
| Q-5 | up to 0 | up to 0 | up to 0 | up to 0 |
| Q-6 | up to 0 | up to 0 | up to 0 | up to 0 |
| Q-7 | 48 | 2 | up to 0 | 7 |
| Q-8 | up to 0 | up to 0 | up to 0 | up to 0 |
| Q-9 | up to 0 | up to 0 | up to 0 | up to 0 |
| Q-10 | 5900 | 1440 | 828 | 1400 |

Synthesis Example 1

Synthesis Method of Compound G-1:

3,5-Dibromobenzaldehyde (3.0 g), 4-tert-butylphenylboronic acid (5.3 g), tetrakis(triphenylphosphine)palladium(0) (0.4 g), and potassium carbonate (2.0 g) were put in a flask and purged with nitrogen. Deaerated toluene (30 mL) and deaerated water (10 mL) were added thereto, and the mixture was refluxed for 4 hours. The reaction solution was cooled to room temperature, and the organic layer was subjected to liquid separation and then washed with a saturated saline solution. This organic layer was dried over magnesium sulfate and after filtration, the solvent was distilled off. The obtained reaction product was purified by silica gel chromatography to obtain 3,5-bis(4-tert-butylphenyl)benzaldehyde (3.5 g) as a white solid.

3,5-Bis(4-tert-butylphenyl)benzaldehyde (1.5 g) and 2,4-dimethylpyrrole (0.7 g) were put in the reaction solution and after adding dehydrated dichloromethane (200 mL) and trifluoroacetic acid (1 drop), the solution was stirred in a nitrogen atmosphere for 4 hours. A dehydrated dichloromethane solution of 2,3-dichloro-5,6-dicyano-1,4-benzoquinone (0.85 g) was added, and the solution was further stirred for 1 hour. After the completion of reaction, boron trifluoride-diethyl ether complex (7.0 mL) and diisopropylethylamine (7.0 mL) were added, followed by stirring for 4 hours. Then, water (100 mL) was added, followed by stirring, and the organic layer was obtained by liquid separation. This organic layer was dried over magnesium sulfate and after filtration, the solvent was distilled off. The obtained reaction product was purified by silica gel chromatography to obtain 0.4 g of Compound G-1 shown below (yield: 18%).

$^1$H-NMR (CDCl$_3$, ppm): 7.95 (s, 1H), 7.63-7.48 (m, 10H), 6.00 (s, 2H), 2.58 (s, 6H), 1.50 (s, 6H), 1.37 (s, 18H).

Figure 4:
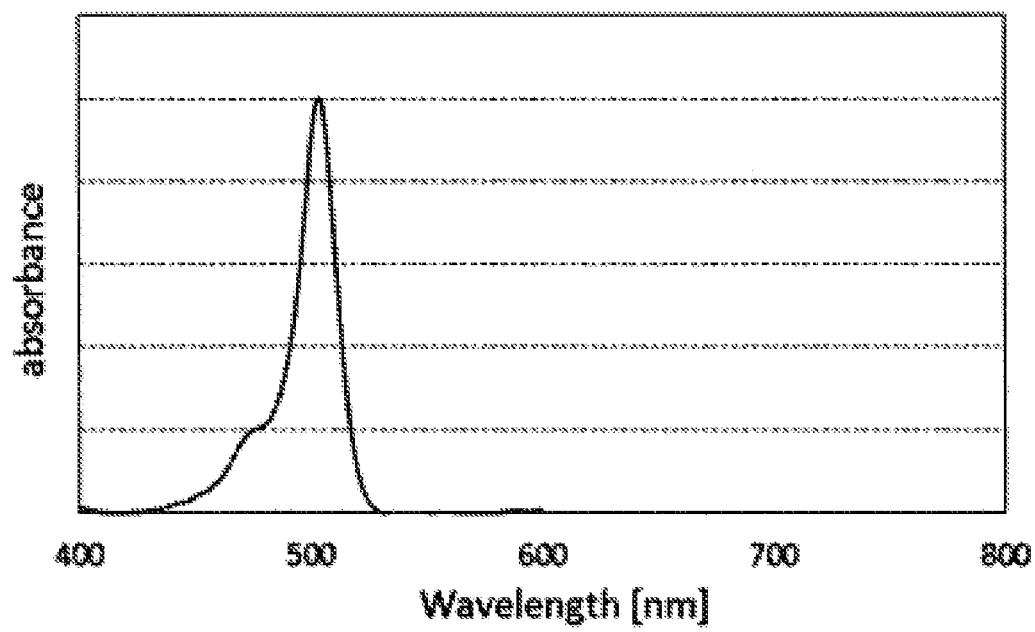
FIG. 4 is an absorption spectrum of the compound of Synthesis Example 1.
Figure 5:
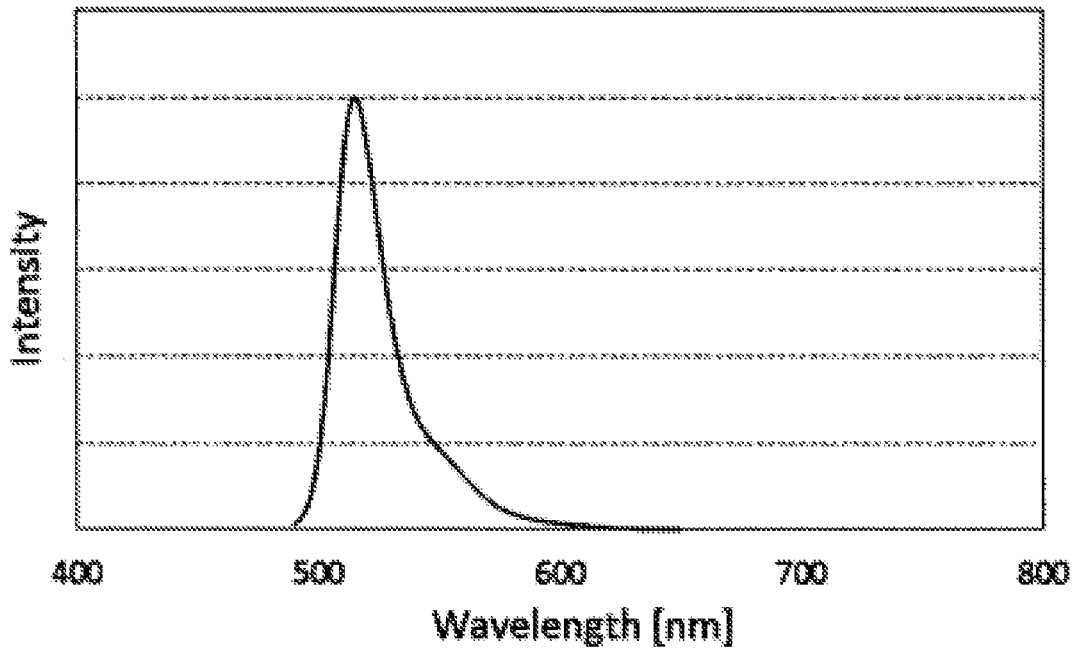
FIG. 5 is an emission spectrum of the compound of Synthesis Example 1.

The absorption spectrum of this compound was as illustrated in FIG. 4 and exhibited light absorption characteristics with a blue excitation light source (460 nm). The fluorescence spectrum was as illustrated in FIG. 5 and exhibited a sharp emission peak in the green region. The compound showed a fluorescence quantum yield of 83% and was a compound capable of efficient color conversion.

Synthesis Example 2

Synthesis Method of Compound R-1:

A mixed solution of 300 mg of 4-(4-tert-butylphenyl)-2-(4-methoxyphenyl)pyrrole, 201 mg of 2-methoxybenzoyl chloride and 10 ml of toluene was heated at 120° C. for 6 hours under a nitrogen flow. The resulting solution was cooled to room temperature and then evaporated, and the residue was washed with 20 ml of ethanol and vacuum-dried to obtain 260 mg of 2-(2-methoxybenzoyl)-3-(4-tert-butylphenyl)-5-(4-methoxyphenyl)pyrrole.

Next, a mixed solution of 260 mg of 2-(2-methoxybenzoyl)-3-(4-tert-butylphenyl)-5-(4-methoxyphenyl)pyrrole, 180 mg of 4-(4-tert-butylphenyl)-2-(4-methoxyphenyl)pyrrole, 206 mg of methanesulfonic anhydride, and 10 ml of deaerated toluene was heated at 125° C. for 7 hours under a nitrogen flow. The resulting solution was cooled to room temperature, 20 ml of water was poured therein, and extraction with 30 ml of dichloromethane was conducted. The organic layer was washed twice with 20 ml of water and evaporated, and the residue was vacuum-dried.

Subsequently, a mixed solution of the obtained pyrromethene form and 10 ml of toluene, to which 305 mg of diisopropylethylamine and 670 mg of boron trifluoride-diethyl ether complex were added, was stirred at room temperature for 3 hours under a nitrogen flow. 20 ml of water was poured therein, and extraction with 30 ml of dichloromethane was conducted. The organic layer was washed twice with 20 ml of water, dried over magnesium sulfate, and evaporated, and the residue was purified by silica gel column chromatography and vacuum-dried to obtain 0.27 g of a red-purple powder. The $^1$H-NMR analysis results of the obtained powder were as follows, and the red-purple powder obtained above was confirmed to be R-1.

$^1$H-NMR (CDCl$_3$, ppm): 1.19 (s, 18H), 3.42 (s, 3H), 3.85 (s, 6H), 5.72 (d, 1H), 6.20 (t, 1H), 6.42-6.97 (m, 16H), 7.89 (d, 4H).

Figure 6:
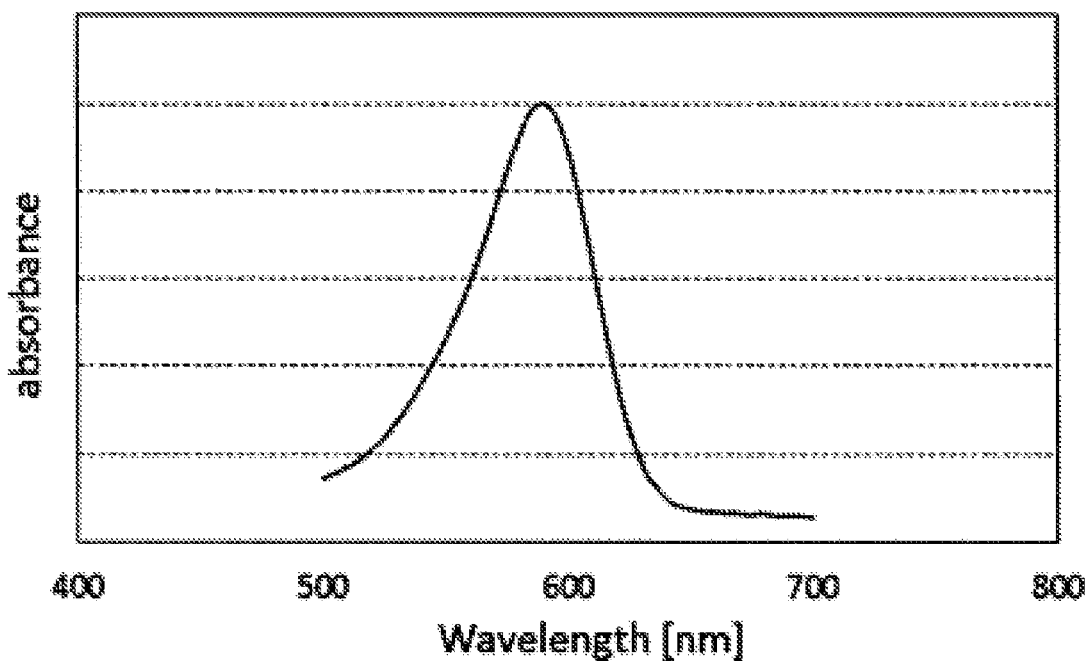
FIG. 6 is an absorption spectrum of the compound of Synthesis Example 2.
Figure 7:
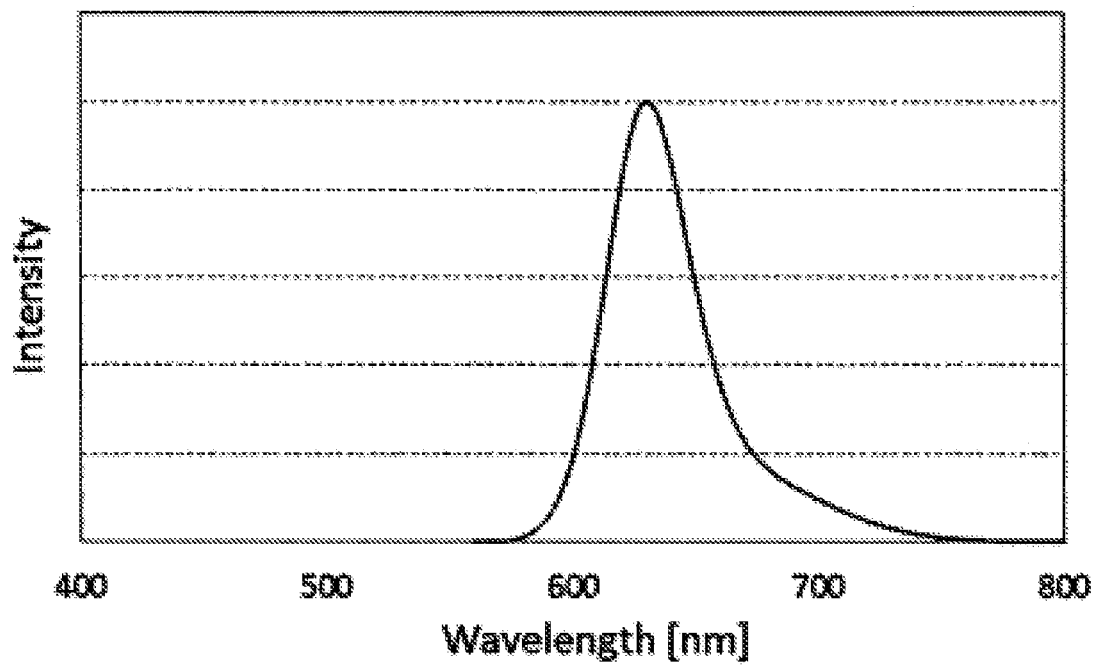
FIG. 7 is an emission spectrum of the compound of Synthesis Example 2.

The absorption spectrum of this compound was as illustrated in FIG. 6 and exhibited light absorption characteristics with blue and green excitation light sources. The fluorescence spectrum was as illustrated in FIG. 7 and exhibited a sharp emission peak in the red region. The compound showed a fluorescence quantum yield of 90% and was a compound capable of efficient color conversion.

Example 1

0.20 Parts by weight of Compound G-1 as the component (A), 0.5 parts by weight of a curing agent, and 1.0 parts by weight of Compound Q-1 as the component (C) were mixed per 100 parts by weight of silicone resin "OE-6630A/B" (produced by Dow Corning Toray Co., Ltd.), and the mixture was stirred and defoamed at 1,000 rpm for 20 minutes by using a planetary stirring/defoaming device, "MAZERUSTAR KK-400" (manufactured by KURABO INDUSTRIES LTD.), to obtain a color conversion composition as a resin liquid for film preparation.

The resin liquid for film preparation was applied onto "Cerapeel" BLK (produced by Toray Advanced Film Co., Ltd.) by use of a slit die coater, heated at 130° C. for 2 hours, and dried to obtain a color conversion film having a thickness of 200 μm.

Color conversion of blue LED light was performed using the color conversion film above, as a result, when only the green light emission region was extracted, high-color-purity green emission showing a peak wavelength of 526 nm and providing an emission spectrum with a half-value width at the peak wavelength of 25 nm was obtained. The light emission intensity at the peak wavelength was 1.00 in terms of relative value when the intensity in Comparative Example 1 described later is taken as 1.00, revealing that the light emitted was not blocked by the component (C). In addition, when light from the blue LED element was continuously irradiated at room temperature, the time until the luminance was reduced by 5% was 100 hours.

Examples 2 to 11 and Comparative Examples 1 to 10

Color conversion films were prepared and evaluated in the same manner as in Example 1 except that the compounds shown in Table 3 were used as the components (A) and (C). The results are shown in Table 3. Here, Light Emission Intensity (relative value) in the Table is a relative value when the intensity in Comparative Example 1 is taken as 1.00.

Example 12

0.08 Parts by weight of Compound R-1 as the component (A), 0.5 parts by weight of a curing agent, and 1.0 parts by weight of Compound Q-1 as the component (C) were mixed per 100 parts by weight of a two-component thermosetting epoxy-based acrylic resin, and the mixture was stirred at 300 rpm for 1 hour to produce a composition.

The composition above was applied onto a stretched polyethylene terephthalate film (XG5P1, produced by Toray Advanced Materials Inc.) by use of a bar coating system and then dried at 120° C. for 5 minutes to form a coating layer having an average film thickness of 10 μm. Thereafter, a diffusion film ("Texcell" (registered trademark) TDF127, produced by Toray Advanced Materials Inc.) was laminated and then matured at 60° C. for 1 hour to obtain a color conversion film.

Color conversion of blue LED light was performed using the color conversion film above, as a result, when only the red light emission region was extracted, high-color-purity red emission showing a peak wavelength of 635 nm and providing an emission spectrum with a half-value width at the peak wavelength of 49 nm was obtained. The light emission intensity at the peak wavelength was 1.00 in terms of relative value when the intensity in Comparative Example 11 described later is taken as 1.00, revealing that the light emitted was not blocked by the component (C). In addition, when light from the blue LED element was continuously irradiated at room temperature, the time until the luminance was reduced by 2% was 400 hours.

Examples 13 to 21 and Comparative Examples 11 to 17

Color conversion films were prepared and evaluated in the same manner as in Example 12 except that the compounds shown in Table 4 were used as the components (A) and (C). The results are shown in Table 4. Here, Light Emission Intensity (relative value) in the Table is a relative value when the intensity in Comparative Example 11 is taken as 1.00.

Example 22

0.20 Parts by weight of Compound G-1, 0.08 parts by weight of Compound R-1, as the components (A), 0.5 parts by weight of a curing agent, and 1.0 parts by weight of Compound Q-1 as the component (C) were mixed per 100 parts by weight of a two-component thermosetting epoxy-based acrylic resin, and the mixture was stirred at 300 rpm for 1 hour to produce a composition.

The composition above was applied onto a stretched polyethylene terephthalate film (XG5P1, produced by Toray Advanced Materials Inc.) by use of a bar coating system and then dried at 120° C. for 5 minutes to form a coating layer having an average film thickness of 10 μm. Thereafter, a diffusion film ("Texcell" (registered trademark) TDF127, produced by Toray Advanced Materials Inc.) was laminated and then matured at 60° C. for 1 hour to obtain a color conversion film.

Color conversion of blue LED light was performed using the color conversion film above, as a result, when only the green light emission region was extracted, high-color-purity green emission showing a peak wavelength of 527 nm and providing an emission spectrum with a half-value width at the peak wavelength of 28 nm was obtained, whereas when only the red light emission region was extracted, high-color-purity red emission showing a peak wavelength of 635 nm and providing an emission spectrum with a half-value width at the peak wavelength of 49 nm was obtained. The light emission intensity at the peak wavelength was 1.00 in terms of relative value when the intensity in Comparative Example 18 described later is taken as 1.00, revealing that the light emitted was not blocked by the component (C). In addition, when light from the blue LED element was continuously irradiated at room temperature, the time until the luminance was reduced by 5% was 100 hours.

Examples 23 to 29 and Comparative Examples 18 to 19

Color conversion films were prepared and evaluated in the same manner as in Example 22 except that the compounds shown in Table 5 were used as the components (A) and (C). The results are shown in Table 5. Here, Light Emission Intensity (relative value) in the Table is a relative value when the intensity in Comparative Example 18 is taken as 1.00.

Example 30

0.25 Parts by weight of Compound G-1 as the component (A) and 1.0 parts by weight of Compound Q-1 as the component (C) were mixed per 100 parts by weight of an acrylic resin "KC-7000" (produced by Kyoeisha Chemical Co., Ltd.), and the mixture was stirred at 300 rpm for 1 hour to produce a composition.

The composition above was applied onto an alumina-deposited surface of a polyethylene terephthalate film (hereinafter, referred to as barrier film 1) by use of a bar coating system and then dried at 120° C. for 5 minutes to form a color conversion layer having an average film thickness of 10 μm.

Subsequently, a thermosetting adhesive layer was formed by coating on another barrier film 1, and the adhesive layer was laminated on the color conversion layer.

Finally, a diffusion film ("Texcell" (registered trademark) (R) TDF127, produced by Toray Advanced Materials Inc.) was laminated and then matured at 60° C. for 1 hour to obtain a color conversion film.

Color conversion of blue LED light was performed using the color conversion film above, as a result, when only the green light emission region was extracted, high-color-purity green emission showing a peak wavelength of 526 nm and providing an emission spectrum with a half-value width at the peak wavelength of 25 nm was obtained. The light emission intensity at the peak wavelength was 1.00 in terms of relative value when the intensity in Comparative Example 22 described later is taken as 1.00, revealing that the light emitted was not blocked by the component (C). In addition, when light from the blue LED element was continuously irradiated at room temperature, the time until the luminance was reduced by 5% was 400 hours.

Examples 31 to 33 and Comparative Example 22

Color conversion films were prepared and evaluated in the same manner as in Example 30 except that the compounds shown in Table 6 were used as the components (A) and (C). The results are shown in Table 6. Here, Light Emission Intensity (relative value) in the Table is a relative value when the intensity in Comparative Example 22 is taken as 1.00.

Example 34

0.25 Parts by weight of Compound G-7 as the component (A), 1.0 parts by weight of Compound Q-1 and 1.0 parts by weight of Compound Q-2, as the components (C), were mixed per 100 parts by weight of an acrylic resin "KC-7000" (produced by Kyoeisha Chemical Co., Ltd.), and the mixture was stirred at 300 rpm for 1 hour to produce a composition.

The composition above was applied onto a polyethylene terephthalate film (Toray, U48) by use of a bar coating system and then dried at 120° C. for 5 minutes to form a color conversion layer having an average film thickness of 16 μm.

Finally, a diffusion film ("Texcell" (registered trademark) (R) TDF127, produced by Toray Advanced Materials Inc.) was laminated and then matured at 60° C. for 1 hour to obtain a color conversion film.

Color conversion of blue LED light was performed using the color conversion film above, as a result, when only the green light emission region was extracted, high-color-purity green emission showing a peak wavelength of 529 nm and providing an emission spectrum with a half-value width at the peak wavelength of 26 nm was obtained. The light emission intensity at the peak wavelength was 1.00 in terms of relative value when the intensity in Comparative Example 23 described later is taken as 1.00, revealing that the light emitted was not blocked by the component (C). In addition, when light from the blue LED element was continuously irradiated at room temperature, the time until the luminance was reduced by 5% was 540 hours.

Examples 35 to 36

Color conversion films were prepared and evaluated in the same manner as in Example 34 except that the compounds shown in Table 7 were used as the components (A) and (C). The results are shown in Table 7. Here, Light Emission Intensity (relative value) in the Table is a relative value when the intensity in Comparative Example 23 described later is taken as 1.00.

Examples 37 to 41 and Comparative Examples 23 to 24

Color conversion films were prepared and evaluated in the same manner as in Example 34 except that 0.25 parts by weight of the compound shown in Table 7 as the component (A) and 1.0 parts by weight of the compound shown in Table 7 as the component (C) were mixed per 100 parts by weight of an acrylic resin "KC-7000" (produced by Kyoeisha Chemical Co., Ltd.). The results are shown in Table 7. Here, Light Emission Intensity (relative value) in the Table is a relative value when the intensity in Comparative Example 23 is taken as 1.00.

TABLE 3

|  | Component (A) | Component (C) | Peak Wavelength (nm) | Half-Value Width (nm) | Light Emission Intensity (relative value) | Light Durability (h) |
|---|---|---|---|---|---|---|
| Example 1 | G-1 | Q-1 | 526 | 25 | 1.00 | 100 |
| Example 2 | G-1 | Q-2 | 526 | 25 | 1.00 | 90 |
| Example 3 | G-2 | Q-1 | 526 | 25 | 0.96 | 92 |
| Example 4 | G-3 | Q-1 | 527 | 25 | 0.96 | 83 |
| Example 5 | G-4 | Q-1 | 490 | 55 | 0.83 | 60 |
| Example 6 | G-5 | Q-1 | 530 | 47 | 0.67 | 95 |
| Example 7 | G-6 | Q-1 | 511 | 35 | 0.21 | 32 |
| Example 8 | G-1 | Q-5 | 526 | 25 | 0.96 | 81 |
| Example 9 | G-1 | Q-7 | 526 | 25 | 0.96 | 100 |
| Example 10 | G-1 | Q-8 | 526 | 25 | 1.00 | 90 |
| Example 11 | G-1 | Q-9 | 526 | 25 | 1.00 | 90 |
| Comparative Example 1 | G-1 | none | 526 | 25 | 1.00 | 20 |
| Comparative Example 2 | G-2 | none | 526 | 25 | 0.96 | 19 |
| Comparative Example 3 | G-3 | none | 527 | 25 | 0.96 | 17 |
| Comparative Example 4 | G-4 | none | 490 | 55 | 0.83 | 30 |
| Comparative Example 5 | G-5 | none | 530 | 47 | 0.67 | 80 |
| Comparative Example 6 | G-1 | Q-3 | 526 | 25 | 0.21 | 70 |
| Comparative Example 7 | G-1 | Q-4 | 526 | 25 | 1.00 | 18 |

TABLE 3-continued

|  | Component (A) | Component (C) | Peak Wavelength (nm) | Half-Value Width (nm) | Light Emission Intensity (relative value) | Light Durability (h) |
|---|---|---|---|---|---|---|
| Comparative Example 8 | G-5 | Q-3 | 530 | 47 | 0.14 | 80 |
| Comparative Example 9 | G-6 | none | 511 | 35 | 0.21 | 18 |
| Comparative Example 10 | G-1 | Q-6 | 526 | 25 | 1.00 | 30 |

TABLE 4

|  | Component (A) | Component (C) | Peak Wavelength (nm) | Half-Value Width (nm) | Light Emission Intensity (relative value) | Light Durability (h) |
|---|---|---|---|---|---|---|
| Example 12 | R-1 | Q-1 | 635 | 49 | 1.00 | 400 |
| Example 13 | R-1 | Q-2 | 635 | 49 | 1.00 | 400 |
| Example 14 | R-2 | Q-1 | 617 | 47 | 1.14 | 380 |
| Example 15 | R-3 | Q-1 | 638 | 48 | 1.05 | 375 |
| Example 16 | R-4 | Q-1 | 647 | 30 | 0.13 | 110 |
| Example 17 | R-1 | Q-5 | 635 | 49 | 1.00 | 390 |
| Example 18 | R-1 | Q-7 | 635 | 49 | 0.98 | 410 |
| Example 19 | R-1 | Q-8 | 635 | 49 | 1.00 | 400 |
| Example 20 | R-3 | Q-7 | 638 | 48 | 0.98 | 390 |
| Example 21 | R-1 | Q-9 | 635 | 49 | 1.00 | 400 |
| Comparative Example 11 | R-1 | none | 635 | 49 | 1.00 | 100 |
| Comparative Example 12 | R-2 | none | 617 | 47 | 1.14 | 95 |
| Comparative Example 13 | R-3 | none | 638 | 48 | 1.05 | 92 |
| Comparative Example 14 | R-1 | Q-3 | 635 | 49 | 0.21 | 250 |
| Comparative Example 15 | R-1 | Q-4 | 635 | 49 | 1.00 | 90 |
| Comparative Example 16 | R-4 | none | 647 | 30 | 0.13 | 74 |
| Comparative Example 17 | R-1 | Q-6 | 635 | 49 | 1.00 | 160 |

TABLE 5

|  | Component (A) | | Component (C) | Peak Wavelength (nm) | Half-Value Width (nm) | Light Emission Intensity (relative value) | | Light Durability (h) |
|---|---|---|---|---|---|---|---|---|
|  | (a) | (b) | | | | (a) | (b) | |
| Example 22 | G-1 | R-1 | Q-1 | 527, 635 | 28, 49 | 1.00 | 1.00 | 110 |
| Example 23 | G-1 | R-2 | Q-1 | 527, 628 | 28, 48 | 1.00 | 1.15 | 110 |
| Example 24 | G-1 | R-3 | Q-1 | 527, 638 | 28, 48 | 1.00 | 1.05 | 108 |
| Example 25 | G-2 | R-1 | Q-1 | 527, 635 | 28, 49 | 0.96 | 0.95 | 100 |
| Example 26 | G-3 | R-1 | Q-1 | 528, 635 | 28, 49 | 0.96 | 0.94 | 94 |
| Example 27 | G-5 | R-1 | Q-1 | 532, 635 | 50, 49 | 0.67 | 0.88 | 98 |
| Example 28 | G-1 | R-1 | Q-2 | 527, 635 | 28, 49 | 1.00 | 1.00 | 100 |
| Example 29 | G-1 | R-1 | Q-7 | 527, 635 | 28, 49 | 0.96 | 0.95 | 110 |
| Comparative Example 18 | G-1 | R-1 | none | 527, 635 | 28, 49 | 1.00 | 1.00 | 21 |
| Comparative Example 19 | G-1 | R-1 | Q-3 | 527, 635 | 28, 49 | 0.20 | 0.18 | 72 |

TABLE 6

|  | Component (A) | Component (C) | Peak Wavelength (nm) | Half-Value Width (nm) | Light Emission Intensity (relative value) | Light Durability (h) |
|---|---|---|---|---|---|---|
| Example 30 | G-1 | Q-1 | 526 | 25 | 1.00 | 400 |
| Example 31 | G-1 | Q-2 | 526 | 25 | 1.00 | 360 |
| Example 32 | G-1 | Q-5 | 526 | 25 | 1.00 | 270 |
| Example 33 | G-1 | Q-7 | 526 | 25 | 0.96 | 400 |

TABLE 6-continued

| | Component (A) | Component (C) | Peak Wavelength (nm) | Half-Value Width (nm) | Light Emission Intensity (relative value) | Light Durability (h) |
|---|---|---|---|---|---|---|
| Comparative Example 22 | G-1 | none | 526 | 25 | 1.00 | 120 |

TABLE 7

| | Component (A) | Component (C) | | Peak Wavelength (nm) | Half-Value Width (nm) | Light Emission Intensity (relative value) | Light Durability (h) |
|---|---|---|---|---|---|---|---|
| Example 34 | G-7 | Q-1 | Q-2 | 529 | 26 | 1.00 | 540 |
| Example 35 | G-7 | Q-1 | Q-7 | 529 | 26 | 0.96 | 520 |
| Example 36 | G-8 | Q-1 | Q-2 | 529 | 25 | 1.05 | 970 |
| Example 37 | G-7 | | Q-1 | 529 | 26 | 1.00 | 280 |
| Example 38 | G-7 | | Q-2 | 529 | 26 | 1.00 | 240 |
| Example 39 | G-7 | | Q-7 | 529 | 26 | 1.00 | 270 |
| Example 40 | G-8 | | Q-1 | 529 | 25 | 1.05 | 500 |
| Example 41 | G-8 | | Q-2 | 529 | 25 | 1.05 | 450 |
| Comparative Example 23 | G-7 | | none | 529 | 26 | 1.00 | 90 |
| Comparative Example 24 | G-8 | | none | 529 | 25 | 1.05 | 160 |

1 Color conversion film
10 Substrate layer
11 Color conversion layer
12 Barrier film

The invention claimed is:

1. A color conversion composition for converting incident light into light having longer wavelength than the incident light,
wherein the color conversion composition comprises the following components (A) to (C):
(A) at least one luminescent material,
(B) a binder resin, and
(c) at least one of a tertiary amine, a catechol derivative and a nickel compound, and
wherein the tertiary amine, catechol derivative and nickel compound have a molar extinction coefficient ε of 100 or less in the whole wavelength region from 400 nm to 800 nm.

2. The color conversion composition according to claim 1, wherein the component (C) contains a nickel compound and the nickel compound is at least one of a nickel salt of an organic acid, an acetylacetonate-based nickel complex, and a thiobisphenolate-based nickel complex.

3. The color conversion composition according to claim 1, wherein the component (C) contains a nickel compound and a content of the nickel compound is from $1.0 \times 10^{-2}$ to 10 parts by weight per 100 parts by weight of the component (B).

4. The color conversion composition according to claim 1, wherein the component (C) contains a tertiary amine and at least one substituent on a nitrogen atom of the tertiary amine is a substituted or unsubstituted alkyl group.

5. The color conversion composition according to claim 1, wherein the content of the component (C) is from $10^{-2}$ to 15 parts by weight per 100 parts by weight of the component (B).

6. The color conversion composition according to claim 1, wherein the luminescent material contains a luminescent material which emits light having a peak wavelength of 500 to 580 nm by use of excitation light having a wavelength of 430 to 500 nm.

7. The color conversion composition according to claim 1, wherein the luminescent material contains the following luminescent materials (a) and (b):
(a) a luminescent material that emits light having a peak wavelength of 500 to 580 nm by use of excitation light having a wavelength of 430 to 500 nm, and
(b) a luminescent material that emits light having a peak wavelength of 580 to 750 nm upon being excited by either one or both of excitation light having a wavelength of 430 to 500 nm and light emitted by the luminescent material (a).

8. The color conversion composition according to claim 7, wherein a content $w_a$ of the luminescent material (a) and a content $w_b$ of the luminescent material (b) are in the relationship of $w_a \geq w_b$.

9. The color conversion composition according to claim 1, wherein the luminescent material contains a compound represented by formula (1):

[Chem. 1]

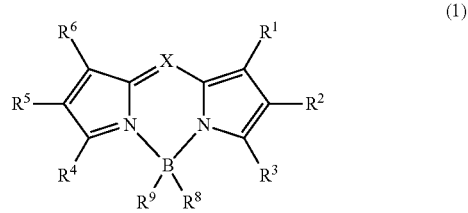

(1)

(wherein X is C—$R^7$ or N, and each of $R^1$ to $R^9$, which may be the same as or different from one another, is selected from hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a fused ring and an aliphatic ring each formed between adjacent substituents).

10. The color conversion composition according to claim 9, wherein in the formula (1), X is C—R$^7$ and R$^7$ is a substituted or unsubstituted aryl group.

11. The color conversion composition according to claim 9, wherein in the formula (1), X is C—R$^7$ and R$^7$ is a substituted or unsubstituted phenyl group.

12. The color conversion composition according to claim 7, wherein the luminescent material (a) is a compound represented by the formula (1):

[Chem. 1]

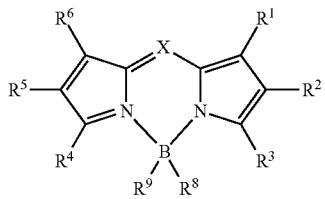

(1)

(wherein X is C—R$^7$ or N, and each of R$^1$ to R$^9$, which may be the same as or different from one another, is selected from hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a fused ring and an aliphatic ring each formed between adjacent substituents).

13. The color conversion composition according to claim 7, wherein the luminescent material (b) is a compound represented by the formula (1):

[Chem. 1]

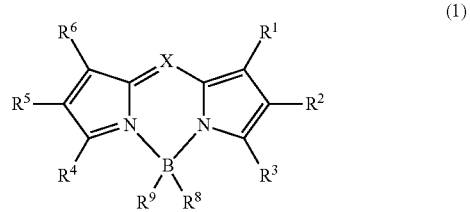

(1)

(wherein X is C—R$^7$ or N, and each of R$^1$ to R$^9$, which may be the same as or different from one another, is selected from hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group, a phosphine oxide group, and a fused ring and an aliphatic ring each formed between adjacent substituents).

14. The color conversion composition according to claim 1, wherein the binder resin is a thermosetting resin.

15. A color conversion film comprising a layer obtained by curing the color conversion composition according to claim 1.

16. The color conversion film according to claim 15, which is coated with a gas barrier layer.

17. A light source unit comprising a light source and the color conversion film according to claim 15.

18. The light source unit according to claim 17, wherein the light source is a light-emitting diode having a maximum light emission in the range of 430 to 500 nm.

19. A display comprising the light source unit according to claim 17.

20. A lighting comprising the light source unit according to claim 17.

* * * * *